(12) United States Patent
Schmit et al.

(10) Patent No.: US 7,797,497 B1
(45) Date of Patent: Sep. 14, 2010

(54) SYSTEM AND METHOD FOR PROVIDING MORE LOGICAL MEMORY PORTS THAN PHYSICAL MEMORY PORTS

(75) Inventors: Herman Schmit, Palo Alto, CA (US); Steven Teig, Menlo Park, CA (US); Brad Hutchings, Fremont, CA (US)

(73) Assignee: Tabula, Inc., Santa Clara, CA (US)

( * ) Notice: Subject to any disclaimer, the term of this patent is extended or adjusted under 35 U.S.C. 154(b) by 851 days.

(21) Appl. No.: 11/371,214

(22) Filed: Mar. 8, 2006

(51) Int. Cl.
*G06F 13/00* (2006.01)
(52) U.S. Cl. .................................. 711/149; 711/202
(58) Field of Classification Search ................. 711/149
See application file for complete search history.

(56) References Cited

U.S. PATENT DOCUMENTS

| | | | |
|---|---|---|---|
| 4,873,459 A | 10/1989 | El Gamal et al. |
| 5,224,065 A | 6/1993 | Yoshida |
| 5,233,689 A | 8/1993 | Rhoden et al. |
| 5,245,575 A | 9/1993 | Sasaki et al. |
| 5,349,250 A | 9/1994 | New |
| 5,357,153 A | 10/1994 | Chiang et al. |
| 5,365,125 A | 11/1994 | Goetting et al. |
| 5,369,622 A | 11/1994 | McLaury |
| 5,386,156 A | 1/1995 | Britton et al. |
| 5,426,378 A | 6/1995 | Ong |
| 5,521,835 A | 5/1996 | Trimberger |
| 5,532,958 A | 7/1996 | Jiang et al. |
| 5,542,074 A | 7/1996 | Kim et al. |
| 5,552,721 A | 9/1996 | Gould |
| 5,600,263 A | 2/1997 | Trimberger et al. |
| 5,610,829 A | 3/1997 | Trimberger |
| 5,629,637 A | 5/1997 | Trimberger et al. |
| 5,631,578 A | 5/1997 | Clinton et al. |
| 5,646,544 A | 7/1997 | Iadanza |
| 5,646,545 A | 7/1997 | Trimberger et al. |
| 5,659,484 A | 8/1997 | Bennett et al. |
| 5,682,107 A | 10/1997 | Tavana et al. |
| 5,692,147 A | 11/1997 | Larsen et al. |
| 5,694,057 A | 12/1997 | Gould |
| 5,701,441 A | 12/1997 | Trimberger |

(Continued)

OTHER PUBLICATIONS

Trimberger, S., "Effects of FPGA Architecture on FPGA Routing," *32nd ACM/IEEE Design Automation Conference*, Jun. 1995, ACM.

(Continued)

*Primary Examiner*—Hetul Patel
(74) *Attorney, Agent, or Firm*—Adeli & Tollen LLP

(57) ABSTRACT

Some embodiments provide for a method of mapping a user design to a configurable integrated circuit (IC). The method is for a configurable IC that implements a user design with an associated user design clock cycle. The IC operates on a sub-cycle clock that has multiple sub-cycle periods within a user period of the user design clock cycle. The method identifies multiple port accesses to a first multi-port memory defined in the user design. The accesses are in a single user design clock cycle. The method maps the multiple port accesses to the first multi-port memory to multiple physical-port memory accesses to a second physical-port memory in the configurable IC during multiple sub-cycles associated with a single user design clock cycle.

17 Claims, 50 Drawing Sheets

U.S. PATENT DOCUMENTS

| | | |
|---|---|---|
| 5,719,889 A | 2/1998 | Iadanza |
| 5,732,246 A | 3/1998 | Gould et al. |
| 5,737,235 A | 4/1998 | Kean et al. |
| 5,745,422 A | 4/1998 | Iadanza |
| 5,745,734 A | 4/1998 | Craft et al. |
| 5,761,483 A | 6/1998 | Trimberger |
| 5,764,954 A | 6/1998 | Fuller et al. |
| 5,768,178 A | 6/1998 | McLaury |
| 5,777,360 A | 7/1998 | Rostoker et al. |
| 5,796,268 A | 8/1998 | Kaplinsky |
| 5,802,003 A | 9/1998 | Iadanza et al. |
| 5,805,477 A | 9/1998 | Perner |
| 5,815,726 A | 9/1998 | Cliff |
| 5,825,662 A | 10/1998 | Trimberger |
| 5,889,411 A | 3/1999 | Chaudhary |
| 5,913,229 A | 6/1999 | Joo |
| 5,914,616 A | 6/1999 | Young et al. |
| 5,914,906 A | 6/1999 | Iadanza et al. |
| 5,940,603 A | 8/1999 | Huang |
| 5,944,813 A | 8/1999 | Trimberger |
| 5,970,240 A | 10/1999 | Chen et al. |
| 5,973,340 A | 10/1999 | Mohsen |
| 5,982,655 A | 11/1999 | Doyle |
| 6,002,991 A | 12/1999 | Conn, Jr. |
| 6,023,421 A | 2/2000 | Clinton et al. |
| 6,038,192 A | 3/2000 | Clinton et al. |
| 6,044,031 A | 3/2000 | Iadanza et al. |
| 6,054,873 A | 4/2000 | Laramie |
| 6,069,490 A | 5/2000 | Ochotta et al. |
| 6,075,745 A | 6/2000 | Gould et al. |
| 6,078,191 A | 6/2000 | Chan et al. |
| 6,084,429 A | 7/2000 | Trimberger |
| 6,086,631 A | 7/2000 | Chaudhary et al. |
| 6,091,263 A | 7/2000 | New et al. |
| 6,091,645 A | 7/2000 | Iadanza |
| 6,097,212 A | 8/2000 | Agrawal et al. |
| 6,098,087 A | 8/2000 | Lemay |
| 6,107,821 A | 8/2000 | Kelem et al. |
| 6,110,223 A | 8/2000 | Southgate et al. |
| 6,118,707 A | 9/2000 | Gould et al. |
| 6,130,854 A | 10/2000 | Gould et al. |
| 6,134,154 A | 10/2000 | Iwaki et al. |
| 6,140,839 A | 10/2000 | Kaviani et al. |
| 6,150,838 A | 11/2000 | Wittig et al. |
| 6,163,168 A | 12/2000 | Nguyen et al. |
| 6,169,416 B1 | 1/2001 | Eaton et al. |
| 6,172,521 B1 | 1/2001 | Motomura |
| 6,173,379 B1 | 1/2001 | Poplingher et al. |
| 6,175,247 B1 | 1/2001 | Scalera et al. |
| 6,184,707 B1 | 2/2001 | Norman et al. |
| 6,184,709 B1 | 2/2001 | New |
| 6,205,076 B1 | 3/2001 | Wakayama et al. |
| 6,233,191 B1 | 5/2001 | Gould et al. |
| 6,255,849 B1 | 7/2001 | Mohan |
| 6,275,064 B1 | 8/2001 | Agrawal et al. |
| 6,292,019 B1 | 9/2001 | New et al. |
| 6,326,807 B1 | 12/2001 | Veenstra et al. |
| 6,346,824 B1 | 2/2002 | New |
| 6,348,813 B1 | 2/2002 | Agrawal et al. |
| 6,381,732 B1 | 4/2002 | Burnham et al. |
| 6,396,303 B1 | 5/2002 | Young |
| 6,462,577 B1 | 10/2002 | Lee et al. |
| 6,469,540 B2 | 10/2002 | Nakaya |
| 6,480,954 B2 | 11/2002 | Trimberger |
| 6,483,343 B1 | 11/2002 | Faith et al. |
| 6,487,709 B1 | 11/2002 | Keller et al. |
| 6,490,707 B1 | 12/2002 | Baxter |
| 6,496,918 B1 | 12/2002 | Dehon et al. |
| 6,515,509 B1 | 2/2003 | Baxter |
| 6,526,559 B2 | 2/2003 | Schiefele et al. |
| 6,529,040 B1 | 3/2003 | Carberry et al. |
| 6,539,535 B2 | 3/2003 | Butts et al. |
| 6,545,501 B1 | 4/2003 | Bailis et al. |
| 6,593,771 B2 | 7/2003 | Bailis et al. |
| 6,601,227 B1 | 7/2003 | Trimberger |
| 6,603,330 B1 | 8/2003 | Snyder |
| 6,611,153 B1 | 8/2003 | Lien et al. |
| 6,629,308 B1 | 9/2003 | Baxter |
| 6,636,070 B1 | 10/2003 | Altaf |
| 6,642,744 B2 | 11/2003 | Or-Bach et al. |
| 6,650,142 B1 | 11/2003 | Agrawal et al. |
| 6,667,635 B1 | 12/2003 | Pi et al. |
| 6,668,361 B2 | 12/2003 | Bailis et al. |
| 6,675,309 B1 | 1/2004 | Baxter |
| 6,686,769 B1 | 2/2004 | Nguyen et al. |
| 6,703,861 B2 | 3/2004 | Ting |
| 6,714,041 B1 | 3/2004 | Darling et al. |
| 6,731,133 B1 | 5/2004 | Feng et al. |
| 6,732,068 B2 | 5/2004 | Sample et al. |
| 6,806,730 B2 | 10/2004 | Bailis et al. |
| 6,809,979 B1 | 10/2004 | Tang |
| 6,810,513 B1 | 10/2004 | Vest |
| 6,829,756 B1 | 12/2004 | Trimberger |
| 6,831,479 B2 | 12/2004 | Lo |
| 6,838,902 B1 | 1/2005 | Elftmann et al. |
| 6,870,395 B2 | 3/2005 | Schadt et al. |
| 6,882,182 B1 | 4/2005 | Conn et al. |
| 6,920,627 B2 | 7/2005 | Blodget et al. |
| 6,924,663 B2 | 8/2005 | Masui et al. |
| 6,937,535 B2 | 8/2005 | Ahn et al. |
| 6,956,399 B1 | 10/2005 | Bauer |
| 6,991,947 B1 | 1/2006 | Gheewala |
| 6,992,505 B1 | 1/2006 | Zhou |
| 6,998,872 B1 | 2/2006 | Chirania et al. |
| 7,010,667 B2 | 3/2006 | Vorbach et al. |
| 7,028,281 B1 | 4/2006 | Agrawal et al. |
| 7,075,333 B1 | 7/2006 | Chaudhary et al. |
| 7,109,752 B1 | 9/2006 | Schmit et al. |
| 7,126,372 B2 | 10/2006 | Vadi et al. |
| 7,126,856 B2 | 10/2006 | Sun et al. |
| 7,129,746 B1 | 10/2006 | Balasubramanian et al. |
| 7,129,747 B1 | 10/2006 | Jang et al. |
| 7,131,097 B1 | 10/2006 | Schlacter |
| 7,135,886 B2 | 11/2006 | Schlacter |
| 7,138,827 B1 | 11/2006 | Trimberger |
| 7,143,377 B1 | 11/2006 | Kudlugi et al. |
| 7,212,448 B1 | 5/2007 | Trimberger |
| 7,224,182 B1 | 5/2007 | Hutchings et al. |
| 7,242,216 B1 | 7/2007 | Schmit et al. |
| 7,253,660 B1 | 8/2007 | Leventis et al. |
| 7,286,976 B2 | 10/2007 | Diehl et al. |
| 7,298,169 B2 | 11/2007 | Hutchings et al. |
| 7,301,368 B2 | 11/2007 | Schmit et al. |
| 7,358,765 B2 | 4/2008 | Verma et al. |
| 7,372,297 B1 * | 5/2008 | Pugh et al. .................... 326/38 |
| 7,383,166 B2 | 6/2008 | Ashar et al. |
| 7,495,970 B1 | 2/2009 | Tang et al. |
| 7,504,858 B1 | 3/2009 | Schmit et al. |
| 7,518,400 B1 | 4/2009 | Redgrave et al. |
| 7,521,958 B2 | 4/2009 | Hutchings et al. |
| 7,530,033 B2 | 5/2009 | Caldwell et al. |
| 7,532,032 B2 | 5/2009 | Schmit et al. |
| 7,564,261 B2 | 7/2009 | Schmit et al. |
| 7,587,697 B1 | 9/2009 | Schmit et al. |
| 7,609,085 B1 | 10/2009 | Schmit et al. |
| 7,652,499 B2 | 1/2010 | Schmit et al. |
| 2001/0007428 A1 | 7/2001 | Young et al. |
| 2002/0008541 A1 | 1/2002 | Young et al. |
| 2002/0010853 A1 | 1/2002 | Trimberger et al. |
| 2002/0113619 A1 | 8/2002 | Wong |
| 2002/0125910 A1 | 9/2002 | New et al. |
| 2002/0125914 A1 | 9/2002 | Kim |
| 2002/0161568 A1 | 10/2002 | Sample et al. |
| 2002/0163357 A1 | 11/2002 | Ting |

| | | | |
|---|---|---|---|
| 2003/0009731 | A1 | 1/2003 | Wallace |
| 2003/0042931 | A1 | 3/2003 | Ting |
| 2003/0080777 | A1 | 5/2003 | Baxter |
| 2003/0110430 | A1 | 6/2003 | Bailis et al. |
| 2003/0141898 | A1 | 7/2003 | Langhammer et al. |
| 2004/0010767 | A1 | 1/2004 | Agrawal et al. |
| 2004/0103265 | A1 | 5/2004 | Smith |
| 2004/0167764 | A1 | 8/2004 | Wohl et al. |
| 2004/0196066 | A1 | 10/2004 | Ting |
| 2004/0233758 | A1 | 11/2004 | Kim et al. |
| 2005/0007147 | A1 | 1/2005 | Young |
| 2005/0007155 | A1 | 1/2005 | Young |
| 2005/0134308 | A1 | 6/2005 | Okada et al. |
| 2005/0146352 | A1 | 7/2005 | Madurawe |
| 2005/0223269 | A1* | 10/2005 | Stolowitz ............... 714/6 |
| 2006/0186920 | A1 | 8/2006 | Feng et al. |
| 2007/0075737 | A1 | 4/2007 | Schmit et al. |
| 2007/0143577 | A1 | 6/2007 | Smith |
| 2007/0241781 | A1 | 10/2007 | Hutchings |
| 2007/0257700 | A1 | 11/2007 | Caldwell et al. |
| 2007/0257702 | A1 | 11/2007 | Hutchings et al. |
| 2007/0285124 | A1 | 12/2007 | Schmit et al. |
| 2008/0100336 | A1 | 5/2008 | Hutchings et al. |
| 2008/0116931 | A1 | 5/2008 | Schmit et al. |
| 2009/0243651 | A1 | 10/2009 | Caldwell et al. |

OTHER PUBLICATIONS

U.S. Appl. No. 12/058,662, filed Mar. 28, 2008, Caldwell, Andrew, et al.
U.S. Appl. No. 11/609,875, filed Dec. 12, 2006, Schmit, Herman, et al.
U.S. Appl. No. 11/371,191, filed Mar. 8, 2006, Schmit, Herman, et al.
U.S. Appl. No. 11/371,194, filed Mar. 8, 2006, Redgrave, Jason, et al.
U.S. Appl. No. 11/371,352, filed Mar. 8, 2006, Schmit, Herman, et al.
U.S. Appl. No. 11/371,198, filed Mar. 8, 2006, Schmit, Herman, et al.
U.S. Appl. No. 11/609,883, filed Dec. 12, 2006, Schmit, Herman, et al.
Notice of Allowance of U.S. Appl. No. 11/081,883, mailed Jul. 9, 2007, Hutchings, Brad, et al.
Non-Final Office Action of U.S. Appl. No. 11/081,883, mailed Mar. 13, 2007, Hutchings, Brad, et al.
Non-Final Office Action of U.S. Appl. No. 11/081,883, mailed Nov. 3, 2006, Hutchings, Brad, et al.
Final Office Action of U.S. Appl. No. 11/081,850, mailed May 28, 2008, Hutchings, Brad.
Non-Final Office Action of U.S. Appl. No. 11/081,850, mailed Sep. 10, 2007, Hutchings, Brad.
Notice of Allowance of U.S. Appl. No. 11/081,867, mailed Jul. 11, 2007, Schmit, Herman, et al.
Final Office Action of U.S. Appl. No. 11/081,867, mailed Apr. 13, 2007, Schmit, Herman, et al.
Non-Final Office Action of U.S. Appl. No. 11/081,867, mailed Oct. 24, 2006, Schmit, Herman, et al.
Notice of Allowance of U.S. Appl. No. 11/081,809, mailed Feb. 23, 2007, Schmit, Herman, et al.
Notice of Allowance of U.S. Appl. No. 11/081,809, mailed Oct. 26, 2006, Schmit, Herman, et al.
Non-Final Office Action of U.S. Appl. No. 11/757,982, mailed Feb. 20, 2008, Schmit, Herman, et al.
Non-Final Office Action of U.S. Appl. No. 11/371,352, mailed Sep. 17, 2008, Schmit, Herman, et al.
"§3 Programmable Logic Devices," *Digital System Design*, 2001 Month N/A, slides 3.1-3.28.
"Design for Low Power in Actel Antifuse FPGAs", Actel Application Note, 2000 Actel Corporation, Sep. 2000, pp. 1-8.
"The Effect of SRAM Table Sharing and Cluster Size on FPGA Area", NPL Date Unknown, pp. 1-10.
"The Xilinx Virtex Series FPGA," Jan. 22, 2001, slides 1-22.
"Unifying Sequential and Spatial Computing with a Single Instruction Set Architecture," *ISCA '04*, Jun. 19-23, 2004, ACM, Munchen, Oberbayern, Germany.
Agrawal, O., et al., "An Innovative, Segmented High Performance FPGA Family with Variable-Grain-Architecture and Wide-gating Functions," *FPGA 99*, Feb. 1999, pp. 17-26, ACM, Monterey, CA.
Ahmed, E., et al., "The Effect of LUT and Cluster Size on Deep-Submicron FPGA Performance and Density," *FPGA 2000*, Feb. 2000, ACM, Monterey, CA.
Altera Corp., "6. DSP Blocks in Stratix II Devices," *SII52006-1.0*, Feb. 2004, pp. 1-32.
Altera, "Stratix II DSP Performance," *White Paper*, Feb. 2004, pp. 1-9, ver. 1.0, Altera Corporation, San Jose, CA.
Andraka Consulting Group, Inc., "Multiplication in FPGAs," http://www.andraka.com/multipli.htm, Jan. 25, 2006, pp. 1-7.
Backus, J., "Can Programming be Liberated from the Von Neumann Style? A Functional Style and its Algebra of Programs," *Communications of the ACM*, Aug. 1978, pp. 613-641, vol. 21, No. 8, ACM.
Barker, R., "QuickSilver ACM SilverStream Design Methodology with the Inspire SDK Tool Set," *A Technology Application Whitepaper*, Jan. 26, 2004, pp. 1-8, QuickSilver Technology, Inc., San Jose, CA.
Brand, D., et al., "Minimization of AND-EXOR Expressions Using Rewrite Rules," *IEEE Transactions on Computers*, May 1993, pp. 568-576, IEEE.
Butts, M., "Future Directions of Dynamically Reprogrammable Systems," *IEEE 1995 Custom Integrated Circuits Conference*, May 1995, pp. 487-494, IEEE.
Camposano, R., "The Growing Semiconductor Zoo: ASICs, CSSP, ASSP, ASIP, Structured Arrays, FPGAs, Processor Arrays, Platforms . . . and Other Animalia," Aug. 29, 2003, pp. 1-74, Synopsys, Inc.
Caspi, E., et al., "A Streaming Multi-Threaded Model," *MSP-3*, Dec. 2, 2001, pp. 1-23.
Caspi, E., et al., "Stream Computations Organized for Reconfigurable Execution (SCORE): Introduction and Tutorial," Aug. 25, 2000, pp. 1-31, Version 1.0.
Chiricescu, S., et al., "Morphable Multipliers," *FPL 2002, LNCS 2438*, Sep. 2002, pp. 647-656, Springer-Verlag Berlin Heidelberg.
Ciemat, J.V., et al., "Annealing Placement by Thermodynamic Combinatorial Optimization," *ACM Transactions on Design Automation of Electronic Systems*, Jul. 2004, pp. 310-332, vol. 9, No. 3, ACM, New York, NY.
Compton, K., et al., "An Introduction to Reconfigurable Computing," *IEEE Computer*, Apr. 2000.
Compton, K., et al., "Reconfigurable Computing: A Survey of Systems and Software," *ACM Computing Surveys*, Jun. 2002, pp. 171-210, vol. 34, No. 2, ACM, New York, NY.
Cong, J., et al., "A Theory on Partially-Dependent Functional Decomposition with Application in LUT-based FPGA," pp. 1-22.
Cong, J., et al., "Combinational Logic Synthesis for LUT Based Field Programmable Gate Arrays," *ACM Transactions on Design Automation of Electronic Systems*, Apr. 1996, pp. 145-204, vol. 1, No. 2, ACM, Inc.
Coudert, O., "Chapter 13: Doing Two-Level Logic Minimization 100 Times Faster," Proceedings of the 6th annual ACM-SIAM symposium on Discrete algorithms, Jan. 1995, pp. 112-121.
Damiani, M., et al., "The Disjunctive Decomposition of Logic Functions," *Proceedings of the 1997 IEEE/ACM International Conference on Computer-Aided Design*, Nov. 1997, pp. 78-82, San Jose, CA.
Davare, A., et al., "The Best of Both Worlds: The Efficient Asynchronous Implementation of Synchronous Specifications," *DAC '04*, Jun. 7-11, 2004, ACM, San Diego, CA.
DeHon, A., "Balancing Interconnect and Computation in a Reconfigurable Computing Array (or, why don't you really want 100% LUT utilization)," *Proceedings of the International Symposium on Field Programmable Gate Arrays*, Feb. 1999, pp. 125-134.
DeHon, A., "DPGA Utilization and Application," *Proceedings of the 1996 ACM Fourth International Symposium on Field-Programmable Gate Arrays FPGA*, Feb. 11-13, 1996, Monterey, CA.
DeHon, A., "Dynamically Programmable Gate Arrays: A Step Toward Increased Computational Density," *Proceedings of the Fourth Canadian Workshop on Field-Programmable Devices*, May 1996, pp. 47-54.
DeHon, A., "Reconfigurable Architectures for General-Purpose Computing," *A.I. Technical Report No. 1586*, Oct. 1996, pp. i-353.

DeHon, A., "The Density Advantage of Configurable Computing," Apr. 2000, pp. 41-49, IEEE.

DeHon, A., "Transit Note #121: Notes on Programmable Interconnect," *M.I.T. Transit Project*, Feb. 1995, pp. 1-13.

DeHon, A., et al., "Design Patterns for Reconfigurable Computing," *Proceedings of the IEEE Symposium on Field-Programmable Custom Computing Machines*, Apr. 2004.

DeHon, A., et al., "DPGA-Coupled Microprocessors: Commodity ICs for the Early 21$^{st}$ Century," *FCCM '94-IEEE Workshop on FPGAs for Custom Computing Machines*, Apr. 1994, Napa Valley, CA.

DeHon, A., et al., "Reconfigurable Computing: What, Why, and Implications for Design Automation," *DAC 1999*, Jun. 1999, ACM, New Orleans, Louisiana.

Enzler, R., et al., "Virtualizing Hardware with Multi-Context Reconfigurable Arrays," *Lecture Notes in Computer Science*, Sep. 2003, pp. 151-160.

Gayasen, A., et al., "Reducing Leakage Energy in FPGAs Using Region-Constrained Placement," *FPGA '04*, Feb. 22-24, 2004, pp. 51-58, ACM, Monterey, CA.

George, V., "Low Energy Field-Programmable Gate Array," *A Dissertation Submitted in Partial Satisfaction o the Requirements for the Degree of Doctor of Philosophy in Engineering-Electrical Engineering and Computer Sciences in the Graduate Division of the University of CA*, Berkeley, Fall 2000 Month N/A, pp. 1-190.

Giraud-Carrier, C., "A Reconfigurable Data Flow Machine for Implementing Functional Programming Languages", *SIGPLAN Notices*, Sep. 1994, vol. 29 (9): 22-28.

Goldstein, S.C., et al., "PipeRench: A Coprocessor for Streaming Multimedia Acceleration", *In International Symposium on Computer Architecture (ISCA)*, pp. 28-39, May 1999.

Goldstein, S.C., et al., "PipeRench: A Reconfigurable Architecture and Compiler," Apr. 2000, pp. 70-77, IEEE.

Hauck, S., et al., "High-Performance Carry Chains for FPGAs," *FPGA 98*, Feb. 1998, pp. 223-233, ACM, Monterey, CA.

Hauck, S., et al., "Montage: An FPGA for Synchronous and Asynchronous Circuits," *Field-Programmable Gate Arrays: Architectures and Tools for Rapid Prototyping*, 1993 Month N/A, Springer-Verlag, Berlin.

Hauck, S., et al., "Totem: Domain-Specific Reconfigurable Logic," *IEEE Transactions on VLSI Systems*, 2006 Month N/A, pp. 1-25.

Heidari, G., et al., "Introducing a Paradigm Shift in the Design and Implementation of Wireless Devices," *A Wireless Devices Whitepaper*, Apr. 28, 2004 but © 2003, pp. 1-10, QuickSilver Technology, Inc., San Jose, CA.

Hofstee, H.P., "Cell Broadband Engine Architecture from 20,000 Feet," Aug. 24, 2005, pp. 1-6.

Huang, A.S., "Tao: An Architecturally Balanced Reconfigurable Hardware Processor," *Submitted to the Dept. of Electrical Engineering and Computer Science in Partial Fulfillment of the Requirements for the Degrees of Bachelor of Science in Electrical Science and Engineering and Master of Engineering in Electrical Engineering and Computer Science at the Massachusetts Institute of Technology*, May 23, 1997, pp. 1-86, 107-109.

IBM, "Cell Broadband Engine Architecture, Version 1.0," Aug. 8, 2005, pp. 1-319.

IBM, "SPU Application Binary Interface Specification, Version 1.3," *CBEA JSRE Series*, Aug. 1, 2005, pp. iv-26.

IBM, "SPU Assembly Language Specification, Version 1.2," *CBEA JSRE Series*, Aug. 1, 2005, pp. iii-22.

IBM, "SPU C/C++ Language Extensions, Version 2.0" *CBEA JSRE Series*, Aug. 1, 2005, pp. iv-84.

IBM, "Synergistic Processor Unit Instruction Set Architecture, Version 1.0," Aug. 1, 2005, pp. 1-257.

Kaviani, A., et al., "Computational Field Programmable Architecture," *Custom Integrated Circuits Conference, 1998, Proceedings of the IEEE 1998*, May 11-14, 1998.

Kaviani, A., et al., "Hybrid FPGA Architecture," *Proceedings of the 1996 ACM Fourth International Symposium on Field-Programmable Gate Arrays*, Feb. 11-13, 1996, pp. 3-9, Monterey, CA.

Keutzer, K., "Overview of *configurable* architectures," Feb. 28, 2002, slides 1-29.

Kocan, F., et al., "Logic Modules with Shared SRAM Tables for Field-Programmable Gate Arrays," FPL 2004, Aug./Sep. 2004, pp. 289-300, Springer-Verlag, Berlin Heidelberg.

Kravets, V.N, et al., "Generalized Symmetries in Boolean Functions," *Proceedings of the 2000 IEEE/ACM International Conference on Computer-Aided Design*, Nov. 2000, San Jose, CA.

Lehn, D.I., et al., "Evaluation of Rapid Context Switching on a CSRC Device," *Proceedings of the International Conference on Engineering of Reconfigurable Systems and Algorithms*, Jun. 24-27, 2002.

Lemieux, G., et al., "Generating Highly-Routable Sparse Crossbars for PLDs," *FPGA 2000*, Feb. 2000, ACM, Monterey, CA.

Lemieux, G., et al., "Using Sparse Crossbars within LUT Clusters," *FPGA 2001*, Feb. 11-13, 2001, ACM, Monterey, CA.

Lertora, F., et al., "Handling Different Computational Granularity by a Reconfigurable IC Featuring Embedded FPGAs and a Network-On-Chip," *13$^{th}$ IEEE Symposium on Field-Programmable Custom Computing Machines (FCCM 2005) 2005*, Apr. 18-20, 2005.

Lewis, D., et al., "The Stratix-II Routing and Logic Architecture," *Proceedings of the 2005 ACM/SIGDA 13$^{th}$ International Symposium on Field-Programmable Gate Arrays*, pp. 1-22, Feb. 20-22, 2005, Monterey, CA.

Ling, A., "The Search for the Optimal FPGA Logic Block," 2001 Month N/A, ACM.

M2000, "FlexEOS Embedded FPGA Cores," 2003 Month N/A, M2000.

Markovskiy, Y., et al., "Analysis of Quasi-Static Scheduling Techniques in a Virtualized Reconfigurable Machine," *FPGA '02*, Feb. 24-26, 2002, ACM, Monterey, CA.

Master, P., "The Next Big Leap in Reconfigurable Systems," *A Technology Vision Whitepaper*, Apr. 28, 2004 but © 2003, pp. 1-8, QuickSilver Technology, Inc., San Jose, CA.

MathStar, Inc., "MathStar FPOA Architecture: A New Approach to High Throughput, Scalable, and Reprogrammable Design," *Technology Overview*, 2003 Month N/A, MathStar, Inc.

Mirsky, E., et al., "MATRIX: A Reconfigurable Computing Architecture with Configurable Instruction Distribution and Deployable Resources," *Proceedings of the IEEE Workshop on FPGAs for Custom Computing Machines*, Apr. 1996.

Mirsky, E., et al., "MATRIX: A Reconfigurable Computing Device with Configurable Instruction Distribution and Deployable Resources (Extended Abstract)," *Hot Chips Symposium 1997*, Aug. 1997.

Mishchenko, A., "Fast Computation of Symmetries in Boolean Functions," Computer-Aided Design of Integrated Circuits and Systems, Nov. 2003.

Mishchenko, A., et al., "A New Enhanced Constructive Decomposition and Mapping Algorithm," *DAC 2003*, Jun. 2-6, 2003, pp. 143-148, ACM, Anaheim, CA.

Morris, K., "Lattice Launches XP: Non-Volatility at the Forefront of FPGA," *FPGA and Programmable Logic Journal*, Mar. 1, 2005, pp. 1-5, Techfocus Media, Inc.

Morris, K., "Rationalizing Reconfigurability: The Importance of Being Programmable," *FPGA and Structured ASIC Journal*, Sep. 27, 2005.

Nelson, B.E., "Reconfigurable Computing: An Introduction and Overview," Sep. 23, 1998, pp. 1-43.

Niedzielski, D., "An Overview of Reconfigurable Computing."

Ochotta, E.S., et al., "A Novel Predictable Segmented FPGA Routing Architecture," *FPGA 98*, Feb. 1998, pp. 3-11, ACM, Monterey, CA.

Ohkura, J., et al., "Dataflow in the Adaptive Computing Machine (ACM)," *A Technology Application Whitepaper*, Apr. 28, 2004 but © 2003, pp. 1-9, QuickSilver Technology, Inc., San Jose, CA.

Parhami, B., "Part IV: Low-Diameter Architectures," *ECE 254B: Advanced Computer Architecture: Parallel Processing, UCSB*, Spring 2005 Month N/A, slides 1-93, Behrooz Parhami, Santa Barbara, CA.

Pedram, M., "IEEE Circuits and Systems Society Distinguished Lecturer Program."

Perissakis, S., et al., "Embedded DRAM for a Reconfigurable Array," *Proceedings of the 1999 Symposium on VLSI Circuits*, Jun. 1999, slides 1-24.

Perissakis, S., et al., "Embedded DRAM for a Reconfigurable Array," *Proceedings of the 1999 Symposium on VLSI Circuits*, Jun. 1999.

Perkowski, M.A., "A New Representation of Strongly Unspecified Switching Functions and its Application to Multi-Level AND/OR/EXOR Synthesis," Proc. of the 2nd Workshop on Applications of Reed-Muller Expansion in Circuit Design, Aug. 27-29, 1995, pp. 143-151, Chiba City, Japan.

Plunkett, B., "In Search of the SDR Holy Grail," *A Technology Application Whitepaper*, Apr. 28, 2004 but © 2003, pp. 1-7, QuickSilver Technology, Inc., San Jose, CA.

Plunkett, B., et al., "Adapt2400 ACM Architecture Overview," *A Technology Whitepaper*, 2004 Month N/A, pp. 1-9, QuickSilver Technology, Inc.

Quicklogic Corp., "Ultra-Low Power FPGA Combining Performance, Density, and Embedded RAM", *Eclipse II Family Data Sheet*, Nov. 2005, pp. 1-92, QuickLogic Corporation, US.

Quicksilver Technology, Inc., "Adapt2000 ACM System Platform," Apr. 2004, pp. 1-39, QuickSilver Technology, Inc., San Jose, CA.

Quicksilver Technology, Inc., "InSpire SDK Tool Set," *Product Brief*, 2004 Month N/A, QuickSilver Technology, Inc., San Jose, CA.

Quicksilver Technology, Inc., "QS2412 Adaptive Computing Machine," *Product Brief*, 2004 Month N/A, QuickSilver Technology, Inc., San Jose, CA.

Rahman, A., et al., "Wiring Requirement and Three-Dimensional Integration Technology for Field Programmable Gate Arrays," *IEEE Transactions on Very Large Scale Integration (VLSI) Systems*, Feb. 2003, pp. 44-54, vol. 11, No. 1, IEEE.

Rose, J., "Hard vs. Soft: The Central Question of Pre-Fabricated Silicon," *34th International Symposium on Multiple-Valued Logic (ISMVL '04)*, May 2004, pp. 2-5.

Sambhwani, S., et al., "Implementing W-CDMA Transceiver Structure on an Adaptive Computing Platform," *A Technology Application Whitepaper*, Apr. 28, 2004 but © 2003, pp. 1-12, QuickSilver Technology, Inc., San Jose, CA.

Scalera, S.M., et al., "A Mathematical Benefit Analysis of Context Switching Reconfigurable Computing," *Proceedings of the 5th Reconfigurable Architectures Workshop (RAW)*, Mar. 30, 1998, vol. 1388 of *Lecture Notes in Computer Science*, pp. 73-78.

Schaumont, P., et al., "A Quick Safari Through the Reconfiguration Jungle," *38th Design Automation Conference*, Jun. 2001, pp. 172-177, Las Vegas, Nevada.

Schmit, H., "Extra-Dimensional Island-Style FPGAs," *Field Programmable Logic and Application (FPL 2003)*, Sep. 2003, pp. 406-415.

Schmit, H., "Extra-dimensional Island-Style FPGAs," *Field Programmable Logic and Application (FPL 2003)*, Sep. 2003, slides 1-26.

Schmit, H., "Incremental Reconfiguration for Pipelined Applications," *Proceedings of the 5th IEEE Symposium on FPGA-Based Custom Computing Machines*, Apr. 16-18, 1997.

Schmit, H., et al., "FPGA Switch Block Layout and Evaluation," *FPGA '02*, Feb. 24-26, 2002, ACM, Monterey, CA.

Schmit, H., et al., "PipeRench: A Virtualized Programmable Datapath in 0.18 Micron Technology," *Proceedings of the IEEE 2002 Custom Integrated Circuits Conference*, May 12-15, 2002, pp. 63-66.

Schmit, H., et al., "Queue Machines: Hardware Compilation in Hardware," *Proceedings of the 10th Annual IEEE Symposium on Field-Programmable Custom Computing Machines*, Apr. 22-24, 2002.

Scholl, C., "Multi-output Functional Decomposition with Exploitation of Don't Cares," May 19-21, 1997.

Sharma, A., et al., "Accelerating FPGA Routing Using Architecture-Adaptive A* Techniques," *Proceedings of the IEEE Conference on Field-Programmable Technology 2005*, Dec. 11-14, 2005.

Sheeran, M., "Generating Fast Multipliers Using Clever Circuits."

Singh, A., et al., "Interconnect Pipelining in a Throughput-Intensive FPGA Architecture," *FPGA 2001*, Feb. 11-13, 2001, pp. 153-160, ACM, Monterey, CA.

Singh, A., et al., "PITIA: An FPGA for Throughput-Intensive Applications," *IEEE Transactions on Very Large Scale Integration (VLSI) Systems*, Jun. 2003, pp. 354-363, vol. 11, No. 3, IEEE.

Slade, A.L., et al., "Reconfigurable Computing Application Frameworks," *11th Annual IEEE Symposium on Field-Programmable Custom Computer Machines*, Apr. 9-11, 2003.

Snider, G., "Performance-Constrained Pipelining of Software Loops onto Reconfigurable Hardware," *FPGA '02*, Feb. 24-26, 2002, pp. 177-186, ACM, Monterey, CA.

Stankovic, R.S., et al., "Remarks on the Number of Logic Networks with Same Complexity Derived from Spectral Transform Decision Diagrams," Proceedings Int. TICS Workshop on Spectral Methods and Multi-Rate Signal Processing, SMMSP '02, Sep. 7-8, 2002, pp. 163-170, Toulouse, France.

Tau, E., et al., "A First Generation DPGA Implementation," *Proceedings of the Third Canadian Workshop on Field-Programmable Devices*, May 1995, pp. 138-143.

Tau, E., et al., "Transit Note #114: A First Generation DPGA Implementation," *M.I.T. Transit Project*, Jan. 1995, pp. 1-8.

Teifel, J., et al., "Highly Pipelined Asynchronous FPGAs," *Proceedings of the 2004 ACM/SIGDA 12th International Symposium on Field Programmable Gate Arrays*, Feb. 22-24, 2004, ACM, Monterey, CA.

Tessier, R., et al., "Balancing Logic Utilization and Area Efficiency in FPGAs," *Proceedings of the Roadmap to Reconfigurable Computing, 10th International Workshop on Field Programmable Logic and Applications*, Aug. 27-30, 2000, pp. 535-544.

Tom, M., et al., "Clustering of Large Designs for Channel-Width Constrained FPGAs," *University of British Columbia, Department of Electrical and Computer Engineering*, Jun. 2005, slides 1-39, Vancouver, British Columbia, Canada.

Tom, M., et al., "Logic Block Clustering of Large Designs for Channel-Width Constrained FPGAs" *DAC 2005*, Jun. 13-17, 2005, pp. 726-731, ACM, Anaheim, CA.

Tsu, W., et al., "HSRA: High-Speed, Hierarchical Synchronous Reconfigurable Array," *Proceedings of the International Symposium on Field Programmable Gate Arrays*, Feb. 1999, pp. 69-78.

Wawrzynek, J., "EECS150-Digital Design: Lecture 5—Field Programmable Gate Arrays (FPGAs)," Feb. 4, 2002, slides 1-20.

Weaver, N., et al., "The SFRA: A Corner-Turn FPGA Architecture," *FPGA '04*, Feb. 22-24, 2004, ACM, Monterey, CA.

Wegener, I., "The Complexity of Boolean Functions," *Wiley-Teubner Series in Computer Science*, 1987 Month N/A, John Wiley & Sons Ltd. and B.G. Teubner, Stuttgart, New York.

Wilton, S.J.E., "Memory-to-Memory Connection Structures in FPGAs with Embedded Memory Arrays," *FPGA 97*, Feb. 1997, pp. 10-16, ACM, Monterey, CA.

Xilinx, Inc., "Virtex-4 Family Overview," *Advance Product Specification*, Sep. 10, 2004, pp. 21-30, v1.1, Xilinx, Inc.

Xing, S., et al., "FPGA Adders: Performance Evaluation and Optimal Design," *IEEE Design & Test of Computers*, Jan.-Mar. 1998, pp. 24-29, IEEE.

Zilic, Z. et al., "Using BDDs to Design ULMs for FPGAs," *Proceedings of the 1996 ACM Fourth International Symposium on Field-Programmable Gate Arrays (FPGA '96)*, Feb. 11-13, 1996, pp. 1-10, Monterey, CA.

Zuchowski, P.S., "A Hybrid ASIC and FPGA Architecture," 2002 Month N/A, IEEE.

Mandal, C., et al., "Use of Multi-port Memories in Programmable Structures for Architectural Synthesis", *Proceedings of 8th Annual IEEE International Innovative Systems in Silicon*, Oct. 9-11, 1996, pp. 341-351.

U.S. Appl. No. 12/729,227, filed Mar. 22, 2010, Schmit, Herman et al.

Updated portions of prosecution history of U.S. Appl. No. 11/609,875, filed Mar. 3, 2010, Schmit, Herman et al.

Updated portions of prosecution history of U.S. Appl. No. 11/371,352, filed Nov. 16, 2009, Schmit, Herman et al.

Updated portions of prosecution history of U.S. Appl. No. 11/609,883, filed Jan. 23, 2009, Schmit, Herman et al.

Updated portions of prosecution history of U.S. Appl. No. 11/081,883, filed Jun. 13, 2007, Hutchings, Brad et al.

Updated portions of prosecution history of U.S. Appl. No. 11/926,100, filed Mar. 19, 2010, Hutchings, Brad et al.

Updated portions of prosecution history of U.S. Appl. No. 11/081,850, filed Mar. 3, 2010, Hutchings, Brad.

Updated portions of prosecution history of U.S. Appl. No. 11/081,867, filed Oct. 11, 2007, Schmit, Herman et al.

Updated portions of prosecution history of U.S. Appl. No. 11/926,092, filed Aug. 28, 2009, Schmit, Herman et al.

Updated portions of prosecution history of U.S. Appl. No. 11/081,809, filed Jan. 27, 2006, Schmit, Herman et al.

Updated portions of prosecution history of U.S. Appl. No. 11/757,982, filed Mar. 11, 2009, Schmit, Herman et al.

Soviani, et al., "Optimizing Sequential Cycles through Shannon Decomposition and Retiming", *Design, Automation, and Test in Europe*, Mar. 10, 2006, pp. 1085-1090.

* cited by examiner

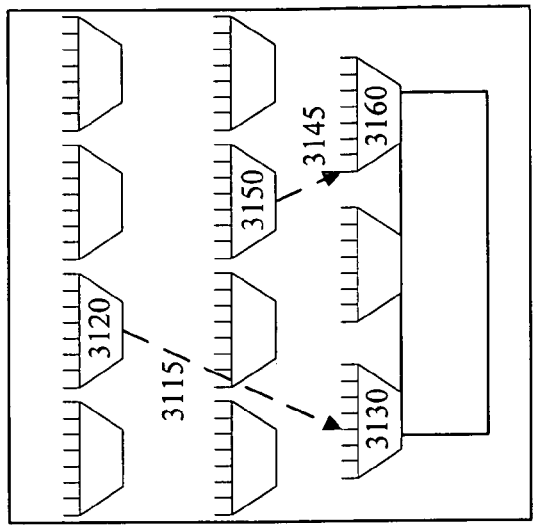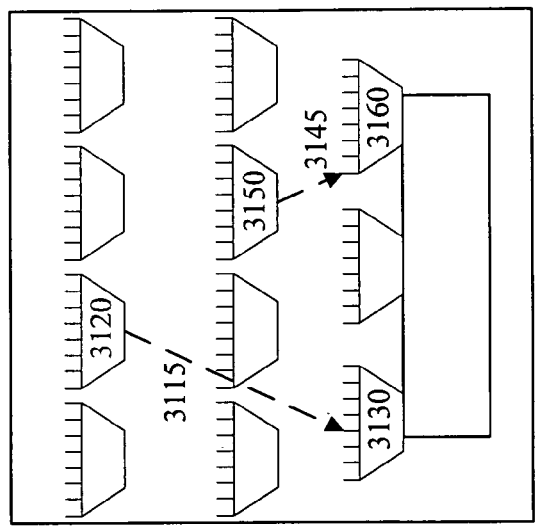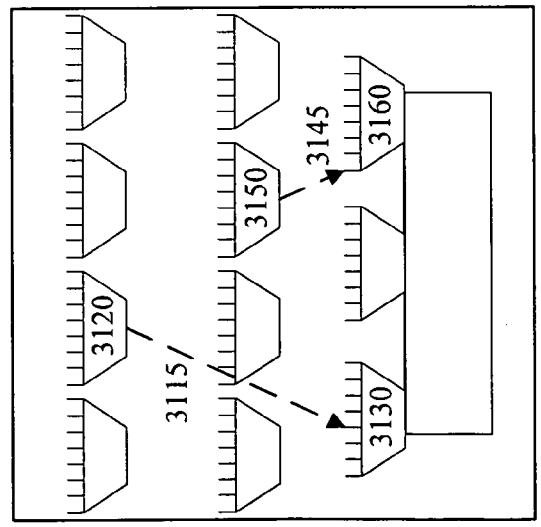
Fig. 31

US 7,797,497 B1

SYSTEM AND METHOD FOR PROVIDING MORE LOGICAL MEMORY PORTS THAN PHYSICAL MEMORY PORTS

CROSS REFERENCE TO RELATED APPLICATIONS

This Application is related to the following applications: U.S. patent application Ser. No. 11/609,875, filed Dec. 12, 2006; U.S. patent application Ser. No. 11/371,191, filed Mar. 8, 2006; U.S. patent application Ser. No. 11/371,194, filed Mar. 8, 2006; U.S. patent application Ser. No. 11/371,352, filed Mar. 8, 2006; U.S. patent application Ser. No. 11/371,198, filed Mar. 8, 2006; and U.S. patent application Ser. No. 11/609,883, filed Dec. 12, 2006.

FIELD OF THE INVENTION

The present invention is directed towards configurable integrated circuits with memory ports and offset connections.

BACKGROUND OF THE INVENTION

Integrated circuits ("ICs", often called "chips") are typically grown on and etched into semiconductor substrates. The transistors that make up the majority of their circuitry are generally confined to a two dimensional plane on the surface of the substrate. Almost any integrated circuit design requires connections from transistors on one part of the substrate to transistors on other parts of the substrate. These transistors are connected by tiny metal wires. The wires are not free wires, but are rather laid down in rigid layers (wiring planes) over the transistors. Unlike the transistors, the wired connections can use three dimensions, moving among different wiring planes by use of "vias". Vias are implements at which connections can pass from one layer to another.

The confinement of transistors to a single, two-dimensional plane means that connections through transistors alone cannot go over each other, but must instead go around. The freedom of wired connectors to change layers means that one wire can go over another wire, rather than going around it.

Configurable ICs are ICs that can be "programmed" to provide different integrated circuit configurations. Configurable ICs can be thought of as general purpose chips. The logical blocks within them can be re-assigned to different tasks as needed. For instance, acting as a logical "AND" gate in one set up and as a logical "OR" gate in another setup. The importance of the difference between transistor connections and wire connections to configurable ICs will be explained below.

The use of configurable ICs (e.g. field programmable gate arrays, "FPGAs") has dramatically increased in recent years. Configurable ICs usually have logic circuits, interconnect circuits, and input/output (I/O) circuits. The logic circuits (also called logic blocks) are typically arranged as an internal array of circuits. These logic circuits are connected together through numerous interconnect circuits (also called interconnects). The logic and interconnect circuits are typically surrounded by the I/O circuits.

FIG. 1 illustrates an example of a configurable logic circuit 100. This logic circuit can be configured to perform a number of different functions. As shown in FIG. 1, the logic circuit 100 receives a set of input data 105 and a set of configuration data 110. The configuration data set can be stored in a set of SRAM cells 115. From the set of functions that the logic circuit 100 can perform, the configuration data set specifies a particular function that this circuit is to perform on the input data set. Once the logic circuit performs its function on the input data set, it provides the output of this function on a set of output lines 120. The logic circuit 100 is said to be configurable, as the configuration data set "configures" the logic circuit to perform a particular function, and this configuration data set can be modified by writing new data in the SRAM cells. Multiplexers and look-up tables are two examples of configurable logic circuits.

FIG. 2 illustrates an example of a configurable interconnect circuit 200. This interconnect circuit 200 connects a set of input data 205 to a set of output data 210. This circuit receives configuration data bits 215 that are stored in a set of SRAM cells 220. The configuration bits specify how the interconnect circuit should connect the input data set to the output data set. The interconnect circuit 200 is said to be configurable, as the configuration data set "configures" the interconnect circuit to use a particular connection scheme that connects the input data set to the output data set in a desired manner. Moreover, this configuration data set can be modified by writing new data in the SRAM cells. Multiplexers are one example of interconnect circuits.

FIG. 3 illustrates a portion of a prior art configurable IC 300. As shown in this figure, the IC 300 includes an array of configurable logic circuits 305 and configurable interconnect circuits 310. The IC 300 has two types of interconnect circuits 310a and 310b. Interconnect circuits 310a connect interconnect circuits 310b and logic circuits 305, while interconnect circuits 310b connect interconnect circuits 310a to other interconnect circuits 310a. In some cases, the IC 300 has hundreds or thousands of logic circuits 305 and interconnect circuits 310.

The arrangement of interconnect circuits illustrated in FIG. 3 allows configurations in which the output of one chosen logic circuit can be sent through a series of interconnect circuits to an input of any other single chosen logic circuit. The connection would be made though a succession of interconnect circuits. However, it is usually the case that multiple logic circuits must be made to connect to each other.

One reason that multiple logic circuits must be connected is that ICs commonly need to deal with multiple bit "words", not just single bits. For example, a user might want to invert a 4-bit number, and then perform another operation on the resulting 4-bit number. Each logic circuit in the configurable IC can perform an operation on one bit, and then pass the result on to another logic circuit to perform the next operation.

Such a set of operations results in a "data path" that, in this example, is 4 bits wide. Each logic circuit does an operation on one data bit, so a 4-bit set of operations requires 4 logic circuits in a row. In order to perform a series of operations on a particular 4-bit set of data, all 4 bits must be sent to another row of 4 logic circuits. The simplest way of doing this is to send all 4 bits to the next row down.

Another way of doing this is shown in FIG. 4. In FIG. 4, the output from logic circuits 405a, goes through the interconnect circuits 410a and 410b to the inputs of logic circuits 405b.

FIG. 4 demonstrates that in the prior art multiple logic circuits could be connected in parallel to multiple other logic circuits. However, this set of connections came at a price; because each interconnect circuit can only be used to make one connection at a time. Thus, the figure also shows that logic circuits 405c and interconnect circuits 410c are completely isolated from other circuits. The figure also shows that any circuits on opposite sides of the connected circuits can only connect to each other if they go around the connected block.

The problem of blocked circuits gets worse if a user wants to shift a data path over, as shown in FIG. 5. This figure shows an attempt to shift a 3-bit data path from the logic circuits shown in tile set 520a over to the logic circuits in tile set 520b. Unless otherwise noted a "tile set" in this specification defines a group of tiles in the diagram, and is not itself an actual physical object. Circuit 505a connects to circuit 505d, and circuit 505b connects to circuit 505e, but each interconnect circuit can only be used once. Each interconnect circuit used in those two connections is unavailable for making a connection between circuit 505c and circuit 505f. Once the path between those circuits reaches dead end 530, it has no available interconnect circuit to go to. In some cases, long routes could connect circuits 505c and 505f, rather than the path simply being blocked outright. The long route would use interconnect circuits that are outside the illustrated area (below those shown in FIG. 5). However, data following such a route would pass through a greater number of interconnect circuits than data following the routes shown in FIG. 5 and would thus take longer to reach the destination circuit than data following the illustrated routes. In addition to creating timing problems, such long routes also become more and more complicated the greater the number of tiles in the tile sets.

Other configurable ICs of the prior art attempted to solve this problem by making direct connections between interconnect circuits in distant rows or columns. Here, a direct connection is one which does not pass through any routing circuitry other than that associated with the individual logic circuits it connects. FIG. 6 shows available direct connections 610 between a group of circuits 620a and several groups of circuits 620b-620e below.

Having distant interconnects in the same row or column is only a partial solution. Often a user may want a long sequence of operations performed on a multi-bit set, each operation taking one logic circuit per bit. Vertical and horizontal direct connections still confine wide data paths to stay within one set of columns or rows, and if a large number of operations needs to be performed, there may not be enough available space in a set of columns to allow for individual rows to be skipped by long direct connections.

As FIG. 7 shows, because of the blocking effects of a row of occupied circuits, such a sequence of operations may result in a large section of the chip being occupied by a wall 730 of in-use circuits. With such a wall in place, circuit 705a has no path to reach circuit 705b.

Therefore, there is a need in the art for a configurable IC that has a wiring architecture that increases the interconnectivity between its configurable circuits.

SUMMARY OF THE INVENTION

Some embodiments provide for a method of mapping a user design to a configurable integrated circuit (IC). The method is for a configurable IC that implements a user design with an associated user design clock cycle. The IC operates on a sub-cycle clock that has multiple sub-cycle periods within a user period of the user design clock cycle. The method identifies multiple port accesses to a first multi-port memory defined in the user design. The accesses are in a single user design clock cycle. The method maps the multiple port accesses to the first multi-port memory to multiple physical-port memory accesses to a second physical-port memory in the configurable IC during multiple sub-cycles associated with a single user design clock cycle.

Some embodiments provide a reconfigurable IC that implements a user design that is specified based on a user design clock cycle. The reconfigurable IC has a memory with at least one port. The memory is accessible through the port(s) multiple times per user design clock cycle. The multiple times during the user design clock cycle correspond to multiple accesses to a multi-port access of a memory in the user design.

BRIEF DESCRIPTION OF THE DRAWINGS

FIG. 31 illustrates intra-tile connections.

DETAILED DESCRIPTION OF THE INVENTION

Figure 1:
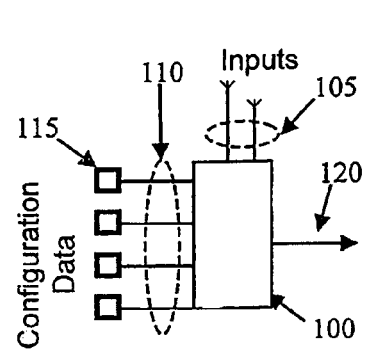
FIG. 1 illustrates an example of a prior art configurable logic circuit.

In the following description, numerous details are set forth for the purpose of explanation. However, one of ordinary skill in the art will realize that the invention may be practiced without the use of these specific details. For instance, not all embodiments of the invention need to be practiced with the specific number of bits and/or specific devices (e.g. multiplexers) referred to below. In other instances, well known structures and devices are shown in block diagram form in order to not obscure the description of the invention with unnecessary detail.

I. Overview

A. Brief Overview

Some embodiments provide novel wiring architectures for configurable integrated circuits (ICs). In some embodiments, the configurable resources of the IC include configurable logic circuitry and configurable interconnect circuitry. In some embodiments such configurable circuitry can be conceptually grouped into tiles that are arranged in some arrangement such as an array with a number of rows and columns of tiles. The configurable IC includes a first tile and a second tile that is offset from the first tile by at least one row and at least two columns or by at least one column and at least two rows. The configurable IC also includes a non-neighboring offset connection (NNOC) that directly connects an output of the first tile to an input of the second tile. Some embodiments use multiple parallel NNOCs to directly connect a first set of tiles to a second set of tiles that are offset from the first set of tiles in a similar manner to the one described above for individual tiles.

Some embodiments use NNOCs to implement a variety of useful circuit designs. For example, NNOCs, along with other connections and circuits, can be used to implement barrel shifters which shift data words by specified numbers of bits. In some embodiments, barrel shifters that shift by increments of one bit (which allow precise shifts) are placed before or after barrel shifters that shift by increments of multiple bits (which allow long shifts). These embodiments allow shifts that are both long and precise, with the multi-bit increment shifters providing long shifts and the one-bit increment shifters providing precise shifts.

In some embodiments, the logic circuitry of the configurable ICs mentioned above may include look up tables (LUTs) and input-select multiplexers (IMUXs) that select the inputs of the LUTs. These LUTs can themselves be configured to act as multiplexers. Such LUTs can be used along with the IMUXs to implement multiplexers with larger numbers of inputs. For example, a 3-input LUT can be configured as a two-input multiplexer with the first two inputs of the LUT receiving data bits a third input of the LUT receiving the selection bit. The IMUXs connected to the first two inputs can be configured as two-input multiplexers. The combination of these elements would act as a 4×1 multiplexer. Such LUT and IMUX multiplexers can be used to implement barrel shifters like the ones mentioned above.

Barrel shifters are used in some embodiments to present digital memories as being narrower and deeper than they are. Some embodiments provide novel techniques for accessing memory multiple times per user cycle. These embodiments may map virtual ports onto the multiple accesses. A more detailed overview of some features starts below.

B. Detailed Overview

Some embodiments of the invention provide architectures for configurable IC's that have configurable computational units (e.g., configurable logic circuits) and configurable routing circuits for configurably routing signals between the configurable computational units. For instance, some embodiments provide a configurable IC that can be thought of as having numerous configurable computational tiles (e.g., hundreds, thousands, hundreds of thousands, etc. of tiles) that are laid out on the IC according to a particular arrangement. These tiles are an abstraction used to represent sections of the IC rather than any sort of physical object. In some embodiments, the configurable computational tiles include configurable logic circuits and configurable interconnect circuits. In other embodiments, the only configurable circuits in the configurable computational tiles are configurable logic circuits or configurable interconnect circuits.

The computational tiles in some embodiments are arranged in numerous rows and columns that form a tile array. Also, the tile arrangement in some embodiments results in one or more sets of the configurable circuits (e.g., the configurable logic circuits and/or configurable interconnect circuits) being arranged in an array with several aligned rows and columns. Alternatively, some embodiments might organize the configurable circuits in an arrangement that is not an array.

For simplicity of explanation, the embodiments below are generally described and illustrated as being in arrays. However, some arrangements may have configurable circuits or tiles arranged in one or more arrays, while other arrangements may not have the configurable circuits or tiles arranged in an array. In the tile or circuit arrangement, some embodiments intersperse several other circuits, such as memory blocks, processors, macro blocks, IP blocks, SERDES controllers, clock management units, etc. Alternatively, some embodiments arrange some of these other circuits (e.g., memory blocks) within the tile structure.

In some embodiments, each routing interconnect circuit can receive several input signals and distribute output signals to several different types of circuits, such as routing or input select interconnect(s) of the same tile, or routing and input-select interconnects of other tiles. Also, routing interconnects can have a fan out greater than one in some embodiments In some embodiments, sets of multiple parallel connections directly connect sets of tiles with other sets of tiles. As further described below, a direct connection between two circuits is an electrical connection between the two circuits that is achieved by (1) a set of wire segments that traverse through a set of the wiring layers of the IC, and (2) a set of vias when two or more wiring layers are involved. In some embodiments, a direct connection between two circuits might also include a set of buffer circuits.

A particular computational tile's input select interconnect(s) can receive input signals from circuits outside or inside of the particular tile, and pass a set of these received signals to a logic circuit in the particular computational tile. In some of these embodiments, the particular computational tile's input select interconnects have direct connections with circuits in tiles that are several tiles away from the particular tile. In some of these embodiments, one or more of these other tiles are not vertically or horizontally aligned with the particular computational tile in the tile arrangement. In other words, some embodiments have several long direct offset connections for connecting the inputs of some input select interconnects with circuits that are in computational tiles that are offset from the particular computational tile by at least two rows and at least one column or by at least two columns and at least one row.

Some embodiments also have several offset connections between interconnects in different computational tiles. For instance, in some embodiments, the output of a routing interconnect in a particular computational tile can be supplied through an offset connection to the input of the routing interconnect of another computational tile. Such an offset connect can also be used to provide the output of a routing interconnect in one computational tile to the input select interconnect in another computational tile. Some embodiments use long offset connections to connect two interconnects that are neither in neighboring computational tiles nor in vertically or horizontally aligned computational tiles. Some embodiments also use long offset connections to provide the output of logic circuits to circuits that are in computational tiles that do not neighbor the computational tiles' of the logic circuits.

The use of direct offset connections in the configurable IC of some embodiments increases the interconnectivity between the circuits of the configurable IC. In addition to computational tiles, some embodiments include other types of tiles (e.g., tiles that embed memory arrays) that do not include some or all of the circuits of a computational tile. In some embodiments, these other tiles connect to each other and/or to computational tiles in the same manner as was described above for connections between computational tiles. The configurable IC of some embodiments is a reconfigurable IC. In some of these embodiments, the reconfigurable IC is a sub-cycle reconfigurable IC.

Some embodiments use sets of non-neighboring offset connections to establish wide paths for data. In some such sets, the connectors are topologically parallel to one another, that is, parallel on a topological representation of the tiles and/or connectors. More detailed descriptions of such embodiments can be found below.

Some embodiments implement a user design that includes the tiles configured as four-to-one multiplexers. These embodiments allow the user's design to select which input of the four-to-one multiplexer is active. One type of device that may use such multiplexers is a barrel shifter. A barrel shifter is a device that can shift a data word by some number of bits. Some embodiments use barrel shifters to present the physical memory of the configurable IC as being narrower and deeper than it really is.

Some embodiments use a configurable IC that operates on a sub-cycle time scale. The configurable IC of such embodiments implements a user design that is treated as being run on a user design clock cycle (sometimes called "user cycle") time scale. Multiple sub-cycles occur for each user design clock cycle. In some embodiments, the configurable IC can be re-configured once per sub-cycle, thus more than once per user cycle. Some such embodiments use the ability to access memory multiple times per user cycle to present the memory to the user design as having more logical memory ports than there are physical memory ports. More detailed descriptions of such embodiments can be found below.

II. Terms and Concepts

A configurable IC is an IC that has configurable circuits. In addition to configurable circuits, a configurable IC also typically includes non-configurable circuits (e.g., non-configurable logic circuits, interconnect circuits, memories, etc.).

A configurable circuit is a circuit that can "configurably" perform a set of operations. Specifically, a configurable circuit receives "configuration data" that selects an operation that the configurable circuit will perform out of a set of operations that it can perform.

In some embodiments, configuration data is generated outside of the configurable IC. In some embodiments, a set of software tools converts a high-level IC design (e.g., a circuit representation or a hardware description language design) into a set of configuration data that can configure the configurable IC (or more accurately, the configurable IC's configurable circuits) to implement the IC design.

Configurable circuits may include logic circuits and interconnect circuits. A logic circuit is a circuit that can perform a function (e.g. AND, OR, or XOR) on a set of input data that it receives. A configurable logic circuit is a logic circuit that can be configured to perform different functions on its input data set (see FIG. 1 above).

One type of logic circuit is a look-up table (LUT) circuit. A LUT accepts a set of one or more input bits, and provides a set of one or more output bits. The output bits corresponding to a particular set of input bits are set before the input bits are received. A LUT performs the function its name indicates. It acts like a table with the input bits identifying the desired "row" in the table and the output bits being the entries in the output "column(s)" that intersect with the desired "row". A configurable LUT allows the output "column(s)" to be set to whatever values are needed for the function the configurable IC is performing at the time. Unless otherwise specified, all LUTs in the embodiments described in this specification are configurable LUTs. However, other embodiments may use non-configurable LUTs.

Figure 2:
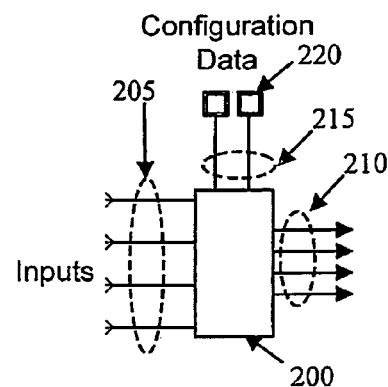
FIG. 2 illustrates an example of a prior art configurable interconnect circuit.
Figure 3:
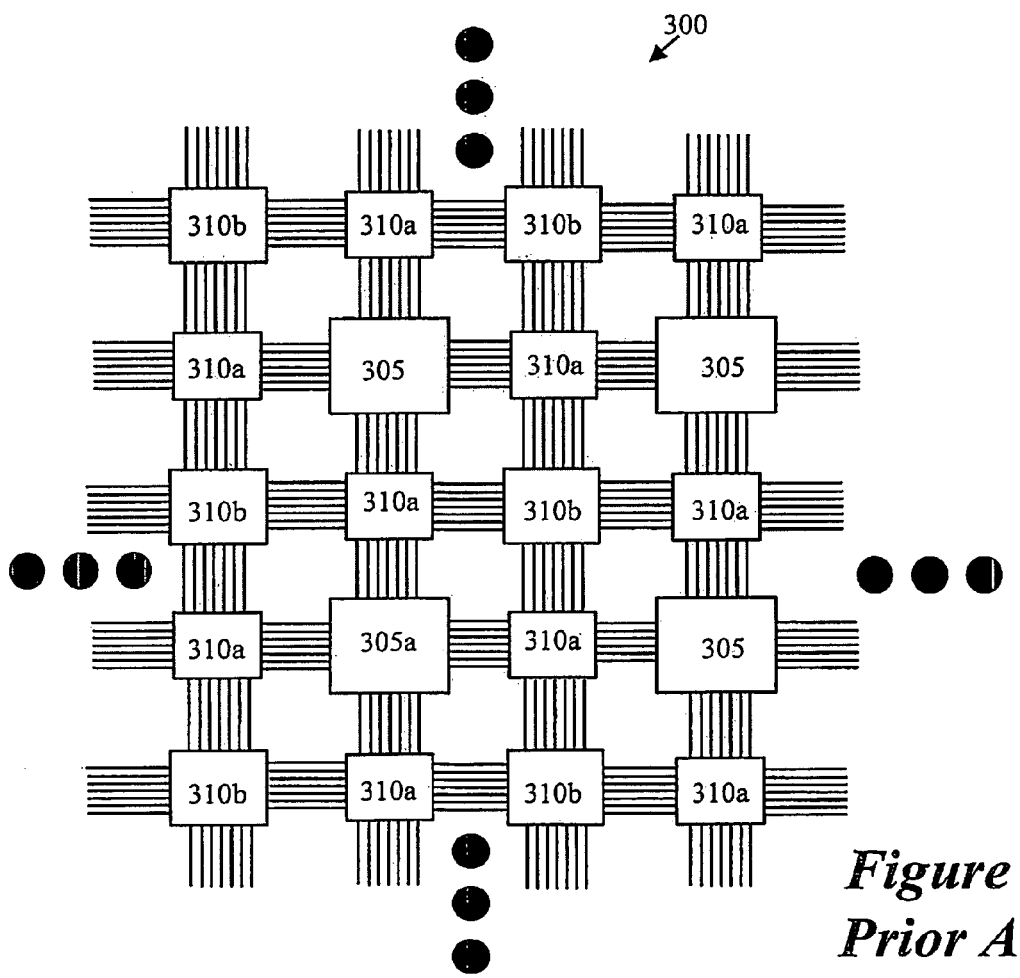
FIG. 3 illustrates a portion of a prior art configurable IC.
Figure 4:
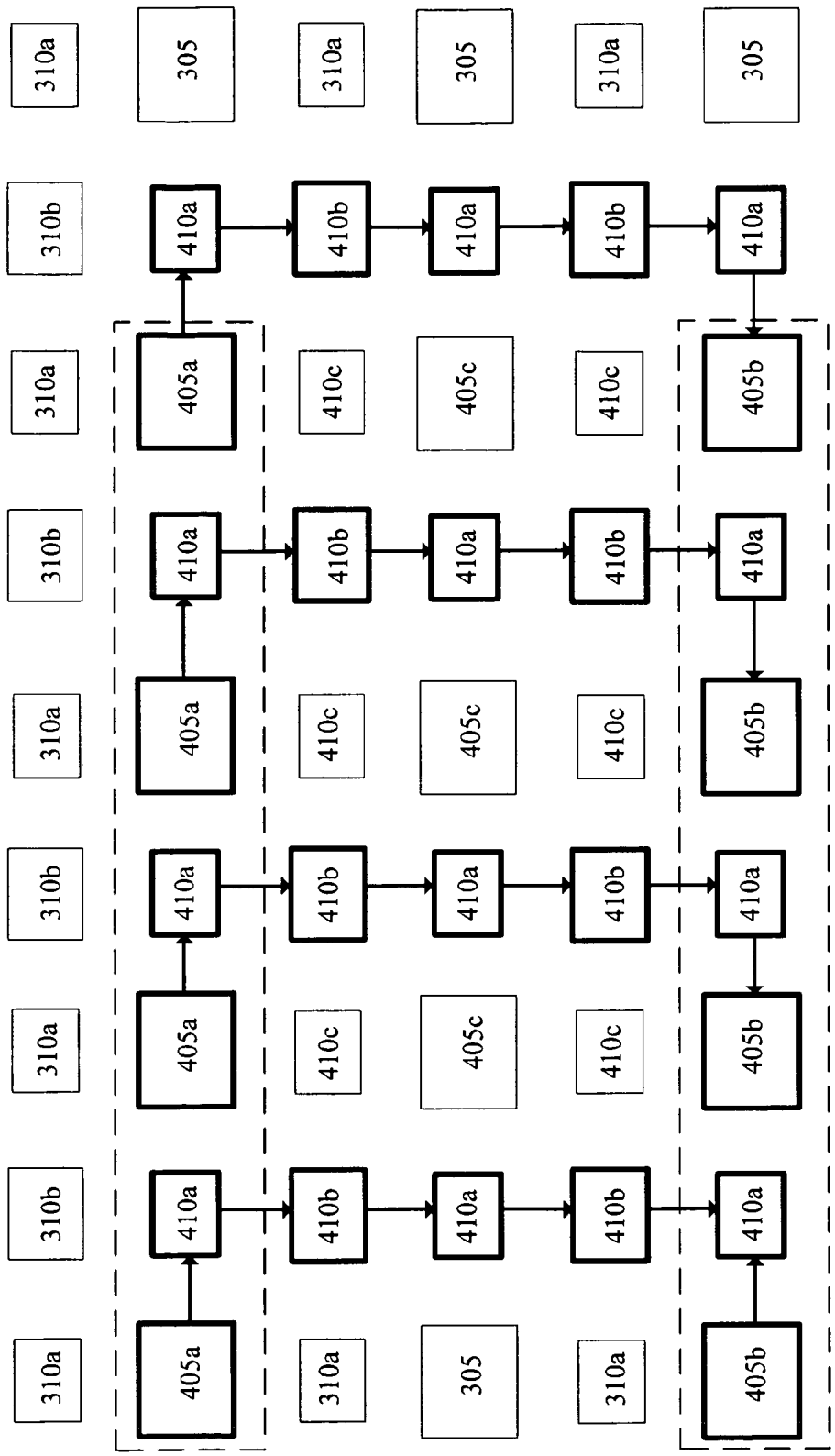
FIG. 4 illustrates connections of a data path in a prior art configurable IC.
Figure 5:
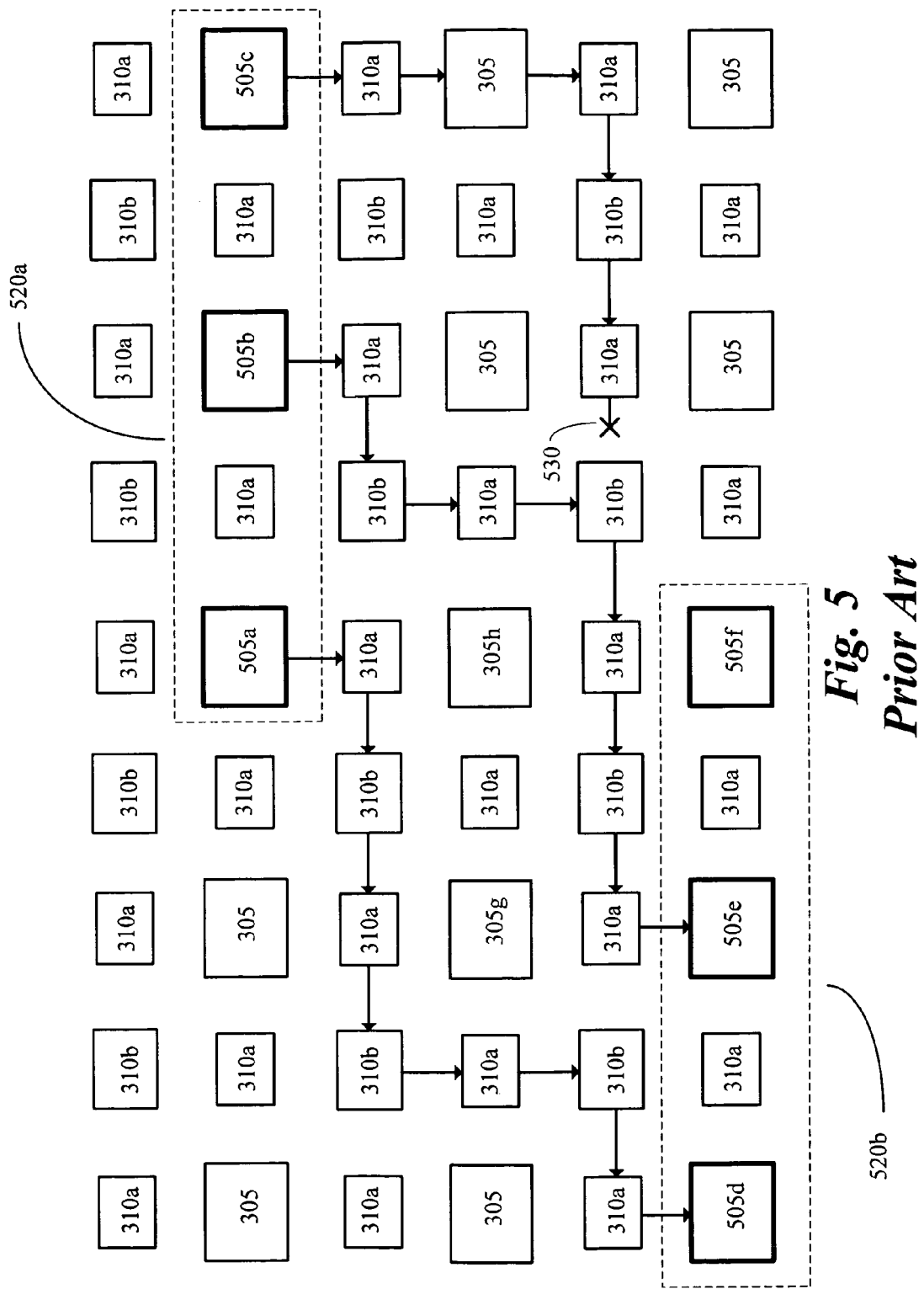
FIG. 5 illustrates connections of another data path in a prior art configurable IC.
Figure 6:
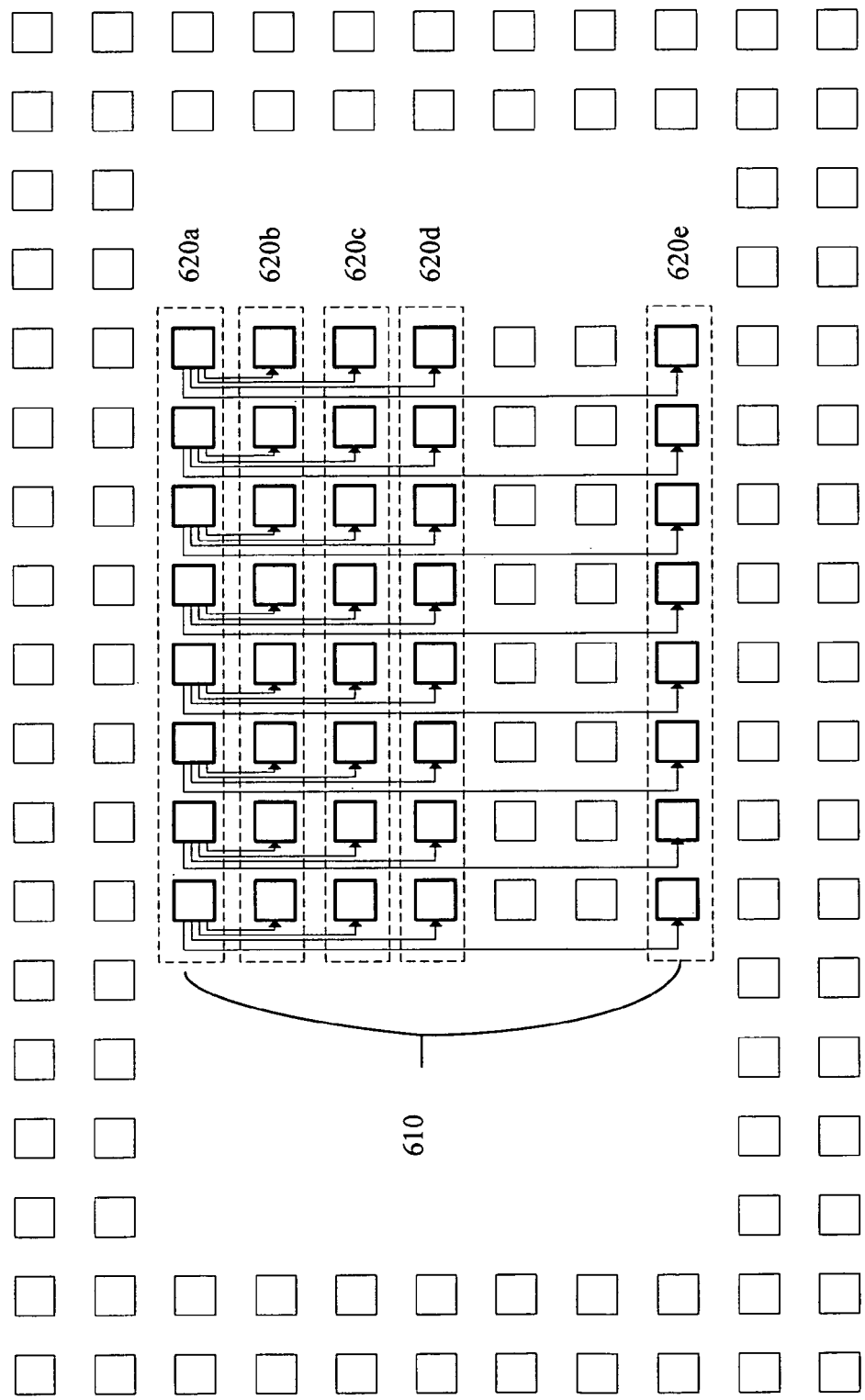
FIG. 6 illustrates long connections within a column of tiles in a prior art configurable IC.
Figure 7:
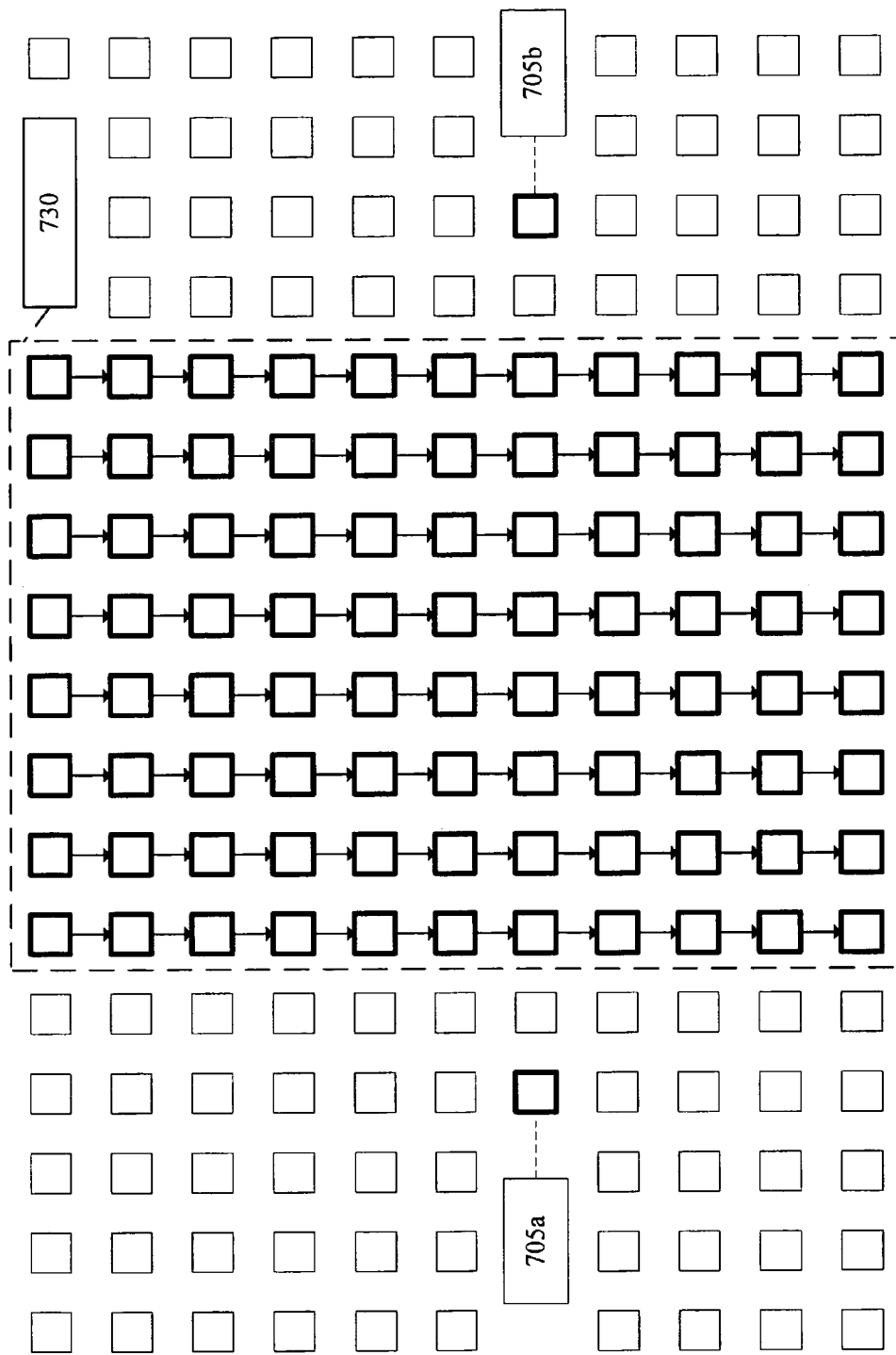
FIG. 7 illustrates circuits blocked by an extended data path in a prior art configurable IC.

A configurable interconnect circuit is a circuit that can configurably connect an input set to an output set in a variety of manners. One example of a configurable interconnect circuit is described in relation to FIG. 2 above. Some interconnect circuits described in embodiments below are multiplexers.

A multiplexer ("MUX") is a circuit that accepts a set of data inputs (sometimes called "data bits" or simply "inputs") and a set of selection inputs (sometimes called "selection bits"). The multiplexer passes a subset of the data inputs to a set of data outputs. The particular subset that the multiplexer passes on is determined by the selection inputs. Different embodiments of multiplexers may implement this passing through of data in different ways. The passing through might be by establishing an electrical path between the selected input set and the output set of the multiplexer. The passing through could also be by indirectly passing the value of the data at the input set to the output set. Any means of providing the same values at the output set as at the selected input set would be within the definition of passing through used herein.

An input-select multiplexer (IMUX) is a multiplexer that supplies one input signal of the LUTs described in the embodiments below. In other words, an IMUX receives several input signals and passes one of these input signals to its LUT.

A routing multiplexer (RMUX) is an interconnect circuit that can receive signals from and supply signals to interconnect and logic circuits in its own or other tiles in the arrangement. Unlike an IMUX that only provides its output to a single logic circuit (i.e., that only has a fan out of 1), a routing multiplexer in some embodiments, either provides its output to several logic and/or interconnect circuits (i.e., has a fan out greater than 1), or provides its output to one other interconnect or logic circuit.

A user-design signal within a configurable IC is a signal that is generated by a circuit (e.g., logic circuit) of the configurable IC, or in some cases is received by a circuit in the configurable IC from input lines coming into the IC from outside. The word "user" in the term "user-design signal" connotes that the signal is a signal that the configurable IC generates (or receives from the outside) for a particular application that a particular user has configured the IC to perform. User-design signal is abbreviated to user signal in some of the discussion below.

In some embodiments, a user signal is not a configuration or clock signal that is generated by or supplied to the configurable IC. In some embodiments, a user signal is a signal that is a function of at least a portion of the configuration data received by the configurable IC and at least a portion of the inputs to the configurable IC. In these embodiments, the user signal can also be dependent on (i.e., can also be a function of) the state of the configurable IC. The initial state of a configurable IC is a function of the configuration data received by the configurable IC and the inputs to the configurable IC. Subsequent states of the configurable IC are functions of the configuration data received by the configurable IC, the inputs to the configurable IC, and the prior states of the configurable IC.

Some embodiments have "UMUXs". A UMUX is a multiplexer that receives user-design signals for at least one of its data inputs and one of its selection inputs. A UMUX might receive a user-design signal directly from a configurable logic circuit or indirectly through one or more intermediate configurable interconnect circuits. Some UMUXs are "hybrid" UMUXs. A hybrid UMUX is one which can be set by the configuration data either to receive all its selection inputs from the configuration data or to receive one or more selection bit from user signals and the rest (if any) from the configuration data.

A direct connection is an electrical connection between two nodes that is achieved by (1) a set of wire segments that traverse through a set of the wiring layers of the IC, and (2) a set of vias when two or more wiring layers are involved.

In some embodiments, a direct connection might also include a set of buffer circuits in some cases. In other words, two nodes are directly connected in some embodiments by a set of wire segments that possibly traverse through a set of buffer circuits and a set of vias. Buffer circuits are not logic or interconnect circuits. In some embodiments, buffer circuits are part of some or all direct connections. Buffer circuits might be used to achieve one or more objectives (e.g., maintain the signal strength, reduce noise, delay signal, etc.) along the wire segments that establish the direct connections. Inverting buffer circuits also allow an IC design to reconfigure logic circuits less frequently and/or use fewer types of logic circuits. In some embodiments, buffer circuits are formed by one or more inverters (e.g., two or more inverters that are connected in series). A via is an opening in the insulation between wiring layers that allows wires on different wiring layers to form an electrical connection.

In the embodiments described below, most of the interconnect circuits are multiplexers, each with eight inputs and one output. Multiplexers in other embodiments may have other numbers of inputs and/or outputs. Also in the embodiments described below, most of the logic circuits are LUTs, each with three inputs and one output. One of ordinary skill in the art will realize that other embodiments may have different types of interconnect or logic circuits, and that other embodiments can have interconnect or logic circuits with different numbers of inputs. It will also be clear to one of ordinary skill in the art that the configurable ICs may extend considerably farther than the regions shown, and that the tiles on the edge of the illustrated regions may not be on the edges of the configurable ICs.

A non-neighboring offset connection (NNOC) is a direct connection that connects two tiles that are not in the same column or row as each other and are either at least two rows or at least two columns apart.

A virtual memory port (sometimes referred to as a "logical memory port") is a port in a user design that the user design treats as though it is a physical port, but that is not a physical port. In some embodiments a virtual memory port may be associated with a specific physical port, but accesses to the memory using the virtual port would be limited to specific fractions of the available time of the physical memory port. In other embodiments a virtual port may be assigned to various physical ports using some assignment plan.

III. Configurable Integrated Circuit Architecture

A. Example of a Tile

Figure 8:
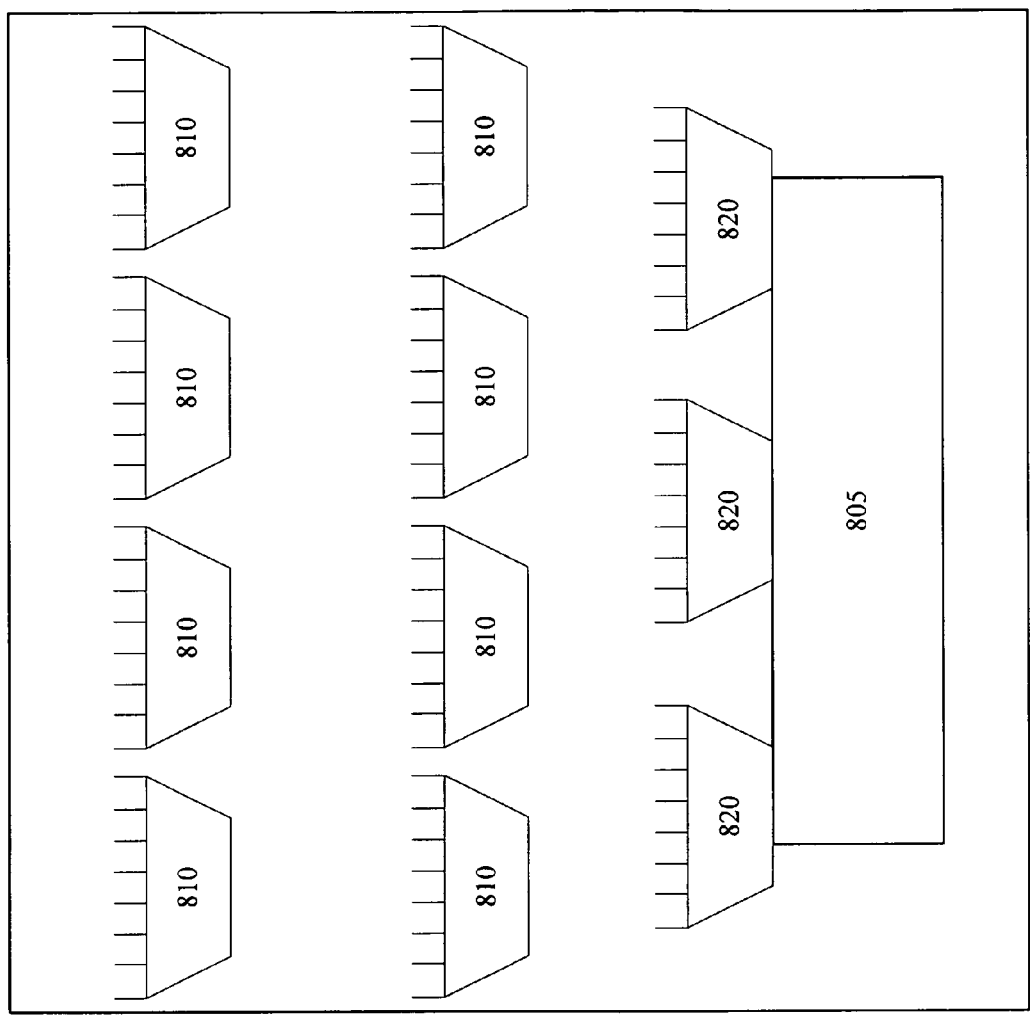
FIG. 8 illustrates an example of a tile in a configurable IC.

Some embodiments of the invention are implemented in configurable ICs. The configurable ICs have configurable interconnect and logic circuits. These interconnect and logic circuits can be conceptually grouped in configurable "tiles". Such tiles may be arranged in arrays of rows and columns or in other groupings. The tiles themselves are not physical objects, but are a way of describing sections of the array or grouping of circuits. FIG. 8 illustrates a tile of some embodiments. In this figure, the interconnects are multiplexers and the logic circuits are look up tables. This figure shows a tile with eight routing multiplexers ("RMUXs") 810, three input-multiplexers ("IMUXs") 820 and one look-up table 805. Each of these multiplexers selects one among several inputs and allows data coming in on that input to pass through to the output of that multiplexer. The selected input can be called the "active input". The IMUXs select among their various inputs and pass the selected input on to the look-up table. A particular input line on a particular multiplexer can be called an "input locus". Thus there are sixty-four input loci of the eight RMUXs 810 and twenty-four input loci of the three IMUXs 820 of the tile in FIG. 8.

In some embodiments, multiple tiles may each have circuits identical to each other. Two input loci, one on each tile that occupy the same position relative to their tiles can be referred to as "corresponding inputs". For example, the leftmost input of the middle IMUX on one tile is the corresponding input to the leftmost input of the middle IMUX on another tile. Selecting an input locus for a set of tiles means that the input at that locus on each tile in the set becomes an active input.

In some embodiments, each RMUX, IMUX, and LUT has a single output. However, for RMUXs and LUTs, this output may fan out to directly connect to several other inputs. That is, one output value can be sent to many input loci. A direct connection is not itself configurable, but if the input is one of the inputs of a multiplexer, then the multiplexer can be used to select which of several direct connections to receive data from and which ones to ignore. This type of selection is accomplished by making the appropriate input active.

The outputs (not shown) of the RMUXs 810 may connect to inputs on IMUXs 820 or other RMUXs 810 on the same tile, or to IMUXs or other RMUXs on other tiles (not shown). The output of the look-up table 805 may connect to inputs on IMUXs 820 or RMUXs 810 on the same tile, or to IMUXs or RMUXs on other tiles (not shown). In several of the figures, some of these features may be omitted for clarity, but those skilled in the art will realize that they may be present in some embodiments. In particular, several figures have some or all of the RMUXs not shown in order to reduce confusion.

B. Connections Between Tiles

Connections between tiles in a configurable IC affect the function of the configurable IC. These connections will be illustrated in some of the following figures using an array of squares, such as that shown in FIG. 9. Each small square represents a tile. Tiles drawn with thick lines (such as tiles 905a and 905b) are used to illustrate concepts of the invention. Tiles drawn with thin lines are used to illustrate the point that there are more tiles in a configurable IC than the few that are specifically identified in the descriptions of the figures. A line from one thick tile to another thick tile, such as line 910, represents a direct connection. The connection connects an output of the tile at the arrow's tail to an input of the tile with the arrow head. Unless otherwise indicated, connection lines are topological only, and not necessarily the physical paths that the wires take. It will be clear to one of ordinary skill in the art that any of the connection types described below can be present in the same embodiment as other types of the connections, including the types described below and any connection type found in the prior art.

C. Non-Neighboring Offset Connections

Some embodiments include direct connections between tiles not in the same row or column and not neighboring each other. These connections can be called non-neighboring offset connections ("NNOC"). NNOCs can be further characterized by providing two integers indicating the amount of offset along each direction, in the format NNOC (m,n). One example is that an NNOC (1,2) is a direct connection between an output of a first tile and an input of a second tile one column to the left and two rows down from the first. For NNOCs connecting from an output of a first tile to an input of a tile above or to the right of the first circuit, negative numbers are used. One example is NNOC (−3,−1) is a direct connection between an output of a first tile and the input of a second tile three columns to the right of it and one row above it. The use of these two integers is a shorthand for this specification and leaves out information about which output locus, in the first tile, and which input locus, in the second tile, the NNOC connects. It will be clear to those skilled in the art that this means of characterizing the connections is a way of explaining some embodiments and other embodiments also lie within the scope of the invention.

Figure 9:
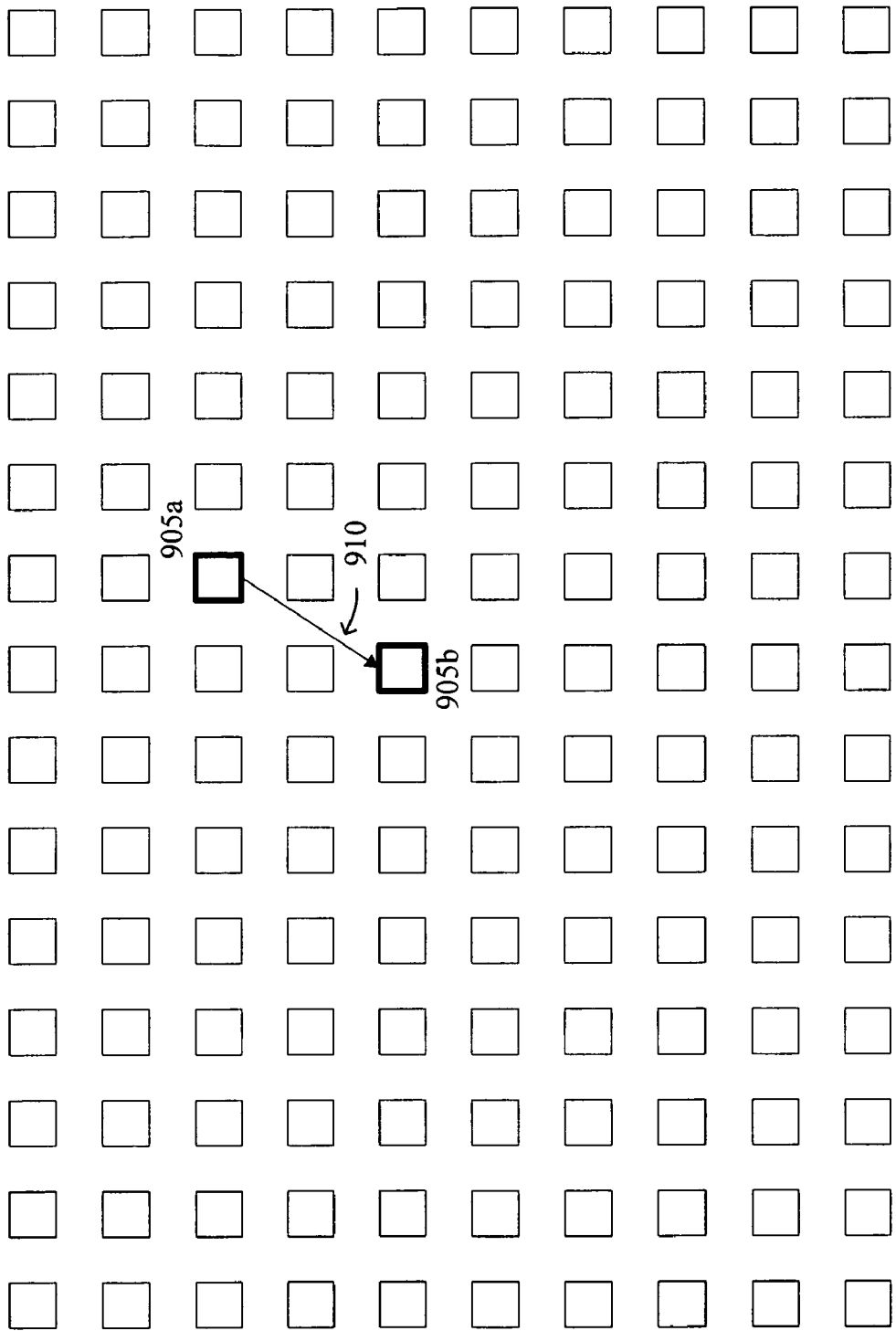
FIG. 9 illustrates an example of a non-neighboring offset connections.

An illustration of an NNOC is found in FIG. 9. In this figure an output of tile 905a is connected to an input of tile 905b. The tile 905b is one column to the left and two rows down from tile 905a, so the NNOC 910 that connects them can be described as an NNOC (1,2). This is the shortest possible NNOC. Any tiles closer to tile 905a are either neighbors or in the same row, or in the same column as tile 905a.

D. Parallel Non-Neighboring Offset Connections

Figure 10:
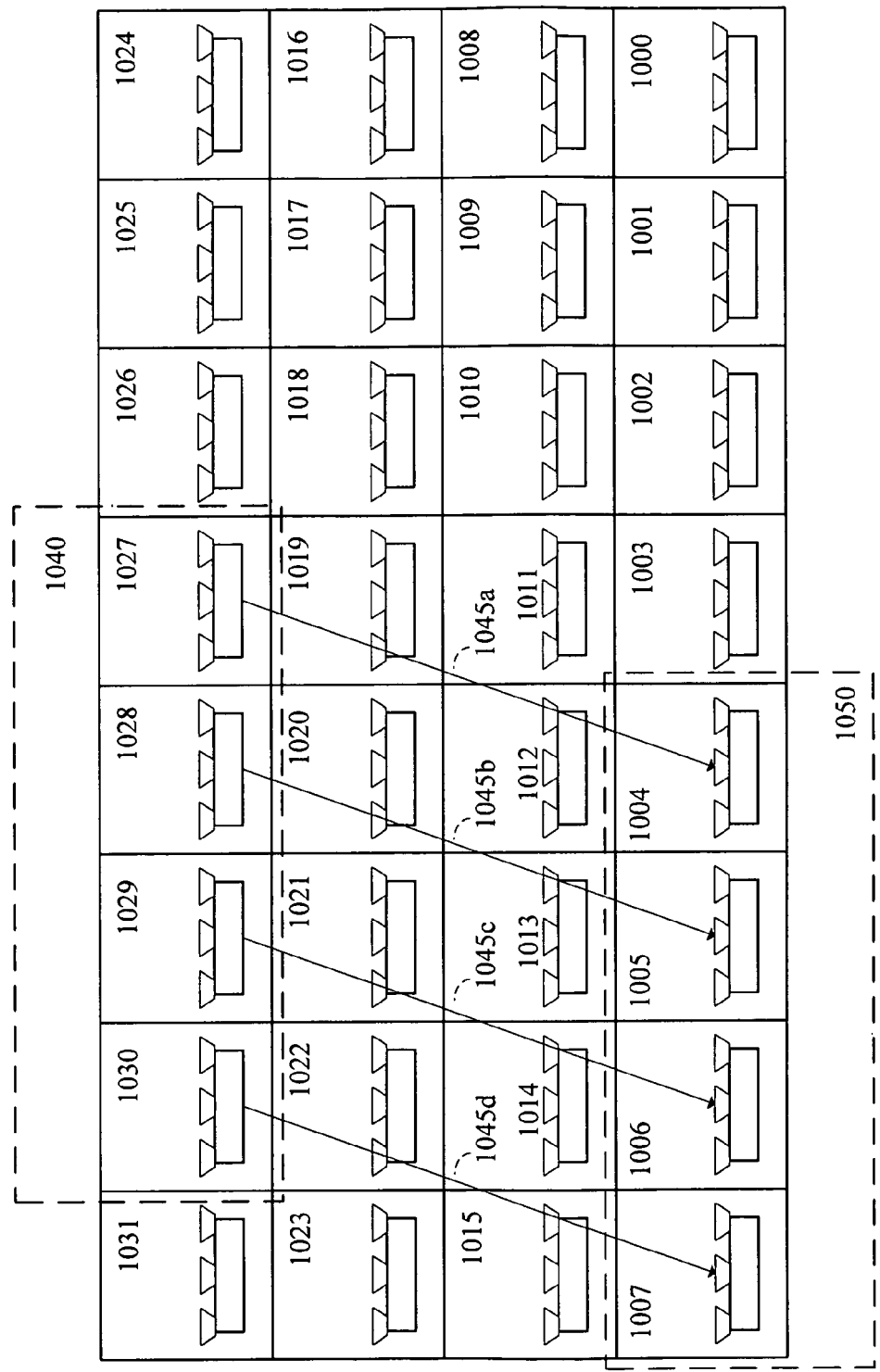
FIG. 10 illustrates an example of a set of parallel non-neighboring offset connections.

Some embodiments include multiple parallel NNOCs. These are NNOCs that connect outputs of a set of successive tiles to inputs of another set of successive tiles. Parallel NNOCs are illustrated in FIG. 10. FIG. 10 shows tiles 1000-1031. The figure also shows that NNOCs 1045a-1045d connect the outputs of the look up tables of tiles 1027-1030, in tile set 1040, to inputs of tiles 1004-1007, in tile set 1050.

Figure 11:
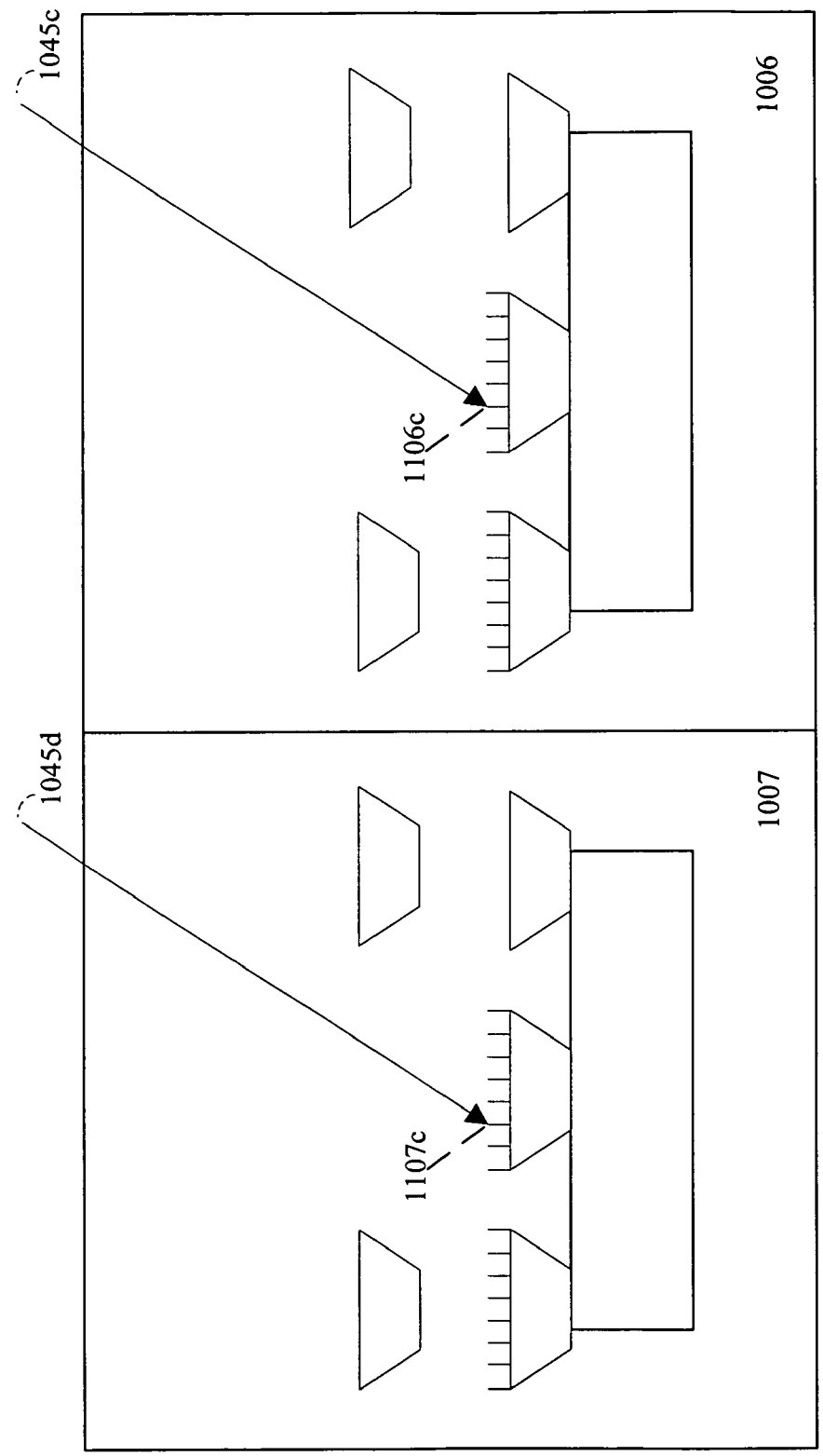
FIG. 11 illustrates a close up of two tiles from the previous figure.

As described above, a tile of a configurable IC often has multiple inputs. In some embodiments, each tile in the configurable IC has inputs that are identical to the inputs of other tiles. In a set of parallel NNOCs, each NNOC connects to an input on its destination tile that corresponds to inputs on the destination tiles of the other NNOCs in that set of parallel NNOCs. FIG. 11 illustrates this by showing a close up of tiles 1006 and 1007. NNOC 1045c connects to input locus 1106c on tile 1006 and NNOC 1045d connects to input locus 1107c on tile 1007. Though not shown, NNOC 1045a and 1045b also connect to the corresponding input loci on their respective destination tiles (not shown).

It will be clear to those skilled in the art that in some embodiments, the correspondence is topological rather than physical. Thus, in some embodiments, the corresponding input may be on a different part of the tile. In such embodiments, correspondence means that the input the NNOC connects to serves an identical function to the inputs other parallel NNOCs connect to, including its logical relationships to the other inputs. The corresponding input is not necessarily physically in the same place on the IC.

E. Data Paths and Data Words

Some embodiments allow for chains of logical operations, one after another. Some such embodiments allow for multiple bit "words" to be used, in which all bits in the word are subject to similar or identical operations. In some embodiments, a tile can only perform logical operations on one bit of that word at a time. So in order to perform an operation on a multi-bit word, multiple tiles must be used. When several operations need to be performed on a multi-bit word, this occupies whole sets of tiles, generally with a width equal to the number of bits in the word, and length equal to the number of operations to be performed (not counting skipped rows or columns in the length or width). Such sets of used tiles can be called a "data path". In some embodiments, data paths can be oriented horizontally or vertically. A horizontal data path is one in which the multi-bit words are oriented horizontally, such that an operation on the word takes place in one row of tiles. A vertically oriented data path is one in which the multi-bit word is oriented vertically, such that an operation on the word takes place in one column of tiles.

1. Data Path Shifting

Figure 12:
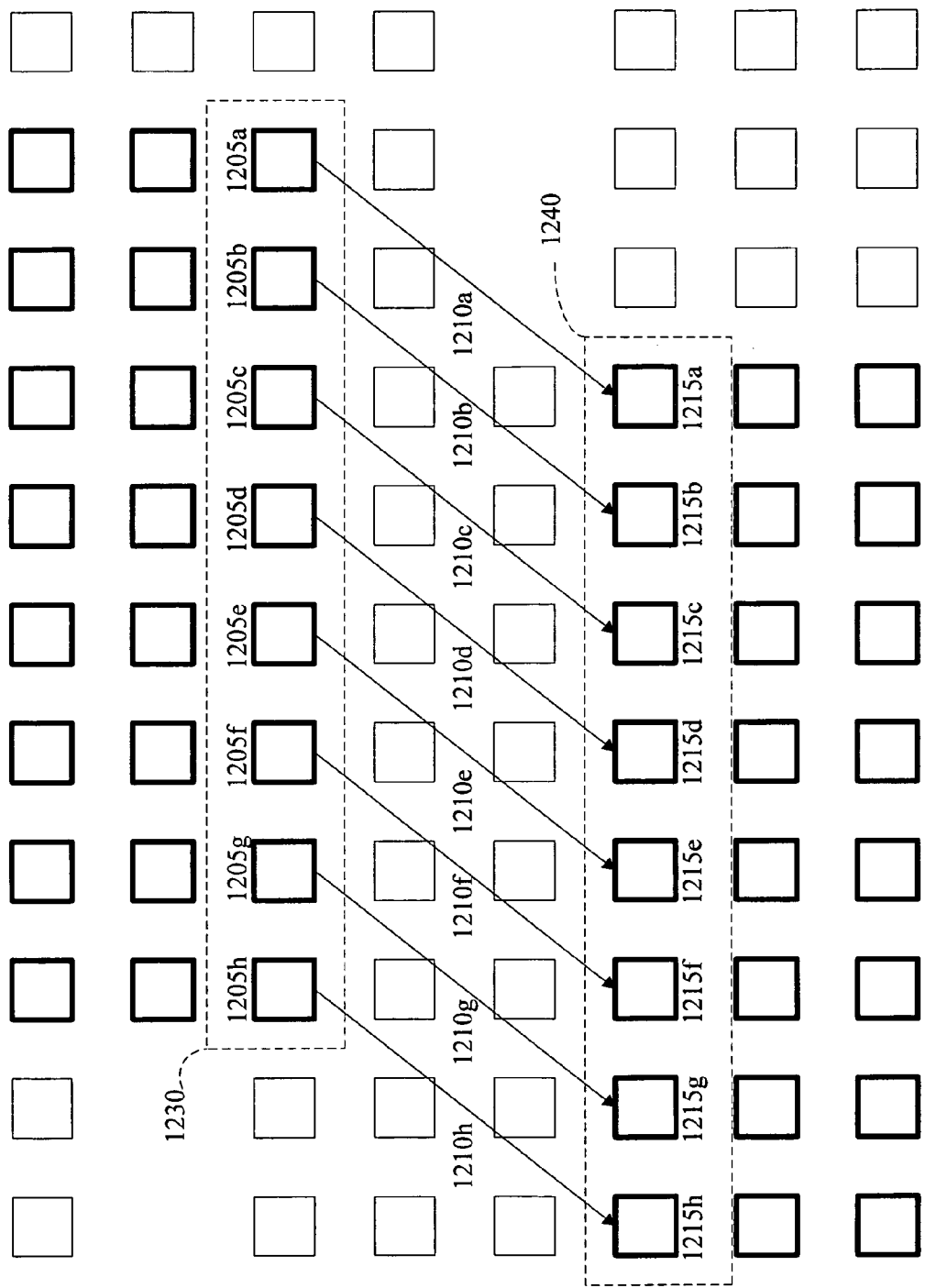
FIG. 12 illustrates an example of data path shifting.

Multiple NNOCs, parallel to each other, can be used to shift later parts of a data path to a different set of columns. An embodiment is illustrated in FIG. 12. Tile set 1230 contains 8 tiles, 1205a-1205h. Tile set 1240 also contains 8 tiles 1215a-1215h. The data path includes the tiles in those tile sets, along with the tiles above tile set 1230 and the tiles below tile set 1240. Connections between the tiles above tile set 1230 and connections between tiles below tile set 1250 go vertically from one row to the next and are not shown, for clarity.

The output of each look up table (not shown) in tile set 1230 is directly connected to an input of an IMUX (not shown) in tile set 1240 through an NNOC (2,3). Tile 1205a is connected to tile 1215a through NNOC (2,3) 1210a. Tile 1205b is connected to tile 1215b through NNOC (2,3) 1210b, and so forth. Each of the parallel NNOCs (2,3) has the effect of moving the data path of one bit two columns to the left. The combined effect of all 8 NNOCs (2,3) is to move the 8-bit data path two columns to the left.

2. Example of Using NNOCs

One example of a specific application accomplished with the use of NNOCs is an adding operation followed by a logical AND operation. In FIG. 12, the tiles 1205a-1205h in tile set 1230 can be configured as an 8-bit adder (inputs not shown), and the tiles 1215a-1215h in tile set 1240 can take the results of that addition, and perform a logical AND operation on each bit along with a separate set of 8 bits from some other source (not shown).

Figure 13:
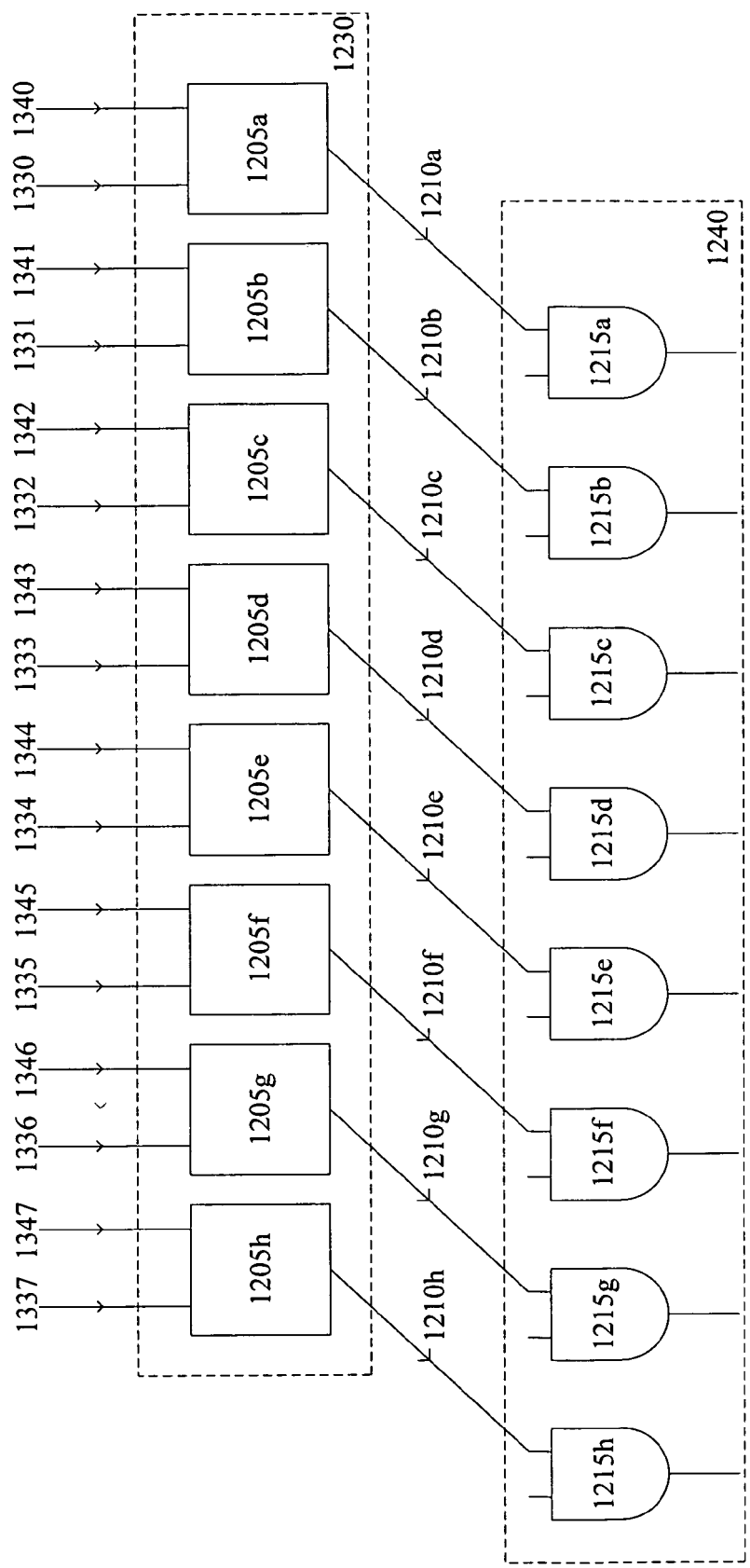
FIG. 13 illustrates a more detailed example of data path shifting.

A more detailed picture of such an arrangement can be found in FIG. 13. Though more detailed, it will be clear to those skilled in the art that details have been omitted for the purpose of clarity, including carry-over logic for the adder and the source of some inputs. The tile set configured as a group of eight 1-bit adders 1230 of FIG. 13 takes inputs of two 8-bit numbers 1330-1337 and 1340-1347. These inputs come in as two sets of eight 1-bit numbers to the individual 1-bit adders 1205a-1205h. The tile set configured as a group of eight 1-bit adders 1230 outputs the sum of the two numbers. The NNOCs 1210a-1210h connect the outputs of the tile set configured as a group of eight 1-bit adders to inputs of the individual AND gates 1215a-1215h in the tile set configured as a group of eight logical AND gates 1240.

Figure 14:
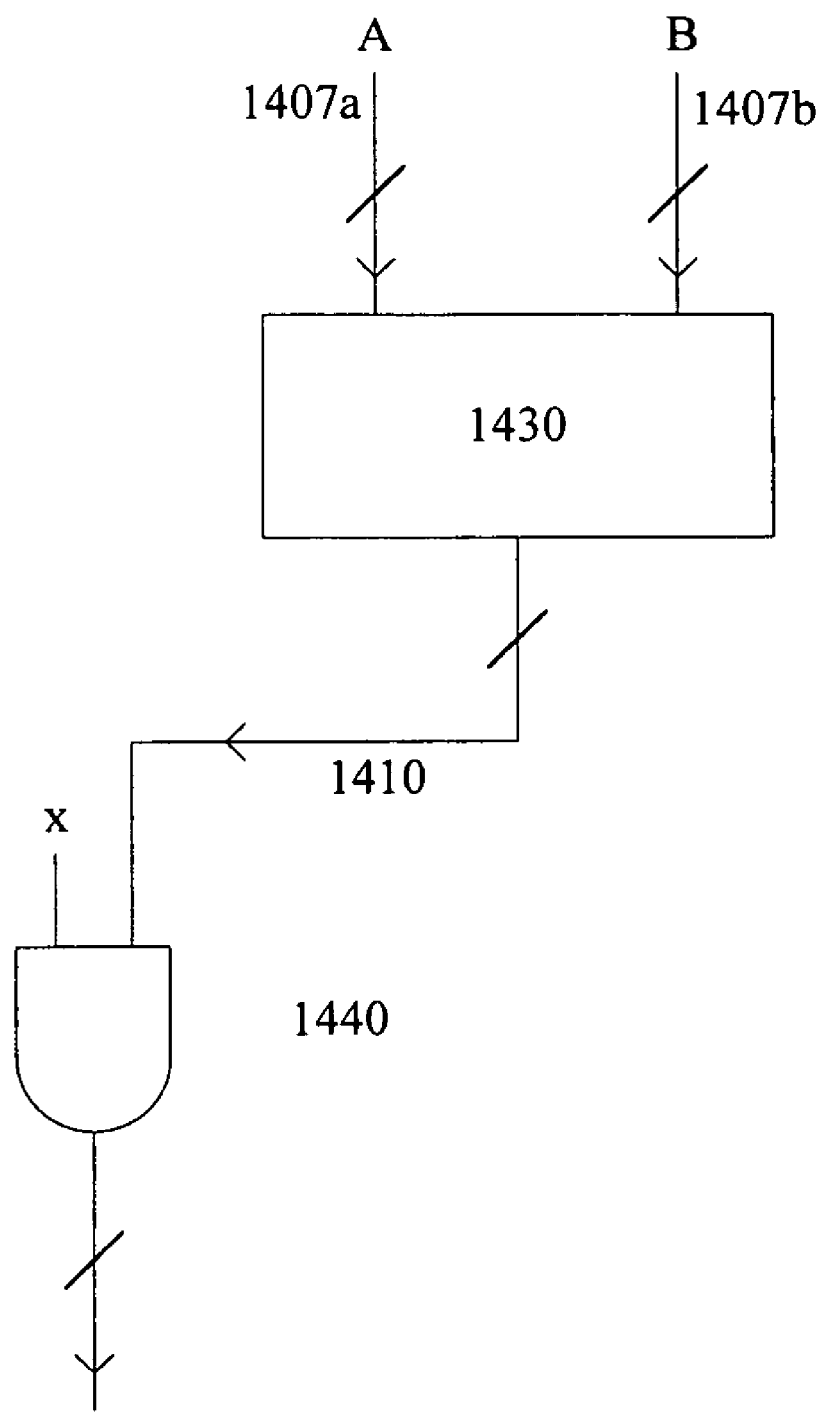
FIG. 14 illustrates the results of the logical operations from the previous figures.

The combined result of the tiles and connections produces the same result as using a single 8-bit adder and eight logical AND-gates. A single 8-bit adder and eight logical and gates are represented in conceptual form in FIG. 14. In this figure, only one logical AND-gate 1440 is shown, but it represents a group of eight logical and gates. Input lines 1407a and 1407b each represent eight input wires going into the 8-bit adder 1430 and connection line 1410 represents the eight parallel NNOCs from the previous figure.

F. Layouts

1. Actual Wire Paths

Figure 15:
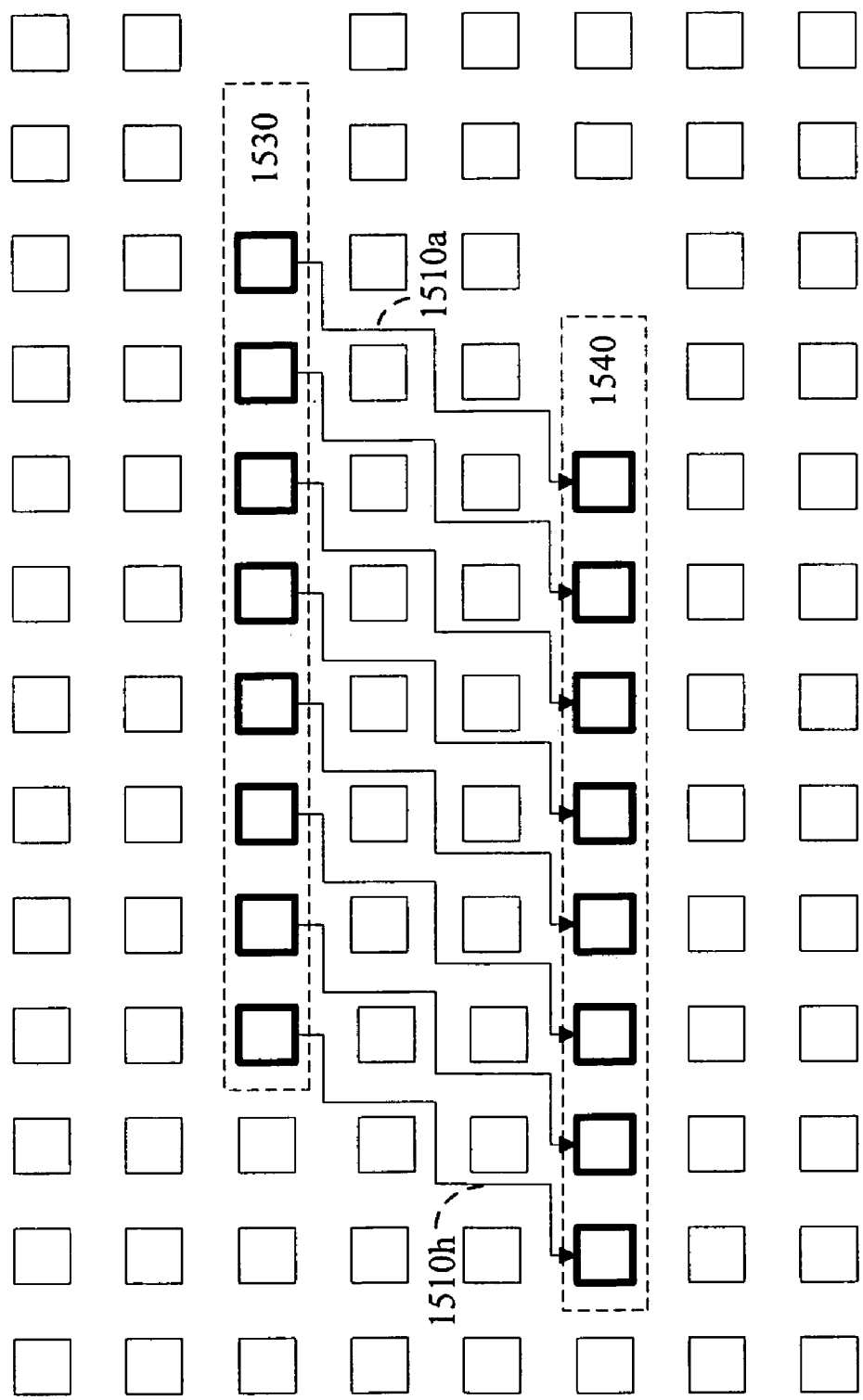
FIG. 15 illustrates an example of actual wire paths for parallel non-neighboring offset connectors where each wire path is identical.
Figure 16:
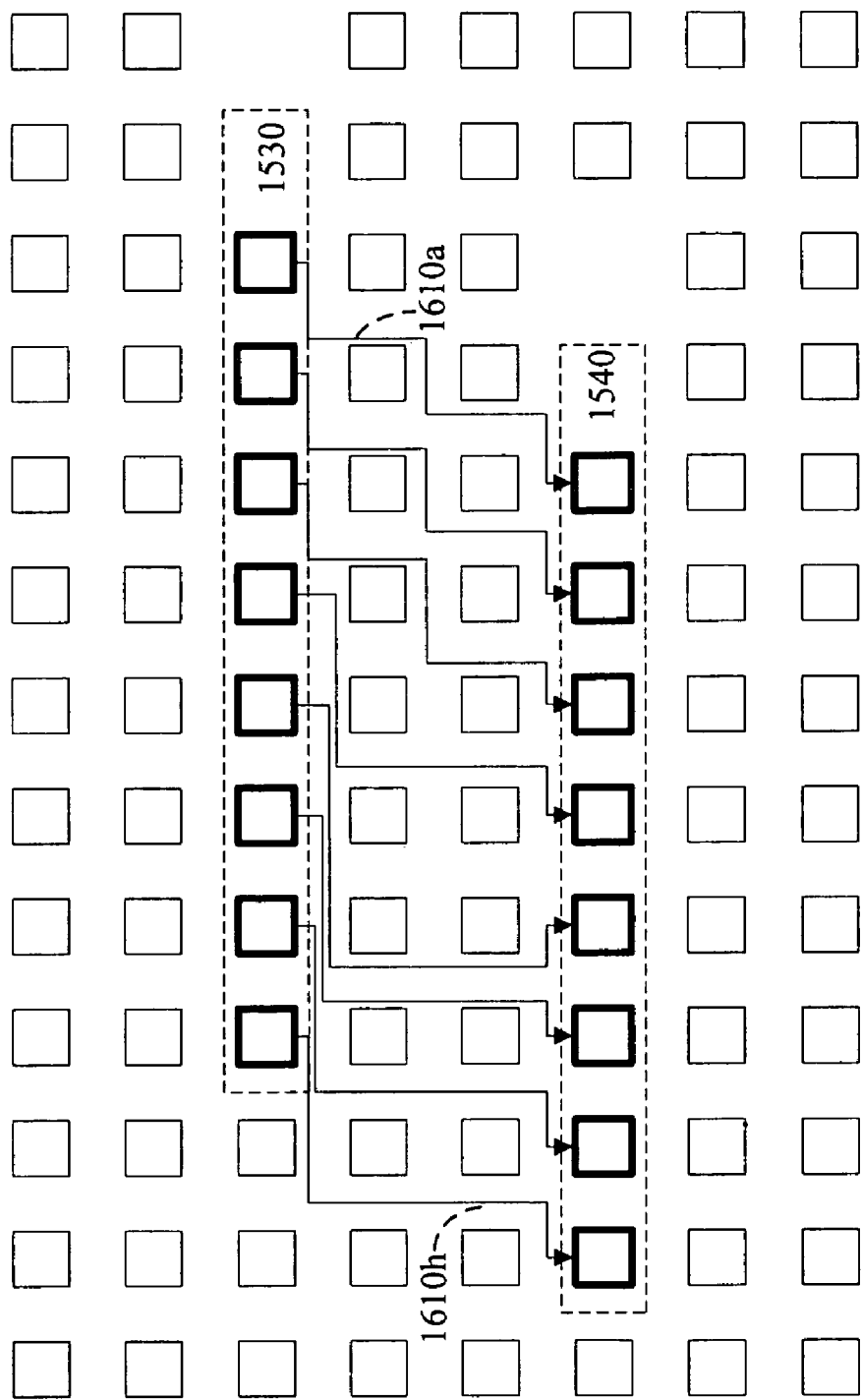
FIG. 16 illustrates an example of actual wire paths for parallel non-neighboring offset connectors where some wire paths are not identical to the other wire paths.

The NNOCs previously shown are topological representations of connections, rather than actual wire paths. In some embodiments, actual wire paths for topologically identical connections are themselves identical, such as those shown in FIG. 15. Here, the tiles in tile set 1530 are connected to the tiles in tile set 1540 by identical wire connections 1510a-1510h. Some other embodiments implement NNOCs with non-identical wiring connections, such as shown in FIG. 16. This figure shows wire connections 1610a-1610h that are not all identical. It will be clear to those skilled in the art that these are merely some examples of actual wiring. Other examples may contain vias, multiple wire layers, buffer circuits, or even diagonal wires, while all still being within the scope of the invention.

2. Topological Sequence of Tiles

Figure 17:
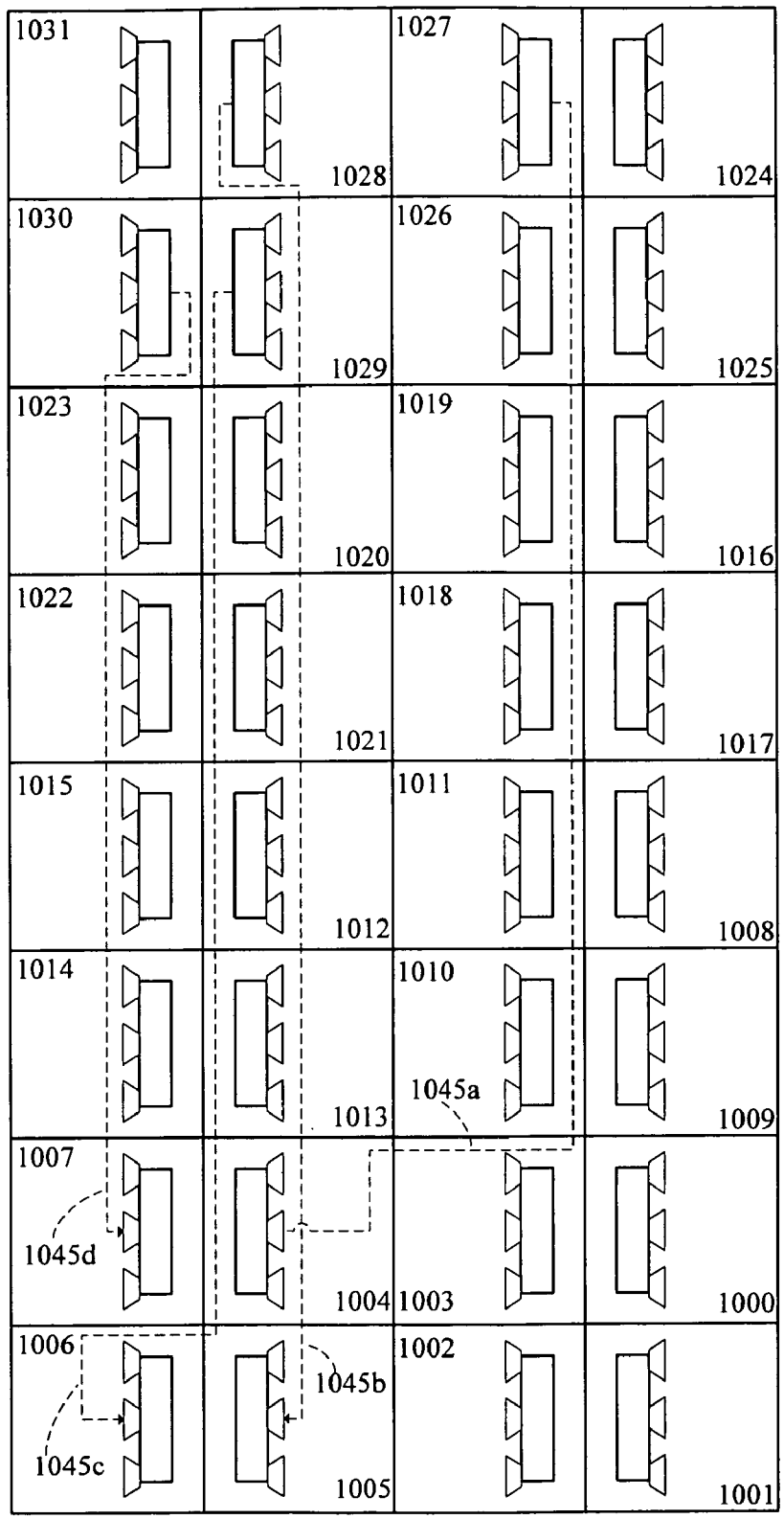
FIG. 17 illustrates a different topological layout of the set of tiles illustrated in FIG. 10.
Figure 18:
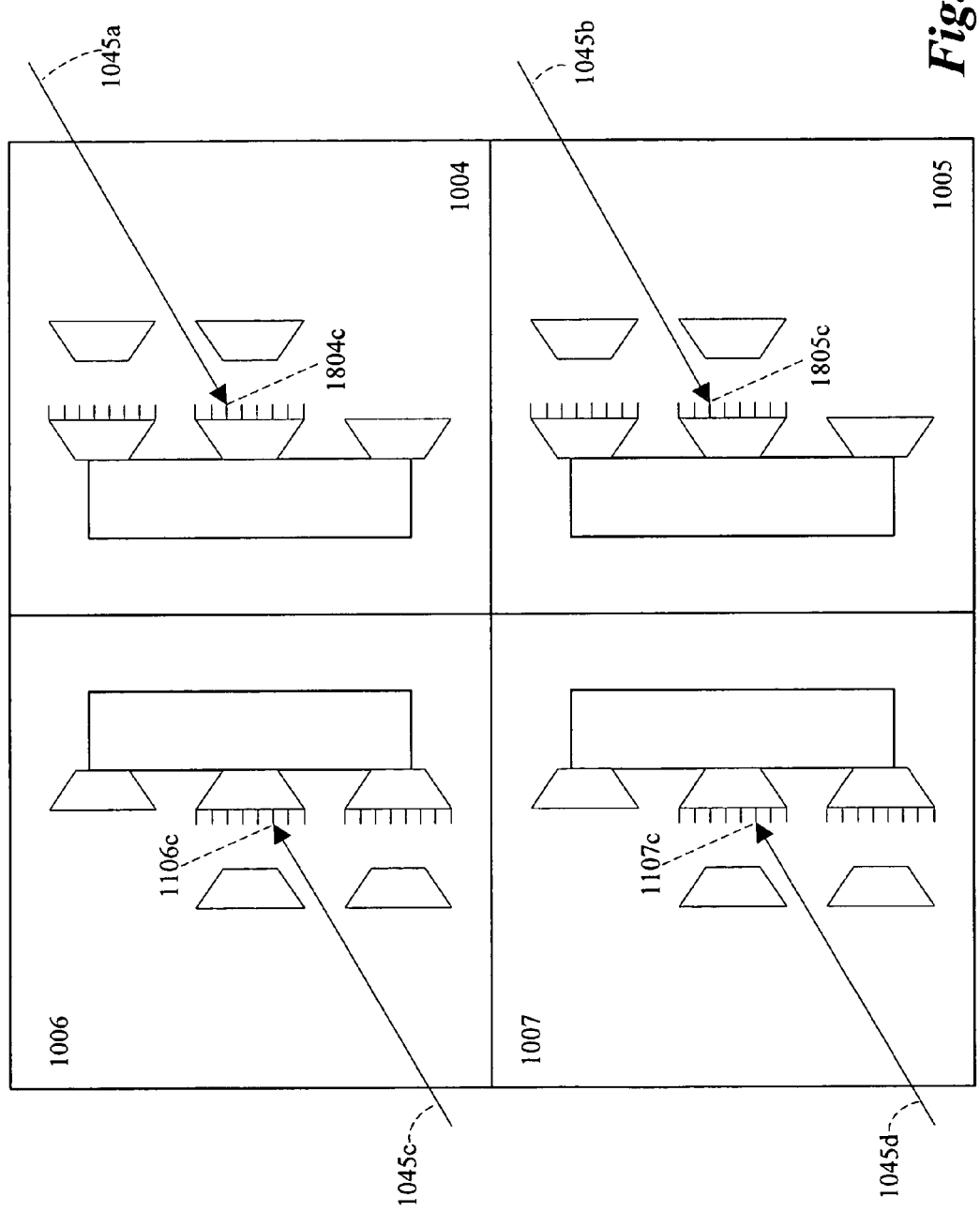
FIG. 18 illustrates a close up of four tiles from the previous figure.

In addition to the illustrated connections being topological, rather than physical paths of wires, the arrangement of successive tiles may also be topological rather than physical. For example, the array shown in FIG. 10 might be a topological representation of a set of tiles whose physical arrangement matches that shown in FIG. 17. In both FIG. 10 and FIG. 17 there are tiles 1000-1031. Each row of eight tiles shown in FIG. 10 is a topological representation of a double row of tiles shown in FIG. 17. Note that the numbering of the tiles is the same in FIG. 10 and FIG. 17. In some embodiments, the tiles in FIG. 17 may have that physical arrangement to make fabrication easier, or to make it easier for sets of four tiles to share resources. In those embodiments, the topological model shown in FIG. 10 may make it easier for a layman to understand the parallelism of the NNOC tile connections. The NNOCs of these embodiments are considered topologically parallel. They are topologically parallel (i.e. shown as parallel in the topological representation) because they connect corresponding outputs on one set of tiles with corresponding inputs on another set of tiles. In some embodiments, the NNOCs shown in FIG. 17 connect to corresponding input loci on their respective tiles. This is illustrated in FIG. 18. This figure shows an enlarged view of tiles 1004-1007. The NNOCs 1045a-1045d all go to the corresponding inputs 1107c, 1106c, 1805c and 1804c on their respective tiles.

G. Variations of NNOCs

Figure 19:
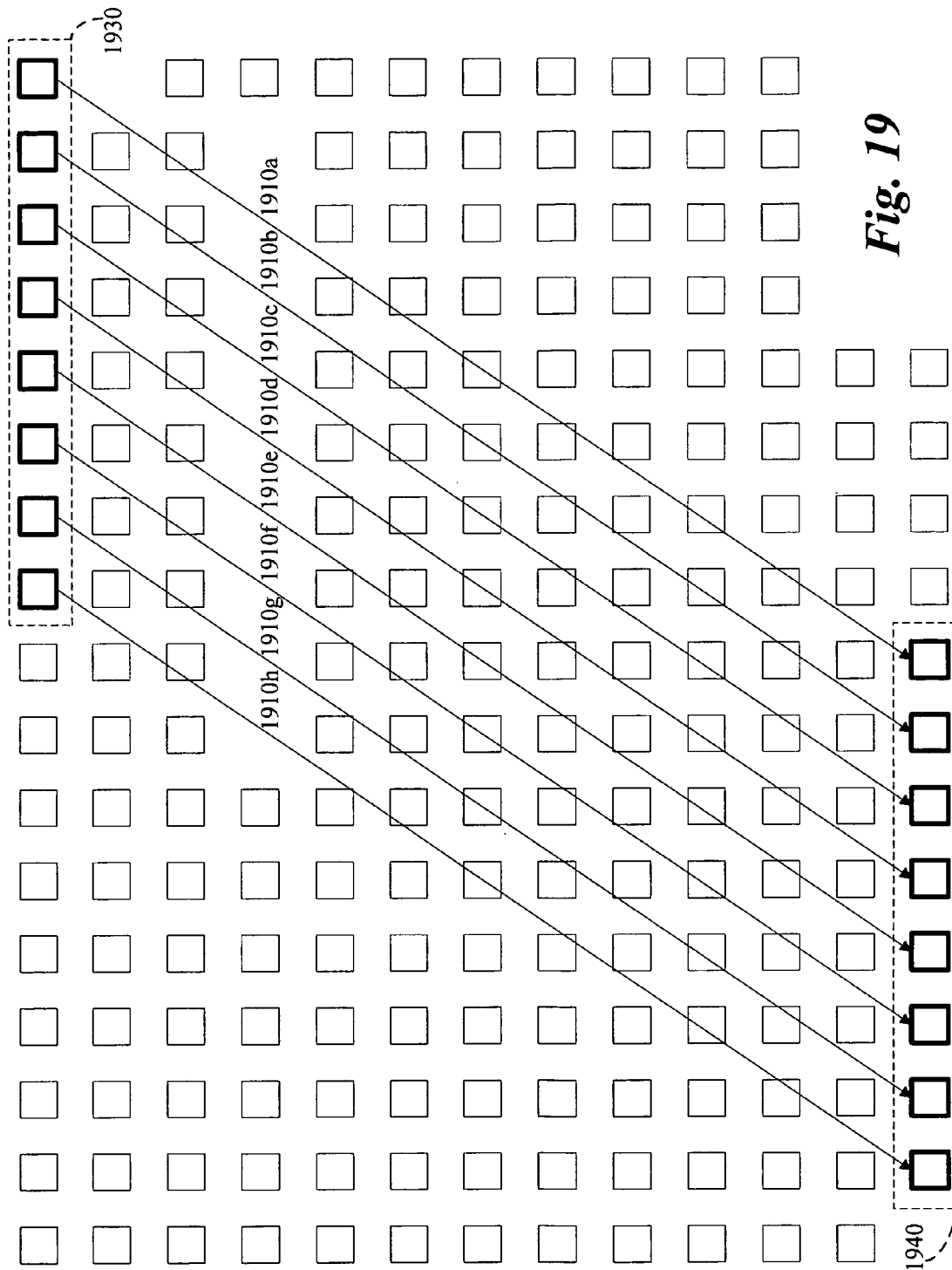
FIG. 19 illustrates an example of longer non-neighboring offset connections shifting a horizontal 8-bit data path by eight bits.

There are several variations on parallel NNOCs illustrated in the following figures. Parallel NNOCs can be long, such as the ones shown in FIG. 19. This figure shows the tiles in tile set 1930 connecting to the tiles in tile set 1940 through NNOCs (8,12) 1910a-1910h. In this figure, the parallel NNOCs shift the data path by as many columns as the length of the word. Those skilled in the art will realize that NNOCs can also shift a data path by more than the length of the word or less than the length of the word.

Figure 20:
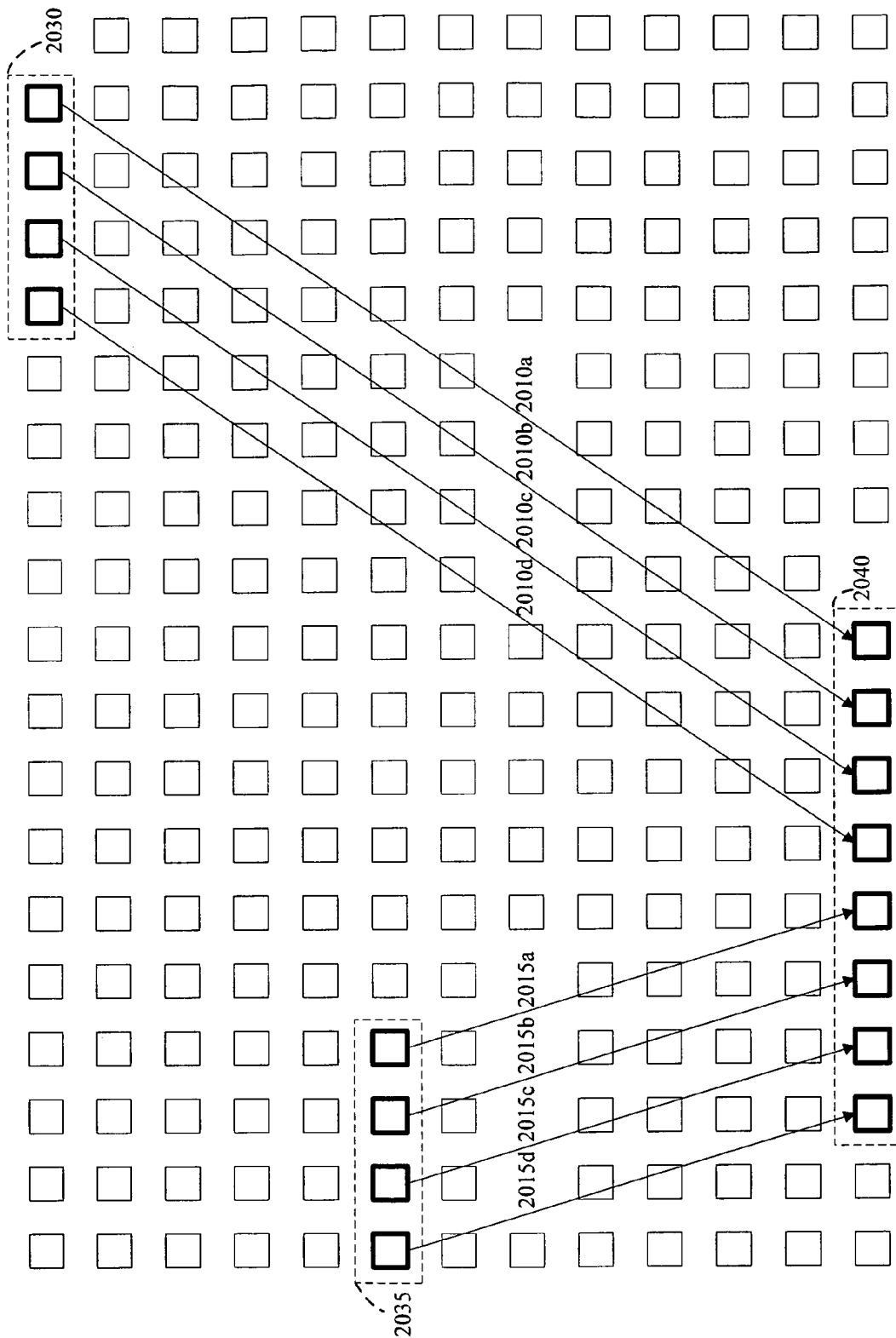
FIG. 20 illustrates two sets of parallel NNOCs starting on different rows ending on the same row.

FIG. 20 shows two sets of parallel NNOCs bringing two 4-bit data paths together into one 8-bit data path. Here, the tiles in tile set 2030 are connected to the tiles in tile set 2040 by NNOCs (8,12) 2010a-2010d and the tiles in tile set 2035 are connected to the tiles in tile set 2040 by NNOCs (−2,7) 2015a-2015d. This figure also shows that multiple sets of parallel NNOCs can exist within one configurable IC. The parallel NNOCs 2015a-2015d and 2010a-2010d are the same within each set, but the NNOCs in one set are not necessarily the same as the NNOCs of another set.

Figure 21:
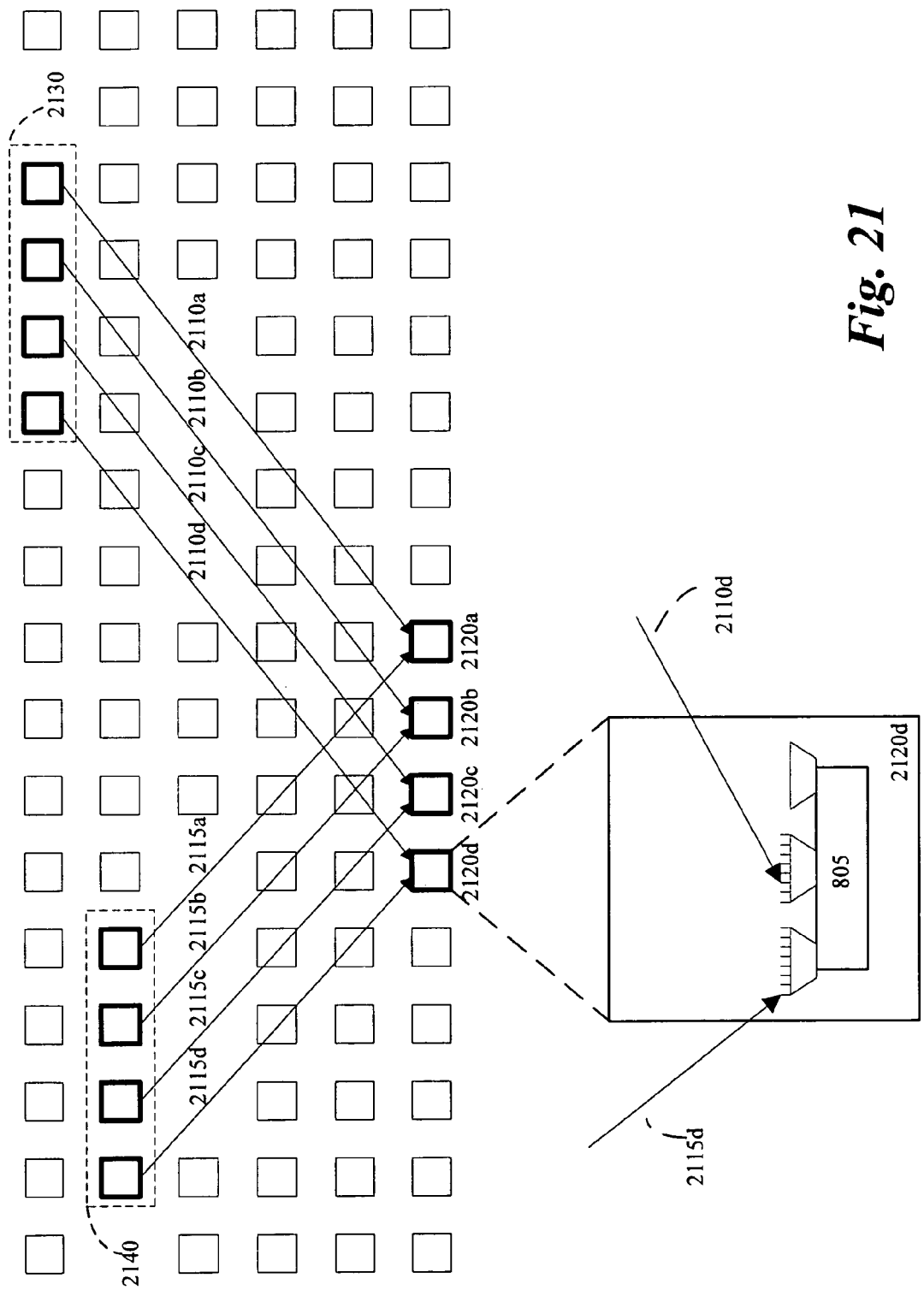
FIG. 21 illustrates two sets of parallel NNOCs with each set ending on different a input locus of the same tile set.

FIG. 21 shows multiple sets of parallel NNOCs connecting to different inputs on the same set of tiles. The tiles in tile set 2130 are connected to one set of inputs of the tiles 2120a-2120d by NNOCs (5,6) 2110a-2110d. The tiles in tile set 2140 are connected to a second set of inputs of the tiles 2120a-2120d by NNOCs (−4,4) 2115a-2115d. The figure also shows an expanded view of tile 2120d. This expanded view shows NNOC (5,6) 2110d connecting to one input and NNOC (−4,4) 2115d connecting to a second input. This wiring arrangement could be used, for example, to implement a 4-bit adder. The 4-bit adder would include the look-up table 805, and the look-up tables (not shown) in tiles 2120b-2120d configured as 1-bit adders, and additional circuitry (not shown) used to accommodate carried values. Accordingly, with the appropriate pairs of inputs on each tile selected, this wiring arrangement would allow two 4-bit words to be added to each other, one 4-bit word from tile set 2130 and another from tile set 2140.

Figure 22:
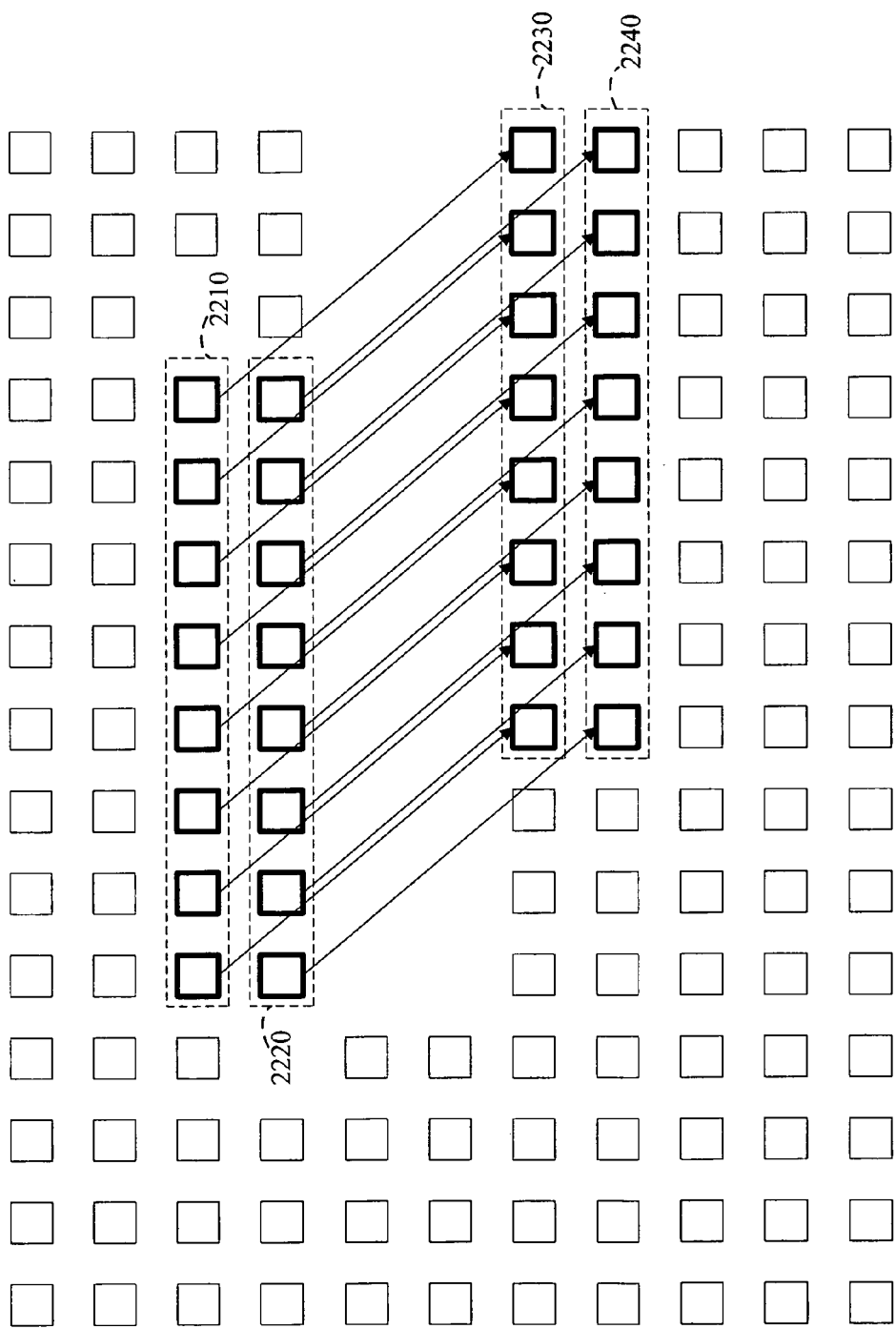
FIG. 22 illustrates two successive rows of tiles with a set of NNOCs connecting them to two other successive rows of tiles.
Figure 23:
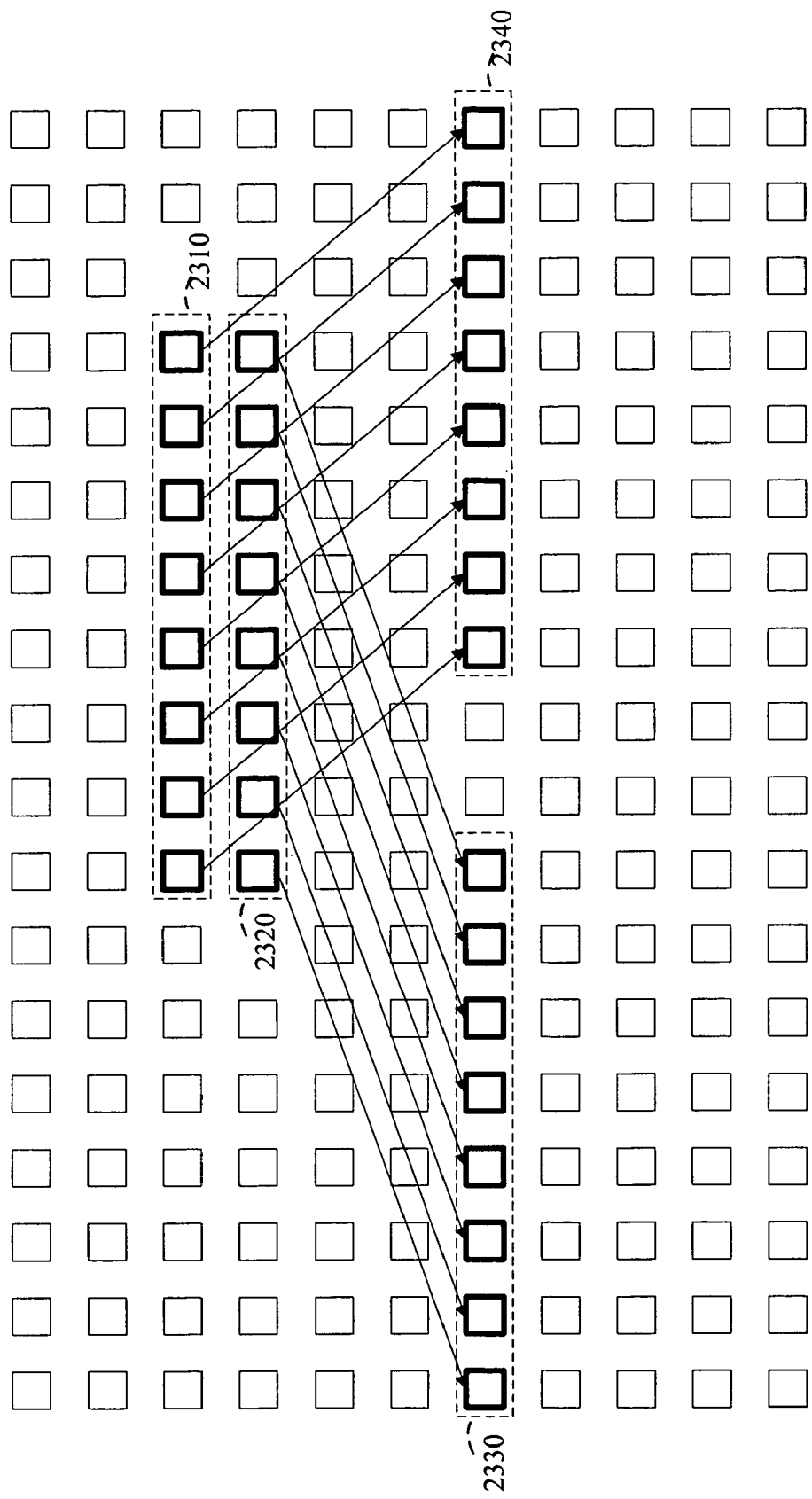
FIG. 23 illustrates two successive rows of tiles with two sets of NNOCs connecting them to another rows of tiles.

FIG. 22 illustrates an embodiment in which successive rows of tiles 2210 and 2220 have a set of parallel NNOCs that lead to successive rows of tiles 2230 and 2240. In some embodiments, this arrangement of parallel NNOCs is repeated for several rows. Some other embodiments repeat this type of arrangement of parallel NNOCs over substantially the entire configurable IC. Successive rows of tiles can also have multiple sets of parallel NNOCs. FIG. 23 illustrates an embodiment with successive rows of tiles 2310 and 2320 with sets of parallel NNOCs that lead to different sets of tiles 2330 and 2340.

Figure 24:
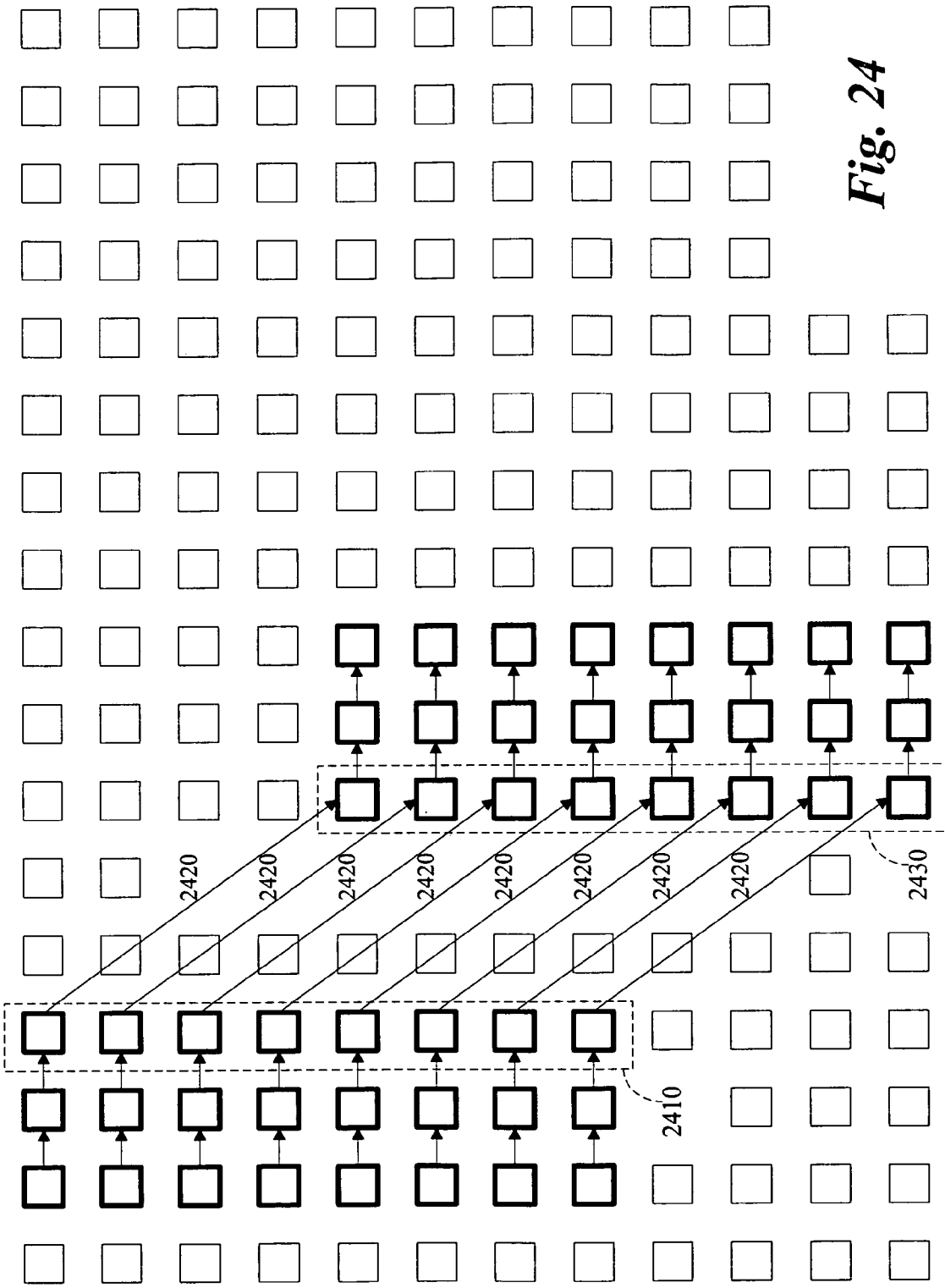
FIG. 24 illustrates parallel NNOCs shifting a vertical data path.

When tiles in several successive rows have parallel NNOCs, a word in the data path can be oriented and shifted vertically. FIG. 24 illustrates this, as the 8-bit wide data path is oriented vertically, and the tiles in tile set 2410 have NNOCs 2420 connecting them to the tiles in tile set 2430. The NNOCs shift the data path four tiles downward.

Figure 25:
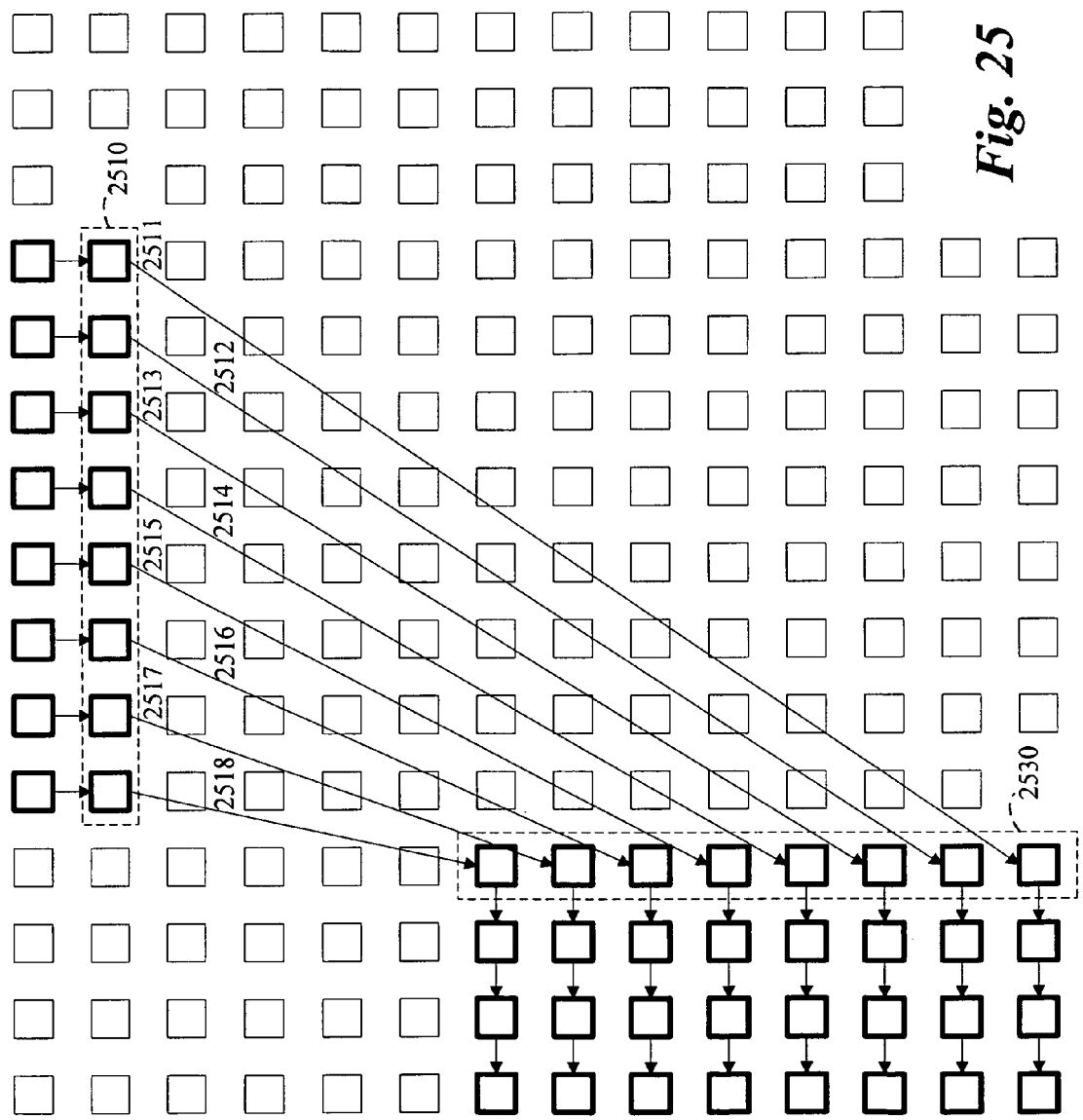
FIG. 25 illustrates non-parallel NNOCs re-orienting a data path from horizontal to vertical.

Some embodiments allow for both vertically and horizontally oriented data paths. Some embodiments use non-parallel connections to re-orient data paths from horizontal orientation to vertical orientation. FIG. 25 illustrates an example of non-parallel offset connections that can be used to re-orient a data path from a horizontal orientation to a vertical orientation. In this figure, the data path is oriented horizontally when it enters tile set 2510. The data path connects through non-parallel NNOCs 2511-2518 to the tiles in tile set 2530, and in the process, the data path is re-oriented to a vertical orientation, which it maintains as it leaves tile set 2530.

Figure 26:
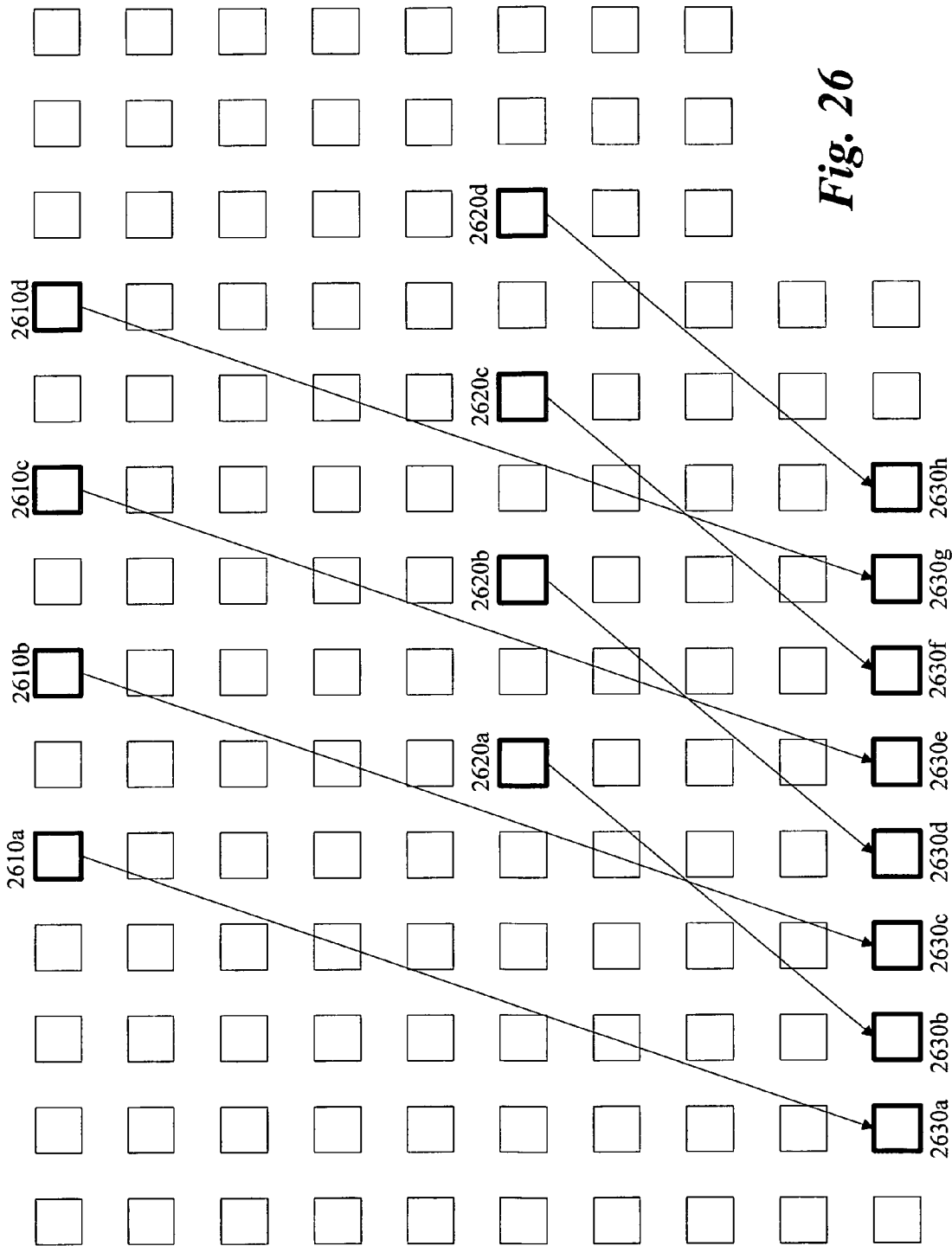
FIG. 26 illustrates two sets of parallel NNOCs interlacing data from different sets of tiles.

Some embodiments allow a word to be constructed from every other bit of two other words, with alternating bits. FIG. 26 shows how parallel NNOCs can be used to interlace data from different rows. In this figure, tiles 2610a, 2610b, 2610c, and 2610d, connect to tiles 2630a, 2630c, 2630e, and 2630g respectively. Tiles 2620a, 2620b, 2620c, and 2620d connect to tiles 2630b, 2630d, 2630f, and 2630h respectively. The net result of these connections is to interlace the bits from tiles 2610a-d and 2620a-d.

Figure 27:
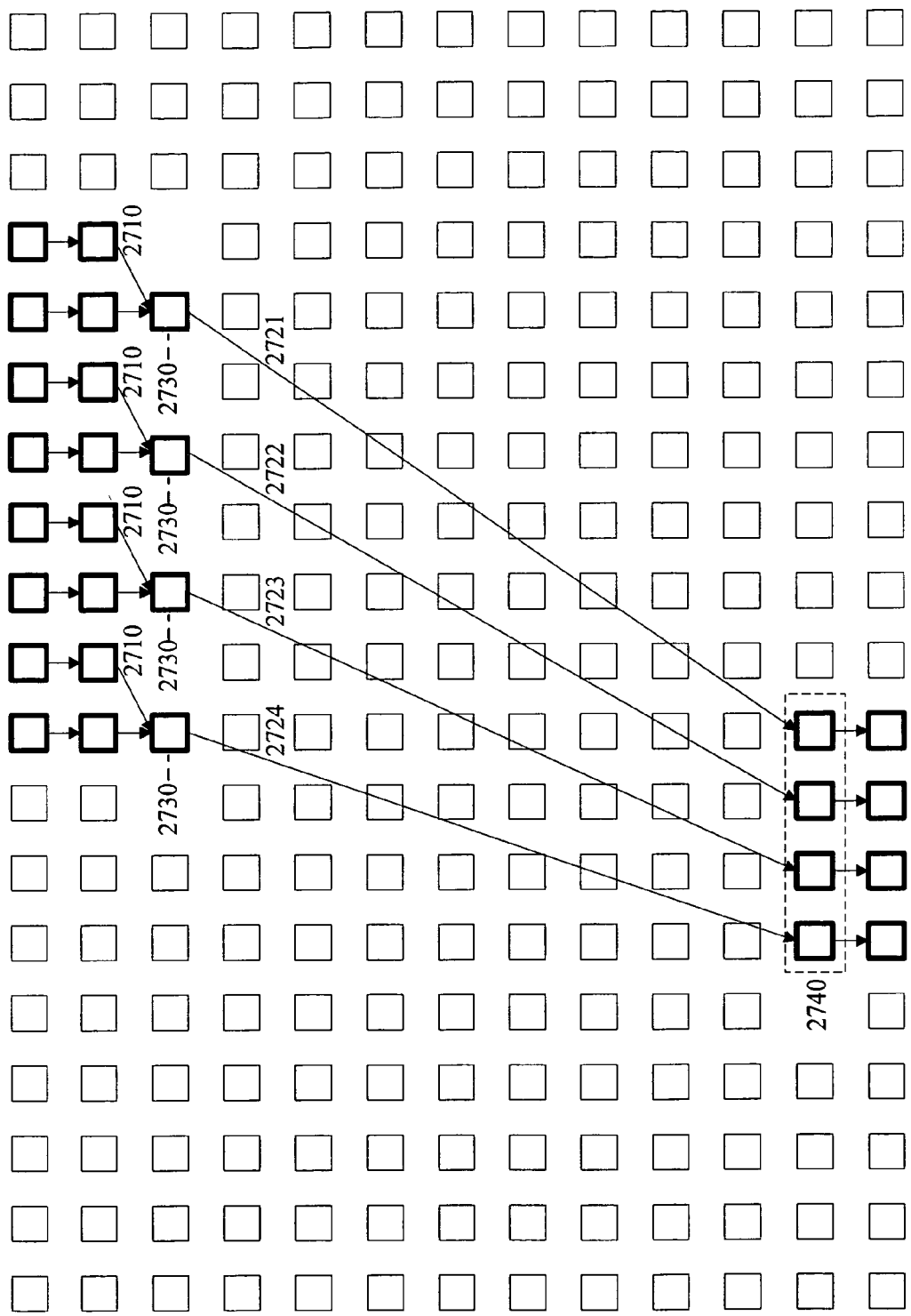
FIG. 27 illustrates direct connections, parallel offset connections and non-parallel NNOCs consolidating an 8-bit data path into a 4-bit data path.

Some embodiments allow parallel offsets that bring together successive bits of a word, in operations such as adding, or other operations that have two input bits and one output bit. FIG. 27 shows how parallel offset connections 2710 can be used to combine successive bits in a data word in such operations. The figure also shows how non-parallel NNOCs 2721-2724 bring data from tiles 2730 together in tile set 2740, completing a change from an 8-bit data path to a 4-bit data path.

Figure 28:
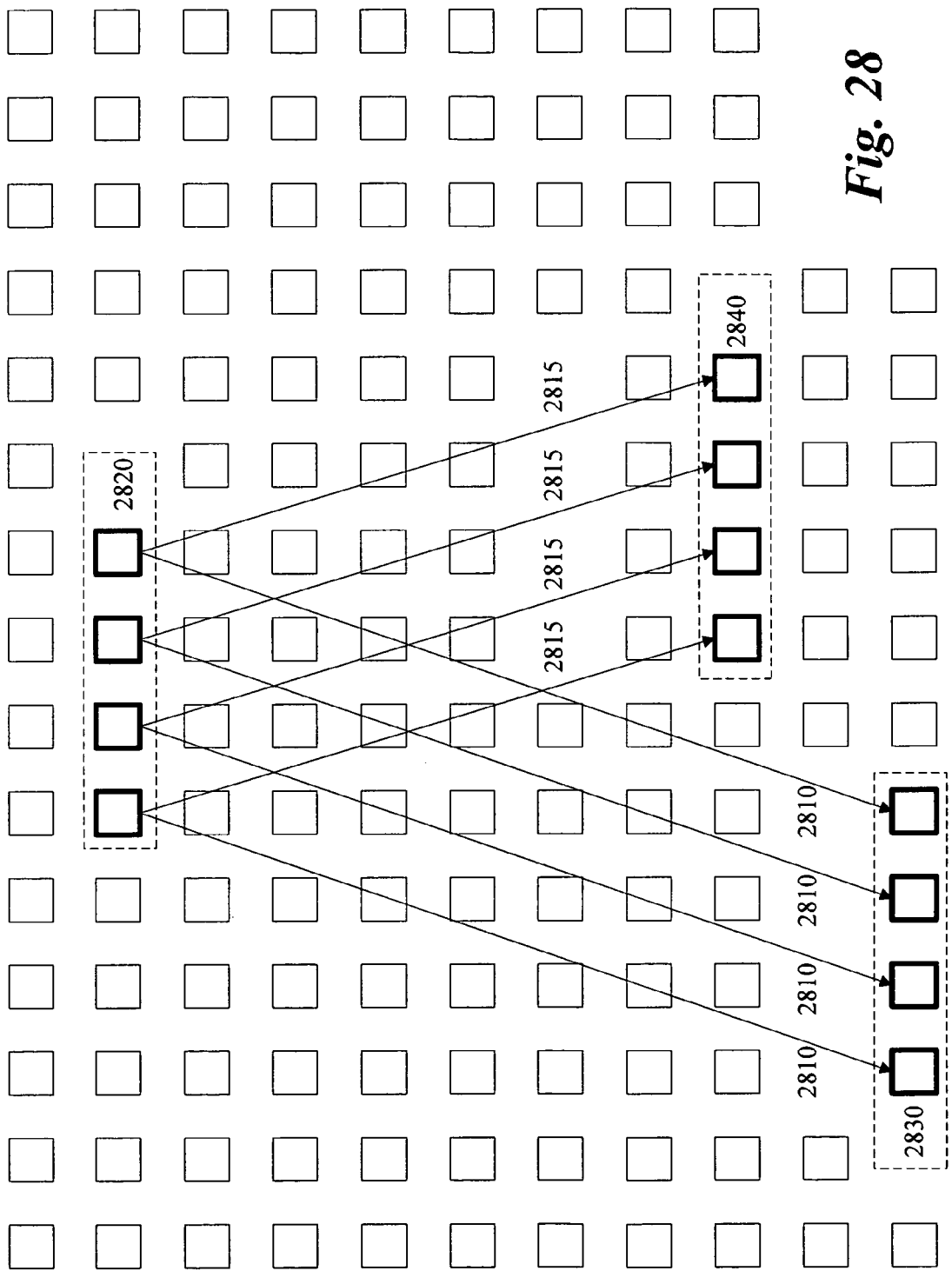
FIG. 28 illustrates a set of four tiles with two sets of NNOCs coming out of it and going to two other sets of four tiles.

Some embodiments allow multiple direct connections to leave one tile. FIG. 28 illustrates that multiple sets of parallel NNOCs 2810 and 2815 can leave one set of tiles 2820 for multiple other sets of tiles 2830 and 2840. In some embodiments, multiple NNOCs fan out from a single output to inputs on several other tiles. In some embodiments, multiple NNOCs come from multiple outputs on a single tiles and terminate on inputs of multiple tiles.

Figure 29:
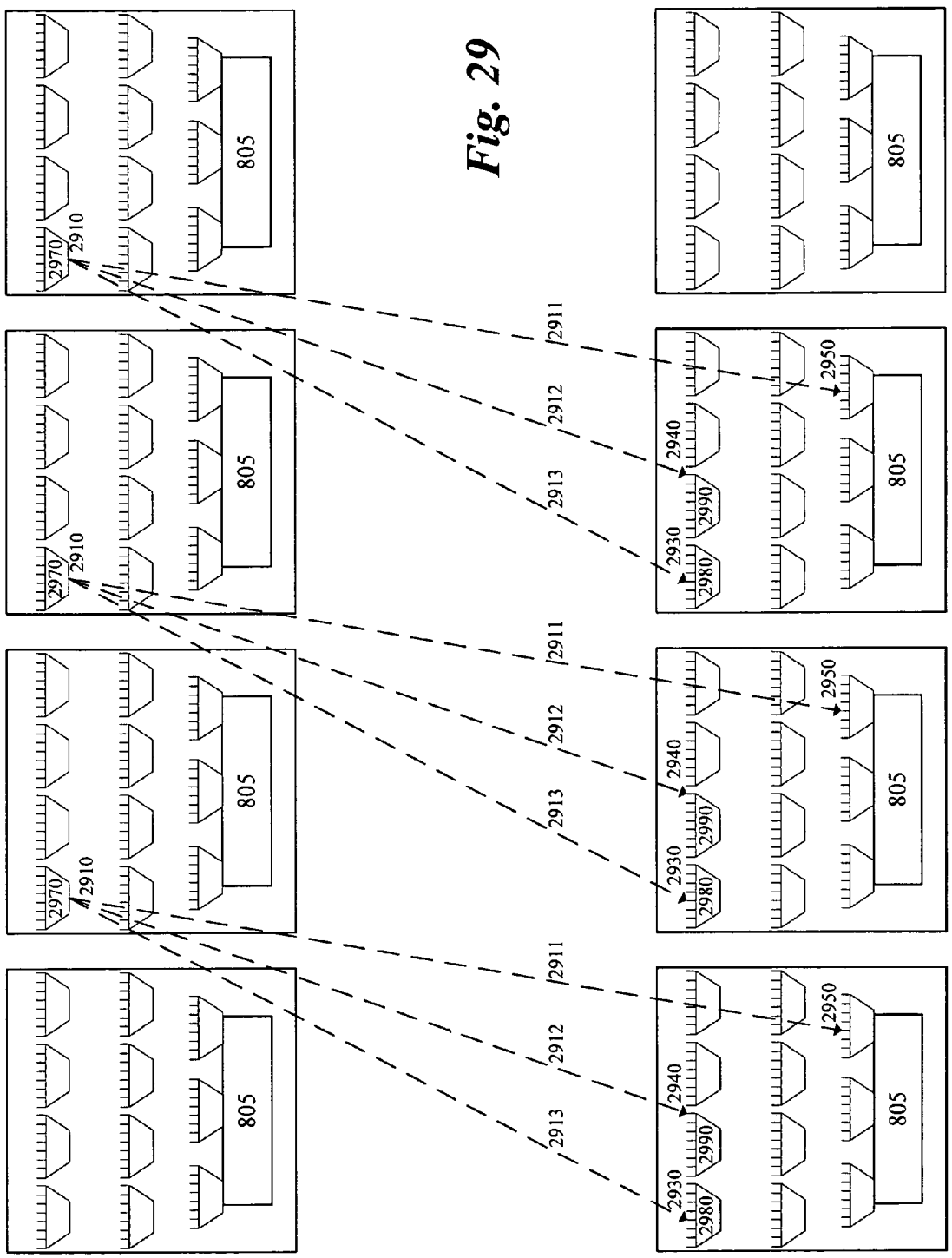
FIG. 29 illustrates multiple sets of NNOCs going from one output locus on a tile set to multiple input loci on another tile set.

Some embodiments use multiple sets of parallel NNOCs that go from one or more output loci on a set of tiles to more than one input loci on another tile. FIG. 29 illustrates multiple sets of parallel NNOCs 2911, 2912, and 2913 going from one output loci 2910 of a set of tiles to multiple input loci 2930, 2940, and 2950 of another set of tiles. This figure demonstrates that direct connections can start from RMUXs, such as RMUXs 2970 rather than simply being limited to starting from LUTs 850. The figure also demonstrates that direct connections can terminate at inputs to RMUXs, such as RMUXs 2980 and 2990. Taken together, these features allow data to enter and leave a tile using only RMUXs, without passing through the LUT at all, as will be further illustrated in FIG. 44, below.

Figure 30:
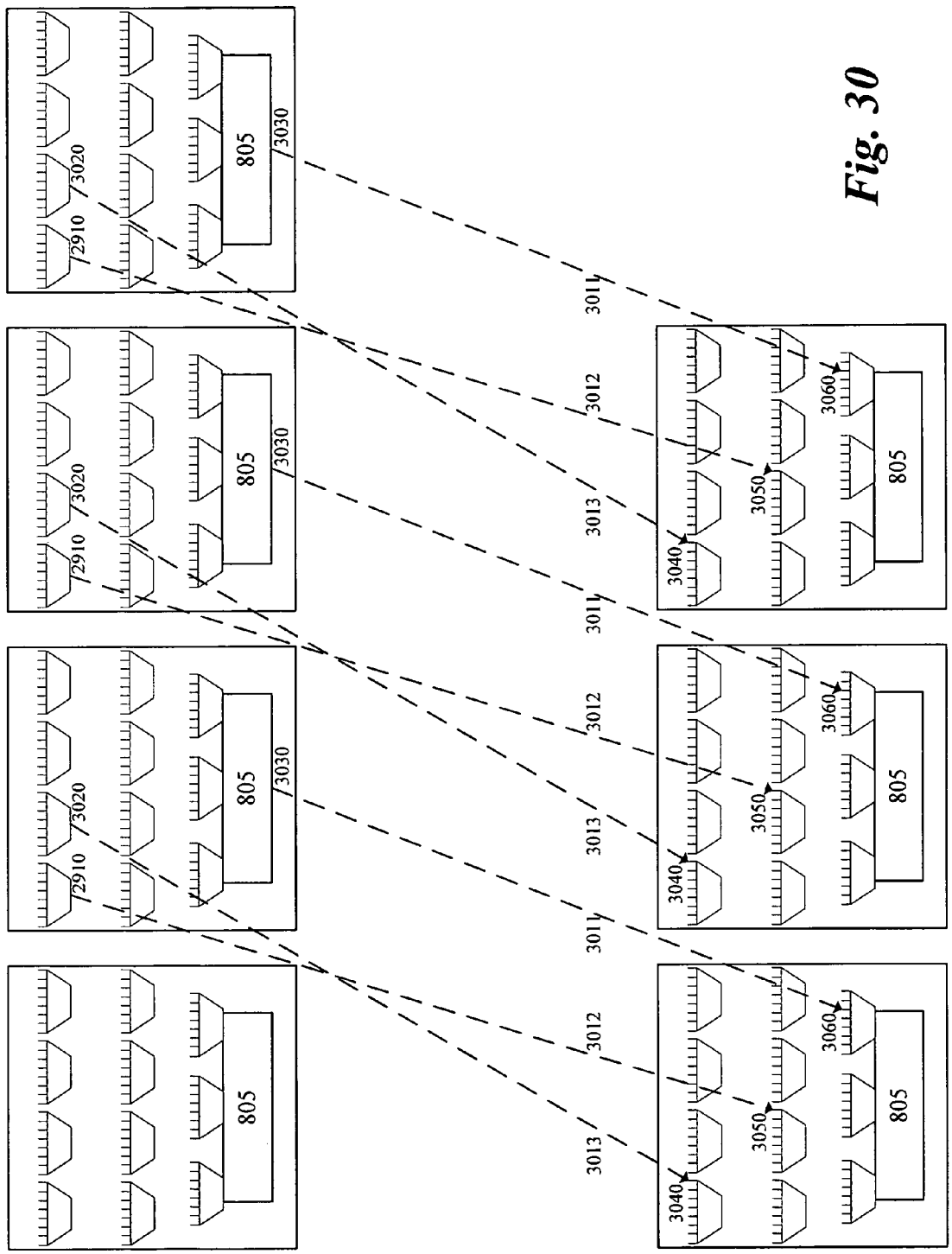
FIG. 30 illustrates multiple sets of NNOCs going from multiple output loci on a tile set to multiple input loci on another tile set.

FIG. 30 shows multiple sets of parallel NNOCs 3011, 3012, and 3013 going from multiple output loci 2910, 3020, and 3030 of a set of tiles to multiple input loci 3040, 3050, and 3060 of another set of tiles. It will be clear to one of ordinary skill in the art that multiple NNOCs from one tile to another can be present in the same embodiment as other direct connections to or from the same tiles, whether NNOCs or other types of connections.

H. Parallel Intra-Tile Connections

Some embodiments include intra-tile connections, for example, a connection from the output of an RMUX to one of the inputs of an IMUX in the same tile or to another RMUX in the same tile. Such parallel intra-tile connections are illustrated in FIG. 31. In this figure, parallel connections 3115 connect RMUXs 3120 to inputs of IMUXs 3130. Parallel connections 3145 connect RMUXs 3150 to inputs of IMUXs 3160. In some embodiments, where multiple parallel NNOCs from other chips provide inputs to RMUXs 3120 or 3150, parallel connections 3115 and 3145 (respectively) may provide a step of the data path on its way from one set of tiles to another.

I. Four-Input Multiplexer

Figure 32:
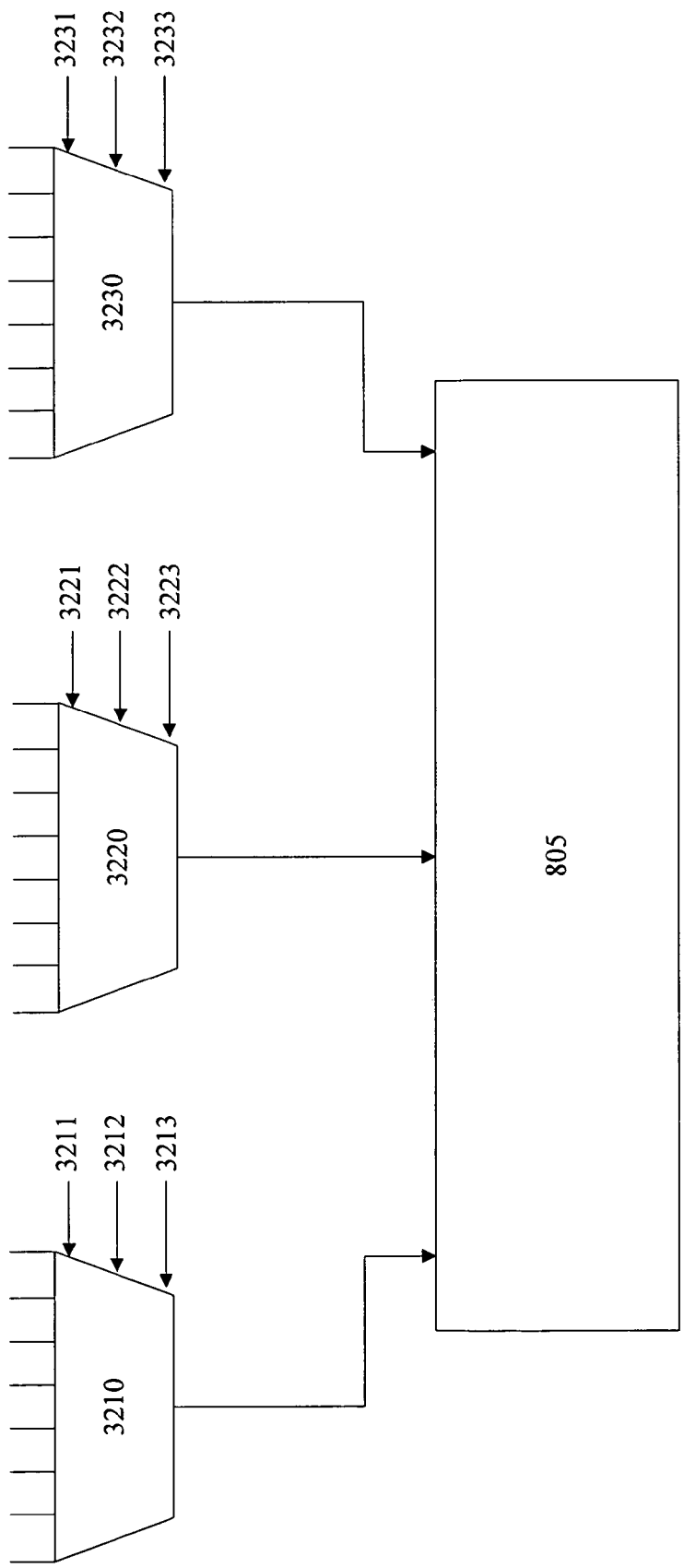
FIG. 32 illustrates an example of a logic circuit with three input multiplexers.

Some embodiments include tiles that can be configured in the user design as four input multiplexers. An example of such embodiments is illustrated in FIG. 32. FIG. 32 illustrates part of a tile; the illustrated part includes a LUT 805 and three IMUXs 3210, 3220 and 3230. The IMUXs 3210, 3220 and 3230 each have eight inputs. IMUXs 3210, 3220, and 3230 each require three selection bits, 3211-3213, 3221-3223, and 3231-3233 (respectively) to select which of the eight inputs will be active. Selection bits 3211, 3212, 3221, 3222, and 3231-3233 for IMUXs 3210, 3220 and 3230 are provided by configuration data. Selection bits 3213 and 3223 are provided by user signals.

The two selection bits 3211-3212 provided by the configuration data for IMUX 3210 narrow down the set of potential active inputs of that IMUX from eight inputs to two inputs. The third selection bit 3213 is provided by a user signal. This selection bit 3213 determines which of the two remaining inputs is the active one. From the perspective of the user, the eight-input IMUX 3210 acts as a two-input multiplexer controlled by the user signal. IMUX 3220 and its inputs are set up in a similar fashion.

The three selection bits for IMUX 3230 select one input. The bit coming in on that selected input is provided by a user signal, effectively turning IMUX 3230 into a pass-through for a bit provided by the user signal. The effective components defined by this configuration are illustrated in FIG. 33.

Figure 33:
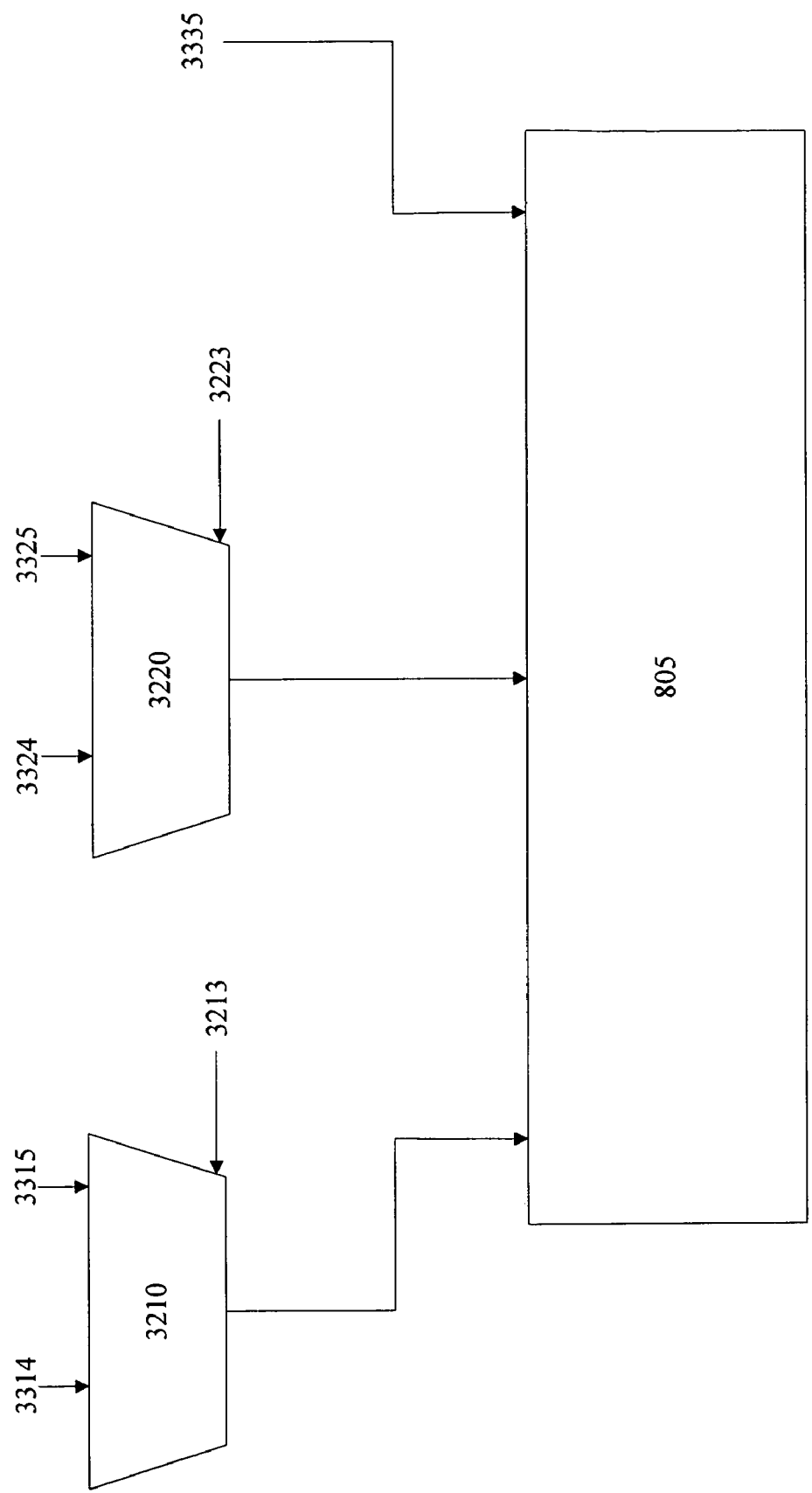
FIG. 33 illustrates a user design implemented with the logic circuit and multiplexers of the previous figure.

In FIG. 33 the IMUX 3210 operates as a two-input multiplexer, with selection bit 3213 selecting between inputs 3314 and 3315. Similarly, IMUX 3220 operates as a two-input multiplexer, with selection bit 3223 selecting between inputs 3324 and 3325. The input 3335, which was selected by selection inputs 3231-3233 is passed through directly to the LUT 805.

Figure 34:
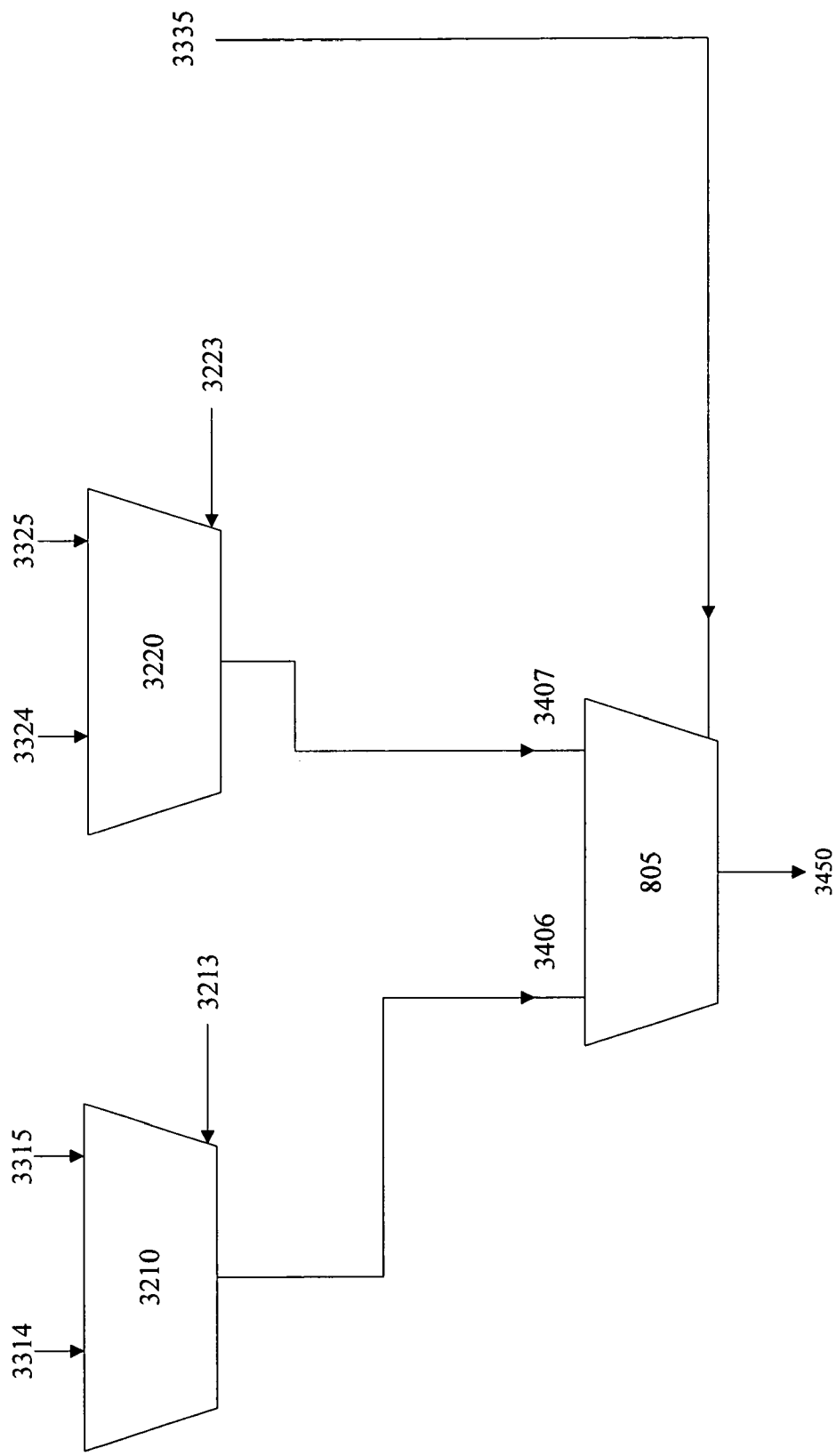
FIG. 34 illustrates a more detailed user design implemented with the logic circuit and multiplexers of the previous figure.

The LUT 805 can also be configured as a two-input multiplexer. FIG. 34 illustrates a conceptual diagram of the circuit when the LUT 805 is configured as a two-input multiplexer, with the third input 3335 acting as the selection bit. The LUT 805 remains physically a LUT but acts as a two input multiplexer. The values for the table of the LUT 805 necessary to configure the LUT 805 as a two-input multiplexer will be obvious to one of ordinary skill in the art. In FIG. 34, two IMUXs 3210 and 3220 are set up as two-input multiplexers and the outputs of the multiplexers are fed into the inputs 3406 and 3407 of LUT 805 configured as a two-input multiplexer 805. In that configuration, the tile will act as a four-input multiplexer. User signals on selection inputs 3213 and 3223 select among the four inputs 3314, 3315, 3324, 3325 and another user signal on selection input 3335 selects between inputs 3406 and 3407, and passes the result to the output 3450. Note that in some embodiments, the user signals on selection inputs 3213 and 3223 may come from a single source (or a have a single value), and the user signal on selection input 3335 may come from a second source. In other embodiments, the selection bits on selection inputs 3213, 3223, and 3335 may come from separate sources.

For example, a selection bit with a value "0" sent to IMUXs 3210 and 3220 activates input 3314 of IMUX 3210 and input 3324 of IMUX 3220. A second selection bit with a value of "0" is sent to look-up table 805, activating input 3406. The net result of these two selection bits is that data coming in to input 3314 is passed through to output 3450.

J. Barrel Shifting

One application of parallel NNOCs allows a section of a configurable IC to be configured as a barrel shifter. A barrel shifter is a device that can shift a data word by some number of bits. Some barrel shifters allow shifts of amounts ranging from zero to one less than the length of the word. For example, a four-bit barrel shifter can take as its input a four-bit word, "ABCD" (each letter representing one bit) and shift it to the left by zero, one, two, or three positions, resulting in (respectively) "ABCD", "BCD0", "CD00", or "D000". A four-bit barrel shifter that shifts bits to the right by zero, one, two, or three positions would result in (respectively) "ABCD", "0ABC", "00AB", or "000A". In each case, bits that are shifted outside the range of the word (left of the leftmost, or right of the rightmost) are lost. In the preceding example, positions that don't have a corresponding bit before the shift are filled in with zeros, however It will be clear to one of ordinary skill in the art that those bits could be filled in with ones, or with random bits, or with the bits they started with, or with inversions of the bits they started with, or by any other method of determining which values to fill the vacated positions.

1. 4-BIT BARREL SHIFTER

Figure 35:
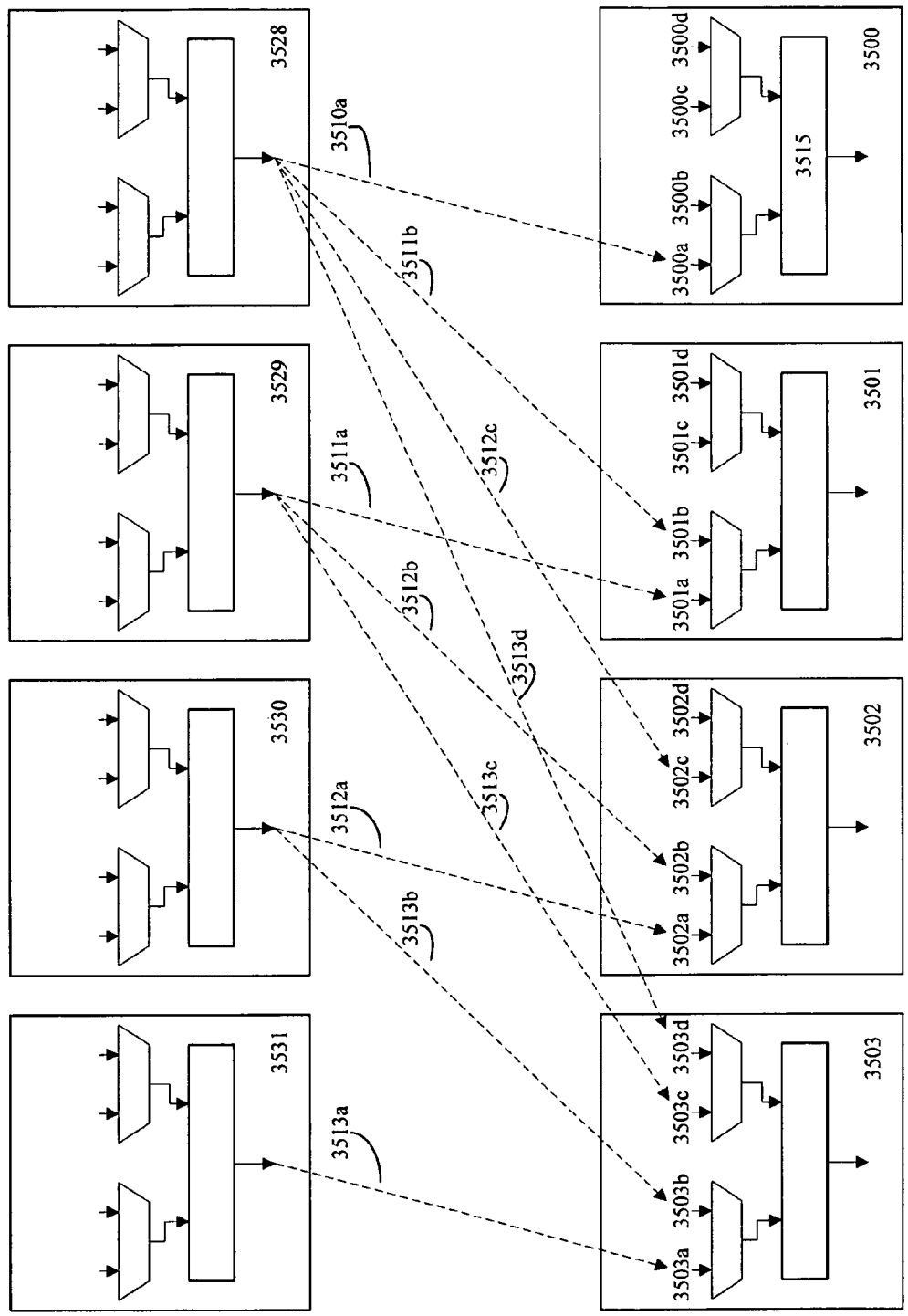
FIG. 35 illustrates a 4-bit barrel shifter.

Barrel shifters are known to those skilled in the art, though applying NNOCs in a configurable IC to create a barrel shifter is not. Some embodiments create a barrel shifter with NNOCs and multiplexers such as the four input multiplexer described above. FIG. 35 illustrates the implementation of a four-bit barrel shifter by use of four-input multiplexers, NNOC connections, and non-NNOC connections. Tiles 3500-3503 act as four-input multiplexers. Connections 3510a, 3511a, 3512a, and 3513a each connect an output on one tile to an input of a tile three rows below (intermediate rows omitted for clarity) and in the same column as the starting tile. Specifically, they connect outputs of tiles 3528-3531 to inputs 3500a, 3501a, 3502a, and 3503a on tiles 3500-3503. As a result of these connections, selecting in tandem the inputs 3500a, 3501a, 3502a, and 3503a "shifts" the data bits originally in tiles 3528-3531 by zero. Selecting a set of inputs in tandem may be done by sending a common value to corresponding multiplexers on each tile, or in other embodiments by ganging the selection bits together so that they receive their user signals from a common source. If the original data word, in tiles 3528-3531 was "ABCD" the resulting word in tiles 3500-3503 would be "ABCD".

NNOCs 3511b, 3512b, and 3513b each connect an output on one tile to an input of a tile three rows below and one column to the left of the starting tile. As a result of these NNOCs, selecting in tandem the inputs 3500b, 3501b, 3502b, and 3503b shifts the data bits originally in tiles 3528-3531 by one position to the left. If the original data word, in tiles 3528-3531 was "ABCD" the resulting word in tiles 3500-3503 would be "BCD0".

NNOCs 3512c and 3513c each connect an output on one tile to an input of a tile three rows below and two columns to the left of the starting tile. As a result of these NNOCs, selecting in tandem, the inputs 3500c, 3501c, 3502c, and 3503c shifts the data bits originally in tiles 3528-3531 by two positions to the left. If the original data word, in tiles 3528-3531 was ABCD the resulting word in tiles 3500-3503 would be "CD00".

NNOC 3513d connects an output on one tile to an input of a tile three rows below and three columns to the left of the starting tile. As a result of this NNOC, selecting in tandem, the inputs 3500d, 3501d, 3502d, and 3503d shifts the data bits originally in tiles 3527-3531 by three positions to the left. If the original data word, in tiles 3527-3531 was ABCD the resulting word in tiles 3500-3503 would be "D000".

In some embodiments, the barrel shifter might be characterized as including the top row of tiles. In other embodiments, it might be characterized as only including the lower row (or rows in multi-layer barrel shifters) of tiles and the connections between the upper row and the lower row(s). In such embodiments the tiles in the upper row could be replaced with a block of memory with outputs where the outputs of the logic circuits are in FIG. 35. A more detailed description of this may be found in sub-section K.2 below.

2. Multi Layer Barrel Shifter

In some embodiments, each multiplexer in a barrel shifter can select one out of n signals, where n is the number of selectable inputs of the multiplexer. A barrel shifter implemented with that type of multiplexer can choose n different shift amounts, each shift amount corresponding to one input of the multiplexers. Appropriate wiring would allow each of the specific n shift amounts allowed by a barrel shifter to be any arbitrary number of bits. For example, a one level barrel shifter could be implemented (with four bit multiplexers and words of more than forty bits) that would allow shifts of five, twelve, thirteen and forty bits, but would not allow shifts of any other number of bits.

Some barrel shifters allow shifts from zero to some set number of bits (in increments of one bit). Some embodiments implement barrel shifters allowing shifts from zero to more than n−1 bits (in increments of one bit). Some such embodiments use two or more layers. One layer shifts the word by zero, one, two, . . . , or n−1 bits. The second layer would shift the word by zero, n, 2n, . . . , or n(n−1) bits. Each layer of such an implementation is itself a barrel shifter. Each layer chooses from n possible shift amounts, and by using various combinations of shift amounts, a total shift of any amount between zero and $n^2-1$ can be chosen. It will be clear to one of ordinary skill in the art that still larger barrel shifter can be implemented by increasing the number of layers, or by using multiplexers with larger numbers of inputs in one or more layers.

3. 16-Bit Barrel Shifter

In the figures below, the multiplexers have four inputs. The two layered barrel shifters implemented with such multiplexers allow shifts from zero to fifteen bits. Even a topological diagram of such an arrangement is complicated, so the next few figures provide subsets of the wiring required for an entire 16-bit barrel shifter. The barrel shifter diagrams also omit the intermediate tiles, this is for clarity of drawing, and not because these tiles are missing from the embodiment. Also for clarity, the relevant tiles in the next several diagrams will be numbered, but not drawn in thick lines like the thick lined tiles drawn in some previous figures.

Figure 36:
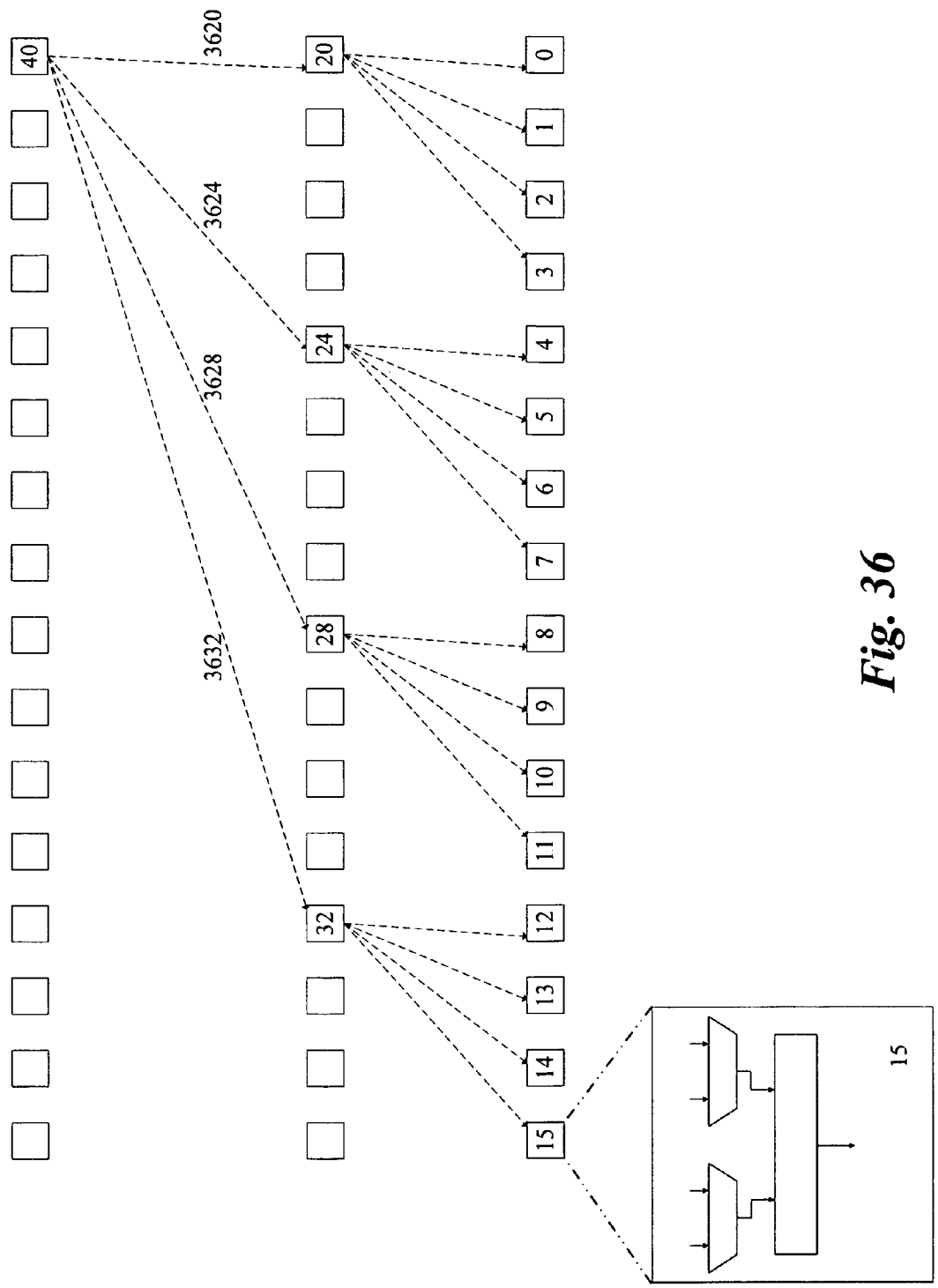
FIG. 36 illustrates some of the connections used in a 16-bit barrel shifter.

FIG. 36 illustrates one set of connections that can be used to send output from tile 40 to any selected tile 0-15. Each of the dotted lines between two tiles is a topological representation of a direct connection from one tile to another. An expanded view of tile 15 shows the inputs as shown in the previous description of 4-input multiplexers. As further described below by reference to FIG. 37, up to four connections of the barrel shifter terminate on each tile 0-15, where each of those connections goes to one input of the four-input multiplexer.

A data bit starts out as an output of tile 40. This output of tile 40 fans out through connection 3620 and NNOCs, 3624, 3628, and 3632 to multiplexer inputs (not shown) on tiles 20, 24, 28, and 32. Each of the connections 3620-3632 leads to a different input locus on their respective destination tiles, in the same manner as the connections in the 4-bit barrel shifter in FIG. 35. By selecting the appropriate input, tiles 20, 24, 28, and 32 can pass on or not pass on data from tile 40. For example, if tiles 20, 24, 28, and 32 all select the rightmost input locus, then only tile 32 will pass on the data from tile 40, because tile 40 connects to the rightmost input locus only on tile 32. Once the data bit has passed through (in this example) tile 32, it comes out an output of tile 32 and fans out to tiles 12-15. Again, each output goes to a different input locus on its destination tile, and again, by selecting the appropriate input, any of the tiles 12-15 can receive the data bit that originally started with tile 40.

Figure 37:
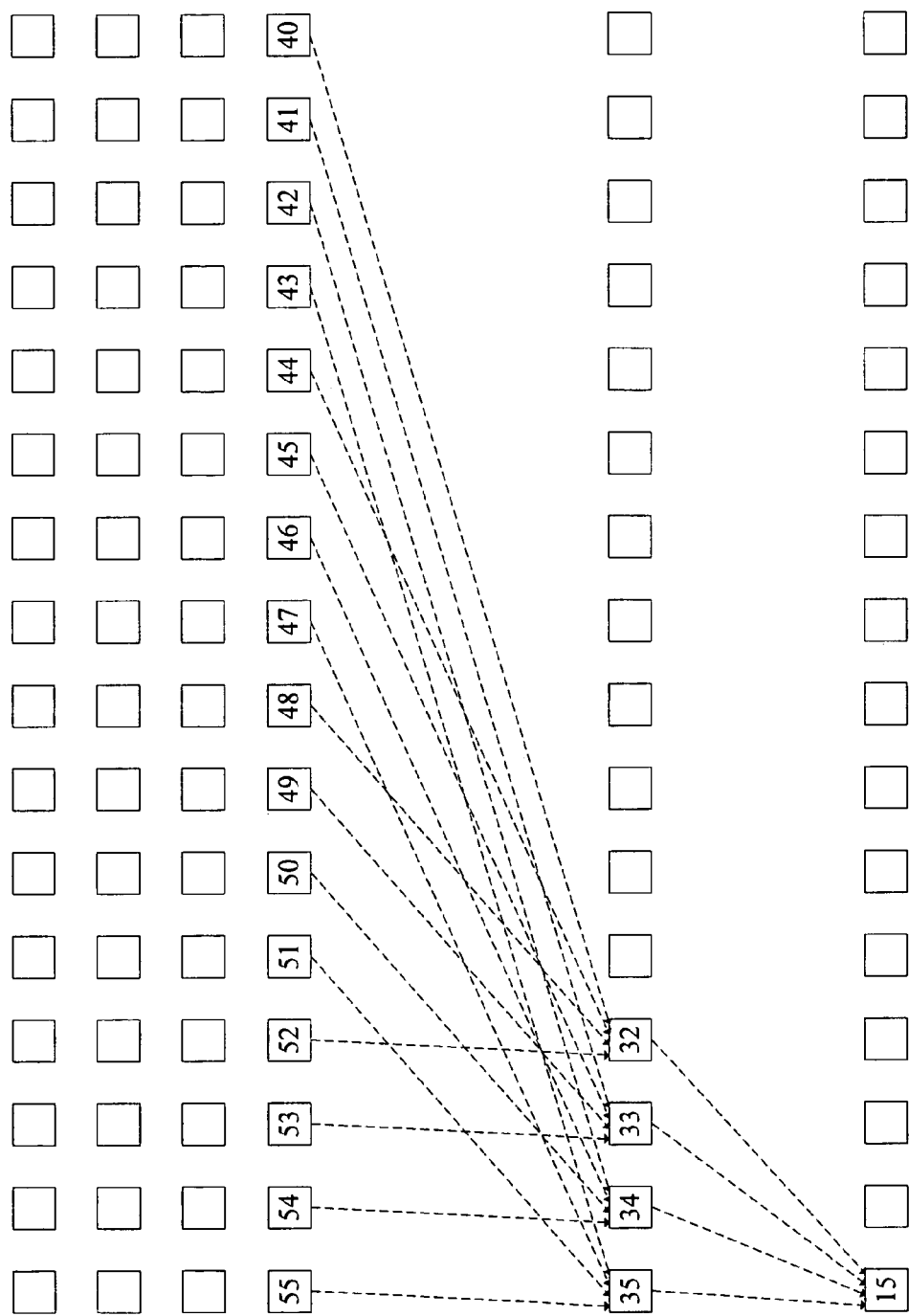
FIG. 37 illustrates a 16-to-1 multiplexer.

Some embodiments use NNOCs, non-NNOC connections, and tiles set up as four-input multiplexers to select one bit out of a 16-bit word, effectively creating a 16-input multiplexer. This is illustrated in FIG. 37. Tiles 40-43 send their outputs via parallel NNOCs to tiles 32-35, respectively. These connections all go to the same input locus on their respective tiles, in this illustration, the rightmost input. Similarly, tiles 44-47 send their outputs via another set of parallel NNOCs to tiles 32-35. However, these NNOCs all go to the second input locus from the right, on their respective tiles. Similar connections go from the outputs of tiles 48-51 and 52-55 to their respective input loci on tiles 32-35. By selecting appropriate inputs on tiles 32-35 and tile 15, any data bit from tiles 40-55 can be received by tile 15.

Figure 38:
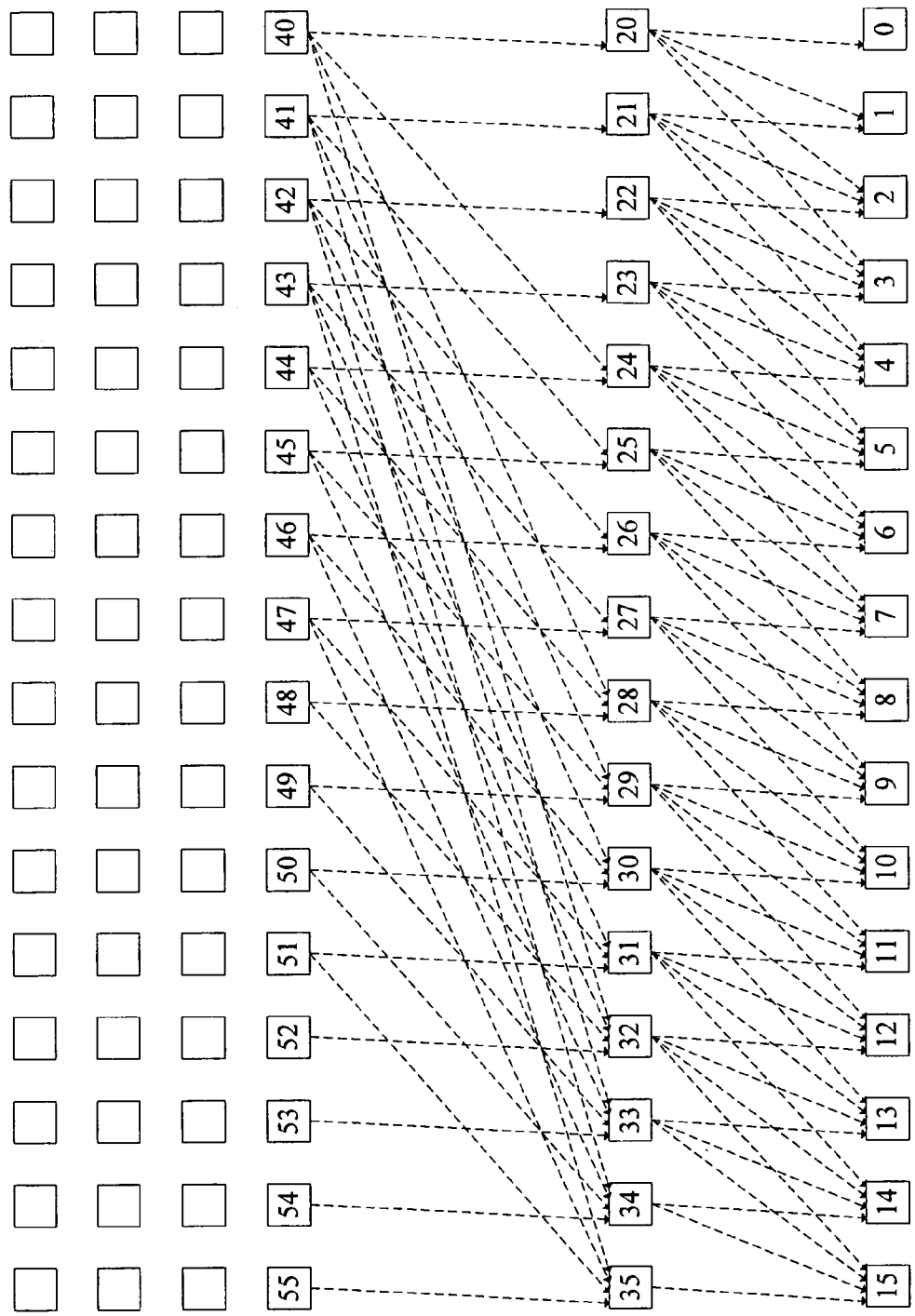
FIG. 38 illustrates a 16 bit barrel shifter.

Some embodiments use NNOCs to create 16-bit barrel shifters, such as the one illustrated in FIG. 38. In this figure, a 16-bit word starts in tiles 40-55, is shifted zero, four, eight, or twelve bits to the left by selecting the appropriate set of corresponding inputs on tiles 20-35 and is then shifted a further zero, one, two, or three bits to the left by selecting the appropriate set of corresponding inputs in tiles 0-15. In some embodiments, the selection of appropriate sets of corresponding inputs is done using parallel NNOCs or parallel non-NNOC connections. In some other embodiments, multiple selection inputs (not shown) of the MUXs (not shown) on the tiles come from common sources of user signals. In some of these embodiments, all the tiles in a particular row of the barrel shifter receive the same values (sometimes from the same sources ganged together) for the two one-bit user signals that select the corresponding inputs.

Figure 39:
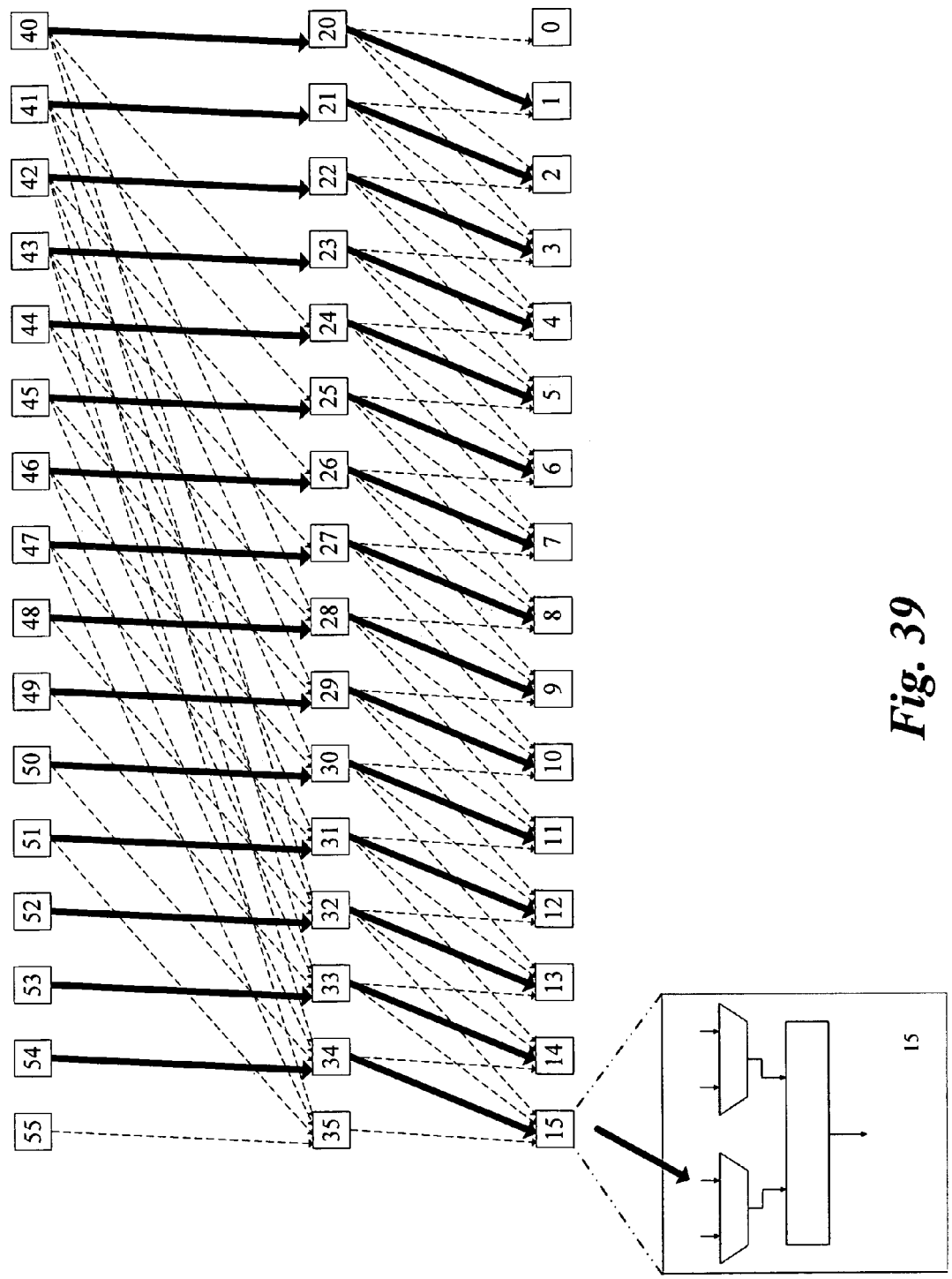
FIG. 39 illustrates a 16-bit barrel set to shift a 16 bit word by one bit to the left.
Figure 40:
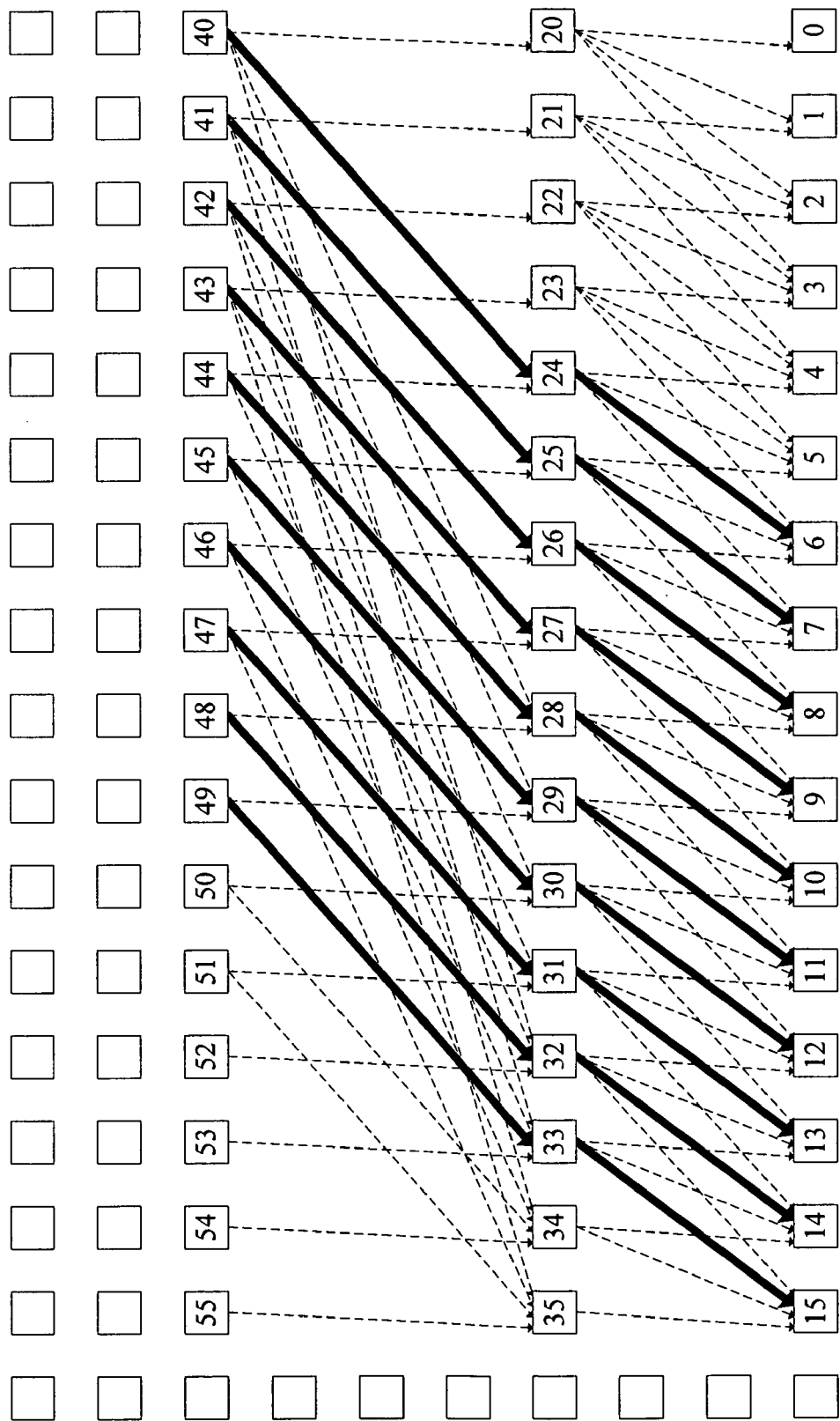
FIG. 40 illustrates a 16-bit barrel set to shift a 16 bit word by six bits to the left.
Figure 41:
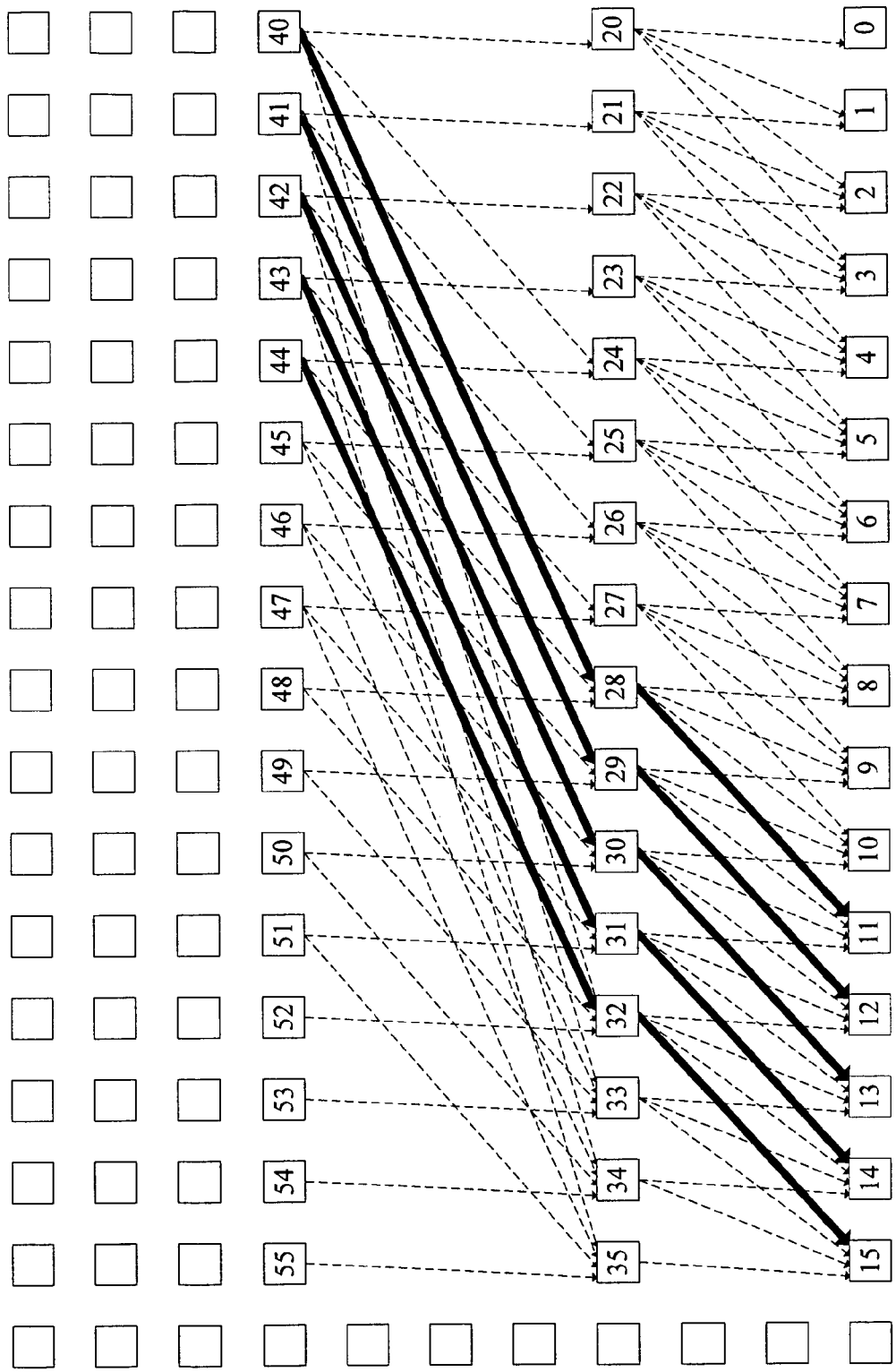
FIG. 41 illustrates a 16-bit barrel set to shift a 16 bit word by eleven bits to the left.

Examples of the connections selected to implement various word-shifts are illustrated in FIGS. 39-41. In these figures, the thick solid lines with arrows connecting tiles are topological representations of direct connections going to active inputs, the dotted lines with arrows connecting tiles are topological representations of direct connections to inactive inputs. In FIG. 39 the leftmost input of each tile 20-35 is selected. The leftmost input of each destination tile 20-35 is connected to the output of a tile 40-55 four rows above and in the same column as the destination tile. Selecting the leftmost input of each tile 20-35 thus shifts the 16-bit word by zero bits, leaving the same 16-bit word on tiles 20-35 as were originally on tiles 40-55. Subsequently, the second input from the left is selected for tiles 0-15. The second input from the left of each destination tile 0-15 is connected to the output of a tile 20-35 three rows above and one column to the right of the destination tile. Selecting the second from the left input of each tile 0-15 thus shifts the 16-bit word by one bit to the left. Thus the net result of passing through the selected connectors is to shift the 16-bit word one bit to the left from where it had been on tiles 40-55. Representing each bit as a letter, with gaps for clarity; the results of the shifts would be:

| Tiles 40-55: | ABCD | EFGH | IJKL | MNPQ |
|---|---|---|---|---|
| Tiles 20-35: | ABCD | EFGH | IJKL | MNPQ |
| Tiles 0-15: | BCDE | FGHI | JKLM | NPQ0 |

The zero in the bit streams indicated above indicates a position that has no original bit to shift into it. The zeros in the bit streams indicated below are there for the same reason. As stated above, other fill in methods besides putting in zeros are also within the scope of the present invention.

In FIG. 40 the second from the left input of each tile 20-35 is selected. Selecting the second from the left input of each tile 20-35 shifts the 16-bit word by four bits to the left. Subsequently, the third input from the left is selected for tiles 0-15. Selecting the third from the left input of each tile 0-15 shifts the 16-bit word by two bits to the left. Thus the net result of passing through the selected connectors is to shift the 16-bit word six bits to the left from where it had been on tiles 40-55. Representing each bit as a letter, with gaps for clarity, the results of the shifts would be:

| Tiles 40-55: | ABCD | EFGH | IJKL | MNPQ |
|---|---|---|---|---|
| Tiles 20-35: | EFGH | IJKL | MNPQ | 0000 |
| Tiles 0-15: | GHIJ | KLMN | PQ00 | 0000 |

In FIG. 41 selecting the third from the left input of each tile 20-35 shifts the 16-bit word by eight bits to the left. Selecting the rightmost input of each tile 0-15 shifts the 16-bit word by three bits to the left. Thus the net result of passing through the selected connectors is to shift the 16-bit word eleven bits to the left from where it had been on tiles 40-55. Representing each bit as a letter, with gaps for clarity, the results of the shifts would be:

| Tiles 40-55: | ABCD | EFGH | IJKL | MNPQ |
|---|---|---|---|---|
| Tiles 20-35: | IJKL | MNPQ | 0000 | 0000 |
| Tiles 0-15: | LMNP | Q000 | 0000 | 0000 |

Figure 42:
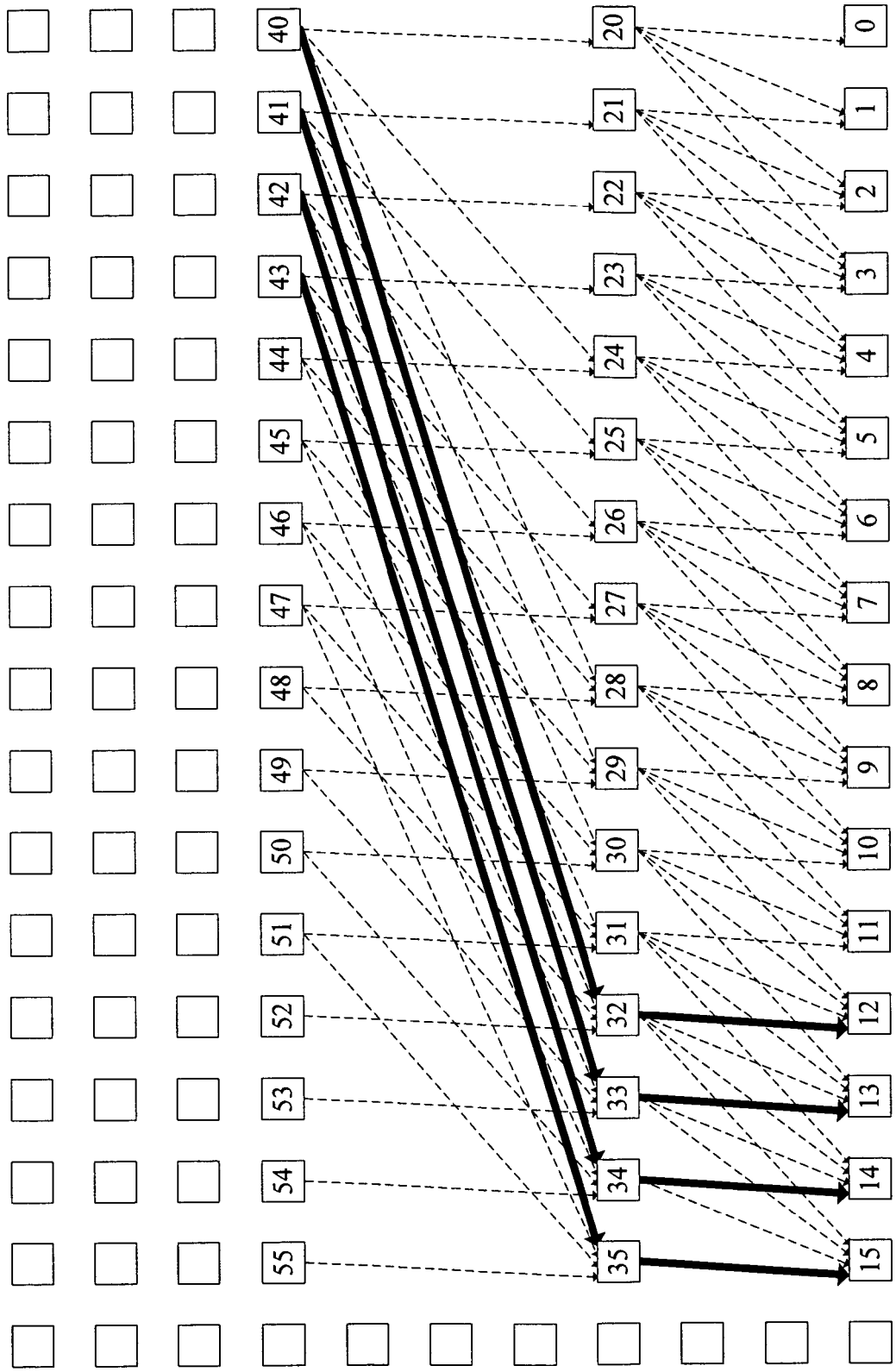
FIG. 42 illustrates a 16-bit barrel set to shift a 16 bit word by twelve bits to the left.

In FIG. 42 selecting the rightmost input of each tile 20-35 shifts the 16-bit word by twelve bits to the left. Selecting the leftmost input of each tile 0-15 shifts the 16-bit word by zero bits to the left. Thus the net result of passing through the selected connectors is to shift the 16-bit word twelve bits to the left from where it had been on tiles 40-55. Representing each bit as a letter, with gaps for clarity, the results of the shifts would be:

| Tiles 40-55: | ABCD | EFGH | IJKL | MNPQ |
| Tiles 20-35: | MNPQ | 0000 | 0000 | 0000 |
| Tiles 0-15: | MNPQ | 0000 | 0000 | 0000 |

By combining appropriate selections of inputs in tiles 20-35 and 0-15 the 16-bit word on tiles 40-55 can be shifted by any number of bits from zero to 16. It will be clear to those skilled in the art that by adding additional layers of multiplexers and parallel connections, that barrel shifting can be performed on still longer words. For example, a 64-bit wide barrel shifter can be implemented by taking four, side by side 16 bit barrel shifters, and adding another layer with connections offset by zero, sixteen, thirty-two, and forty-eight columns. The added layer could be added above, below or between the already described layers of the 16-bit barrel shifter.

Figure 43:
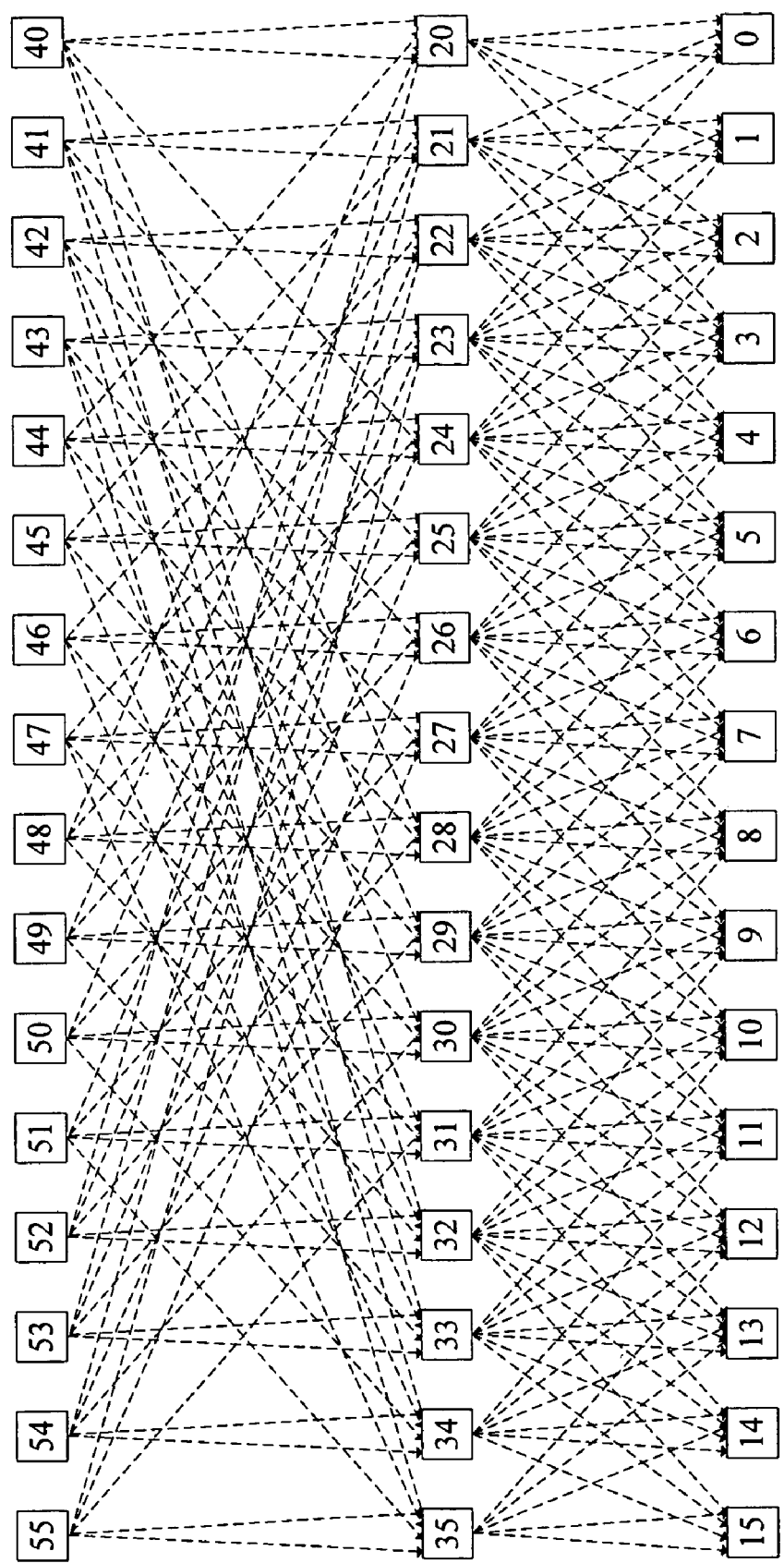
FIG. 43 illustrates a topological wiring diagram to implement a 16-bit barrel shifter for shifting to the left and a 16 bit barrel shifter for shifting to the right.

The barrel shifter shown in the preceding figures is capable of providing shifts to the left (or a shift of zero), but it will be clear to those skilled in the art that similar barrel shifters can be created that provide shifts to the right, and barrel shifters that optionally provide shifts in either direction. One example of a barrel shifter that optionally provides shifts in either direction is illustrated in FIG. 43.

4. Alternate Embodiments of Barrel Shifters

The figures illustrating the previously described embodiments of barrel shifters showed the set of tiles containing the shifted word as being directly beneath the set of tiles containing the original word. The tile corresponding to the most significant bit in the shifted word was directly below the tile corresponding to the most significant bit in the original word, and so on. However, in other embodiments the set of tiles containing the shifted word may itself be offset by one or more columns, such that the tile corresponding to the most significant bit of the shifted word is no longer directly beneath the tile corresponding to the most significant bit of the original word, and so on. Thus, in some embodiments, a shift of a word within a data path may coincide with a shift of the data path itself.

The figures indicated above also showed the larger shift first, followed by a smaller shift. It will be clear to one of ordinary skill in the art that other embodiments may have the smaller shift first followed by the larger shift.

Figure 44:
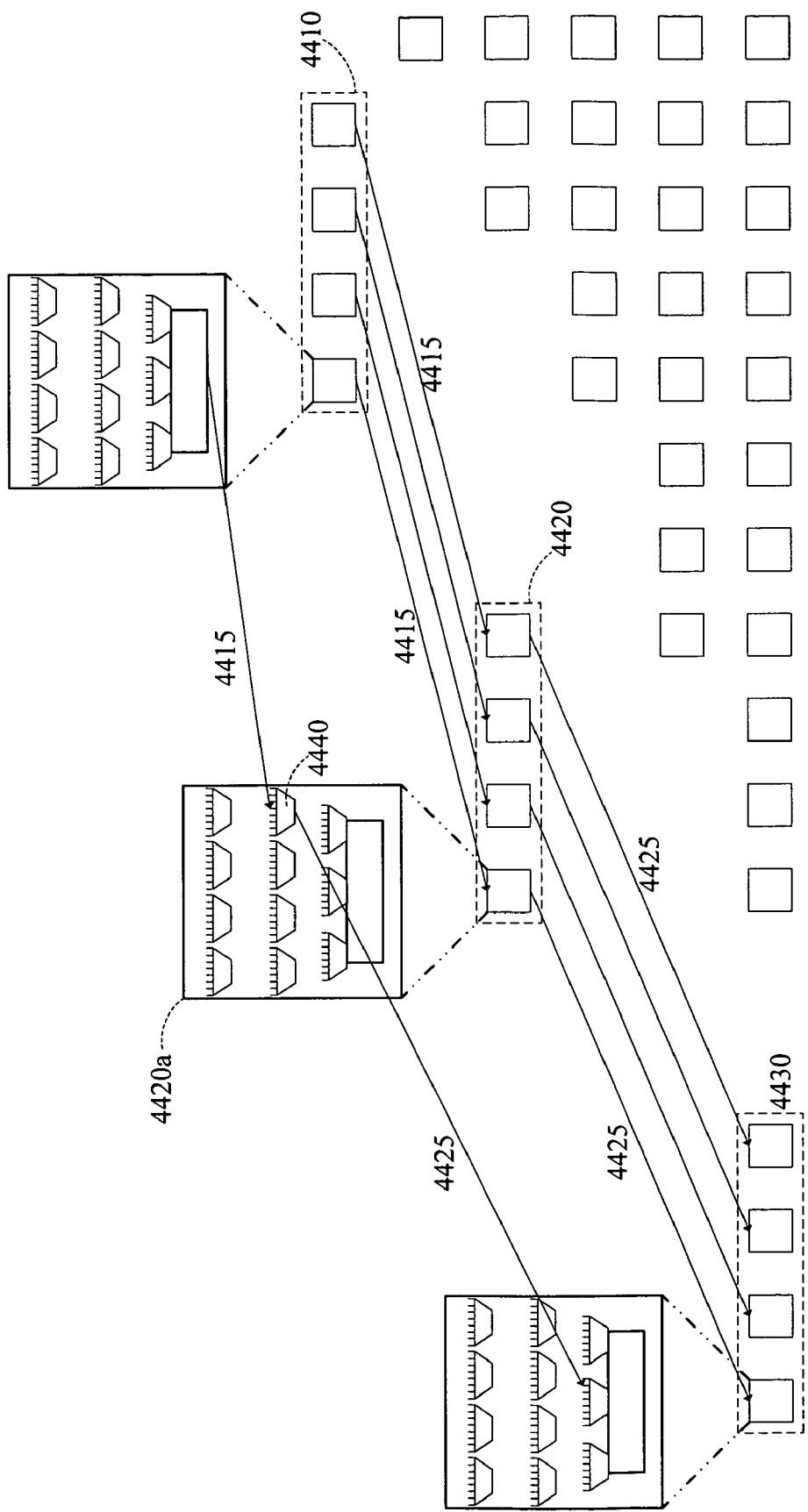
FIG. 44 illustrates use of multiple sets of parallel NNOCs passing a signal through an interconnect circuit on a set of tiles.

The figures illustrating the previously described embodiments also showed (among others) parallel NNOCs (12,4) that directly connected distant tiles. In some other embodiments, distant tiles may be connected by combinations of shorter sets of NNOCs, such as those shown in FIG. 44. This figure shows four parallel NNOCs (6,2) 4415, connecting tile set 4410 to tile set 4420, and four parallel NNOCs (6,3) 4425 connecting tile set 4420 to tile set 4430. The figure shows exploded views of one tile in tile set 4410, one tile in tile set 4420 and one tile in tile set 4430. The connection passes through an RMUX 4440 in the exploded tile 4420a. In some embodiments, where a barrel-shifter uses direct NNOCs for shorter connections and pairs of NNOCs (as shown in FIG. 44) for longer connections, RMUXs and parallel intra-tile connections are used in the destination tiles of the shorter connections, such as those shown in FIG. 45. The use of such RMUXs and intra-tile connections insures that the time it takes for data to get from one layer to another is close to the same.

Most of the delay in passing a signal from one tile to another comes from the logic and routing circuits rather than the direct connections. Therefore adding an extra multiplexer to one data path (as shown in FIG. 44) but not to another data path may result in longer delays for one path than another. In some embodiments where such disparities are to be avoided, an extra multiplexer may be placed in a path that would otherwise not need one.

Figure 45:
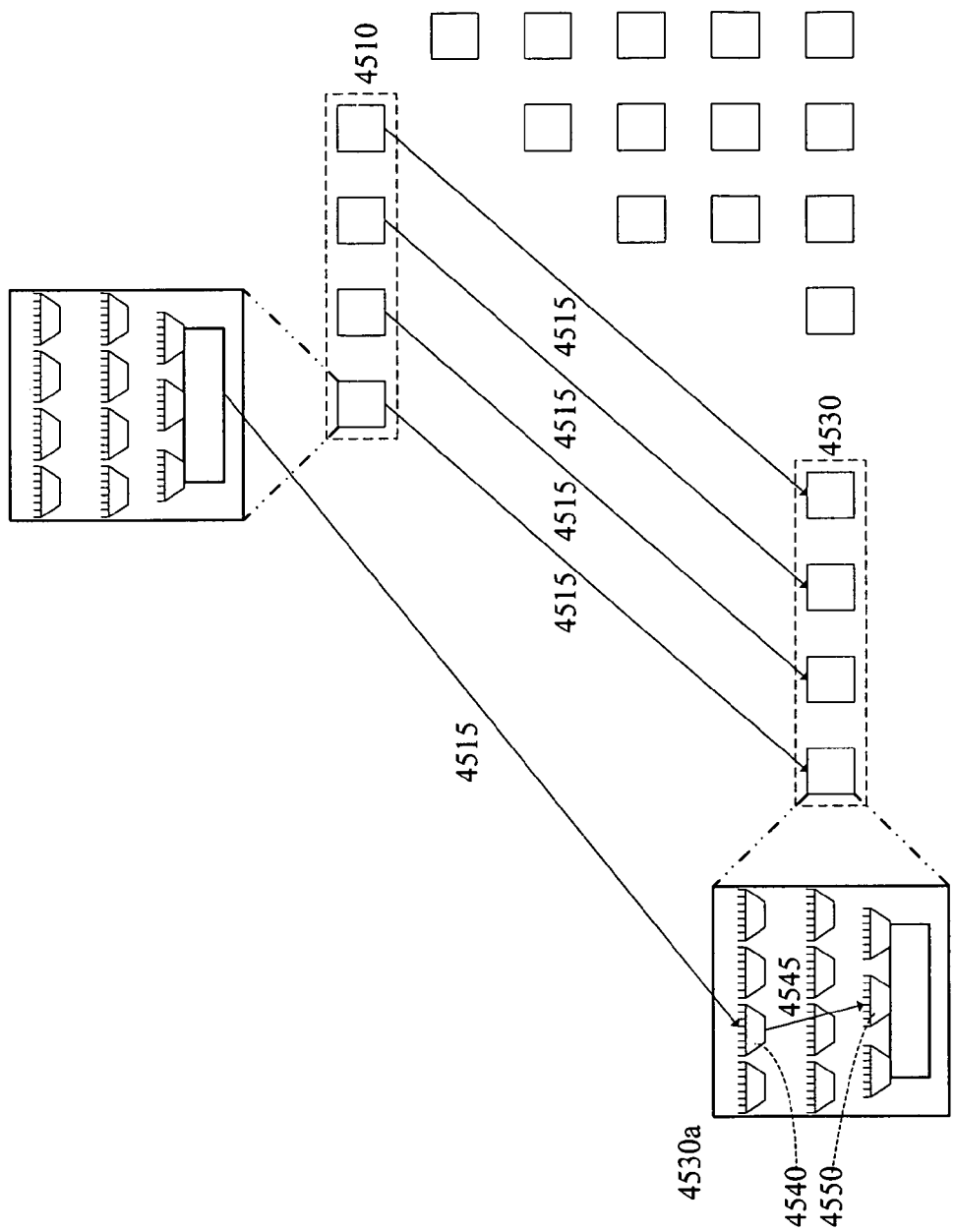
FIG. 45 illustrates use of a set of parallel NNOCs coupled with use of parallel intra-tile connections.

FIG. 45 illustrates the addition of a multiplexer to a data path of some embodiments. The figure shows NNOCs (4,5) 4515 connecting tile set 4510 to tile set 4530. The exploded view of tile 4530a shows that the NNOC (4,5) 4515 from tile set 4510 connects to RMUX 4540. The exploded view also shows that the outputs of RMUX 4540 connects to IMUX 4550 through intra-tile connection 4545 (connection 4545 is repeated as a parallel intra-tile connection on each tile of tile set 4530, but not shown in the figure). The set of connections (NNOCs 4515 and intra tile connections 4545) ensures that data coming from tile set 4510 passes through one RMUX before reaching an IMUX in tile set 4530, just as the data in FIG. 44 passed through one RMUX on its way from tile set 4410 to tile set 4430. This is one way of ensuring that the amount of time it takes for data to reach tile set 4530 is very close to the same as it takes data to reach tile set 4430 whether the data originates with tile set 4410 or tile set 4510.

K. Memory Ports

Figure 46:
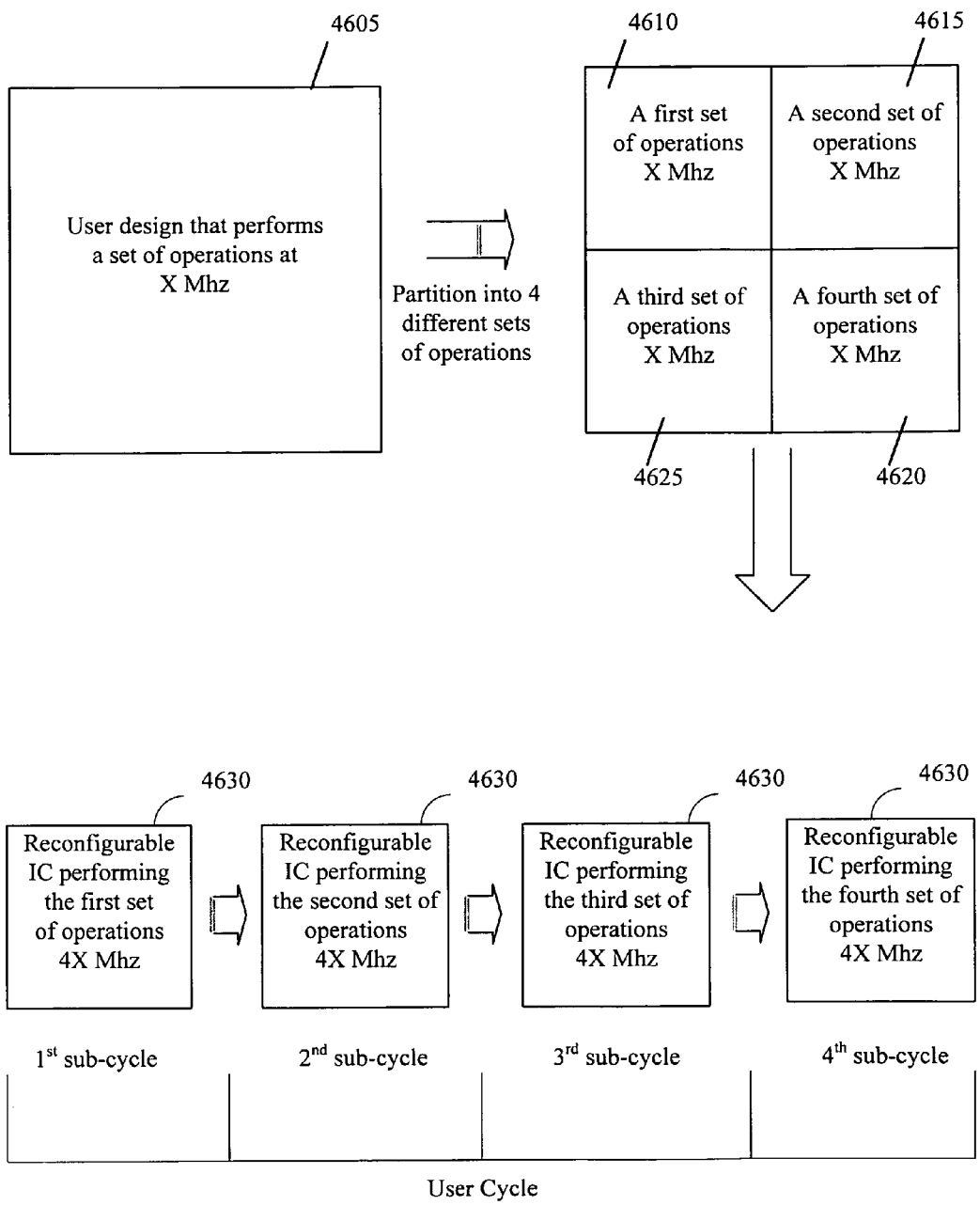
FIG. 46 illustrates the use of sub-cycles in a reconfigurable integrated circuit.

Reconfigurable IC's are one type of configurable IC's. Specifically, reconfigurable IC's are configurable IC's that can reconfigure during runtime. FIG. 46 conceptually illustrates an example of a sub-cycle reconfigurable IC (i.e., an IC that is reconfigurable on a sub-cycle basis). In this example, the sub-cycle reconfigurable IC implements a user design 4605 that operates at a clock speed of X MHz. Typically, an IC design is initially specified in a hardware description language (HDL), and a synthesis operation is used to convert this HDL representation into a circuit representation. After the synthesis operation, the IC design includes numerous electronic circuits, which are referred to below as "components." As further illustrated in FIG. 46, the operations performed by the components in the IC design 4605 can be partitioned into four sets of operations 4610-4625, with each set of operations being performed at a clock speed of X MHz.

FIG. 46 then illustrates that these four sets of operations. 4610-4625 can be performed by one sub-cycle reconfigurable IC 4630 that operates at 4× MHz. In some embodiments, four cycles of the 4× MHz clock correspond to four sub-cycles within a cycle of the X MHz clock. Accordingly, this figure illustrates the reconfigurable IC 4630 reconfiguring four times during four cycles of the 4× MHz clock (i.e., during four sub-cycles of the X MHz clock). During each of these reconfigurations (i.e., during each sub-cycle), the reconfigurable IC 4630 performs one of the identified four sets of operations. In other words, the faster operational speed of the reconfigurable IC 4630 allows this IC to reconfigure four times during each cycle of the X MHz clock, in order to perform the four sets of operations sequentially at a 4× MHz rate instead of performing the four sets of operations in parallel at an X MHz rate. Other embodiments perform even faster, with more sub-cycles per user cycle.

One possible operation during a sub-cycle is accessing memory on the IC. Typically, electronic memory is stored in memory circuits as binary data. Data is put into the memory circuits as "words" of data of a set length, dependent on the design of the memory circuits. The length of the words is referred to as the "width" of the memory. An example of a memory width is 16-bits. Each word of data is stored at a particular memory address. A memory address is an n-bit binary number. The total number of memory addresses in a piece of memory is $2^n$. The number of memory addresses in a piece of memory is referred to as the "depth" of the memory. Accordingly, such memory is $2^n$-bits "deep".

Typically, memory is much deeper than it is wide. For example, a block of memory could have words 16-bits long and 1024 memory locations ($2^{10}$) to store the words in. Such a memory would be 16-bits wide and 1024-bits deep.

Figure 47:
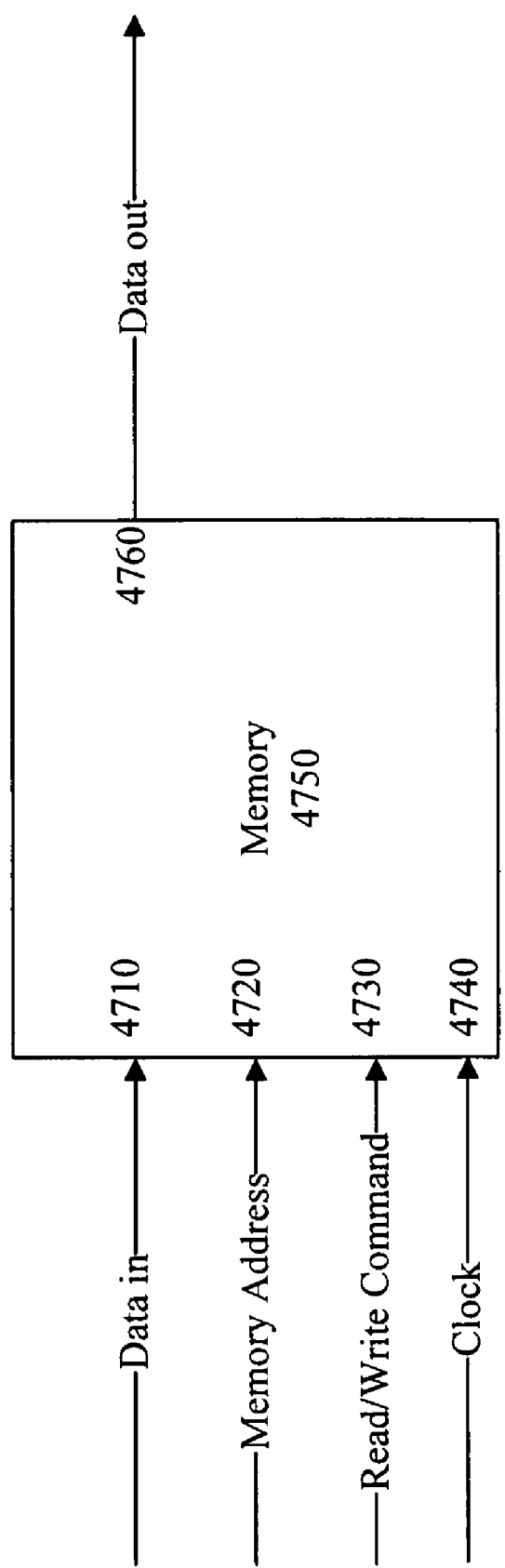
FIG. 47 illustrates memory and a memory port.

Memory is accessed by use of memory ports. A memory port for a block of memory allows memory words to be written to or read from the memory, once per time unit. Some memory ports are read/write memory ports that handle both read and write operations. FIG. 47 is a representation of a physical memory port. The memory 4750 has a single memory port. The port has (1) data input lines 4710 (represented by one line) to write data to the memory, (2) memory address input lines 4720 (represented by one line) to specify the address to be accessed, (3) a read/write input line 4730 to specify whether to read to or write from the memory, (4) a clock input 4740, and (5) a data out line 4760 to read data from the memory.

1. Multiple Logical Memory Ports

In some embodiments, memory can be accessed every sub-cycle. Because this can be done in a sub-cycle, the memory can be accessed as many times per user cycle as there are sub-cycles per user cycle. For example, an embodiment with 4 sub-cycles per user cycle can access the memory 4 times per user cycle.

In some embodiments, multiple accesses per user cycle are presented to the user as multiple logical memory ports. Though the memory may have only one physical port, the repeated accesses manifest as independent logical memory ports, all accessing the same memory address in the same user cycle. Each logical port corresponds to a single physical port, plus a sub-cycle time slot.

It should be noted that in some embodiments, the user might perceive each logical memory port of a memory of the reconfigurable IC as an actual physical memory port of a memory in the user design. Irrespective of whether the user perceives multiple logical memory ports or multiple physical memory ports, the user specifies a design that includes a memory that has multiple memory ports. The software tool provided by some embodiments takes the user's design and maps accesses to a user-design memory through multiple ports during one user design cycle to multiple sub-cycle accesses to a memory in sub-cycle reconfigurable IC.

Figure 48:
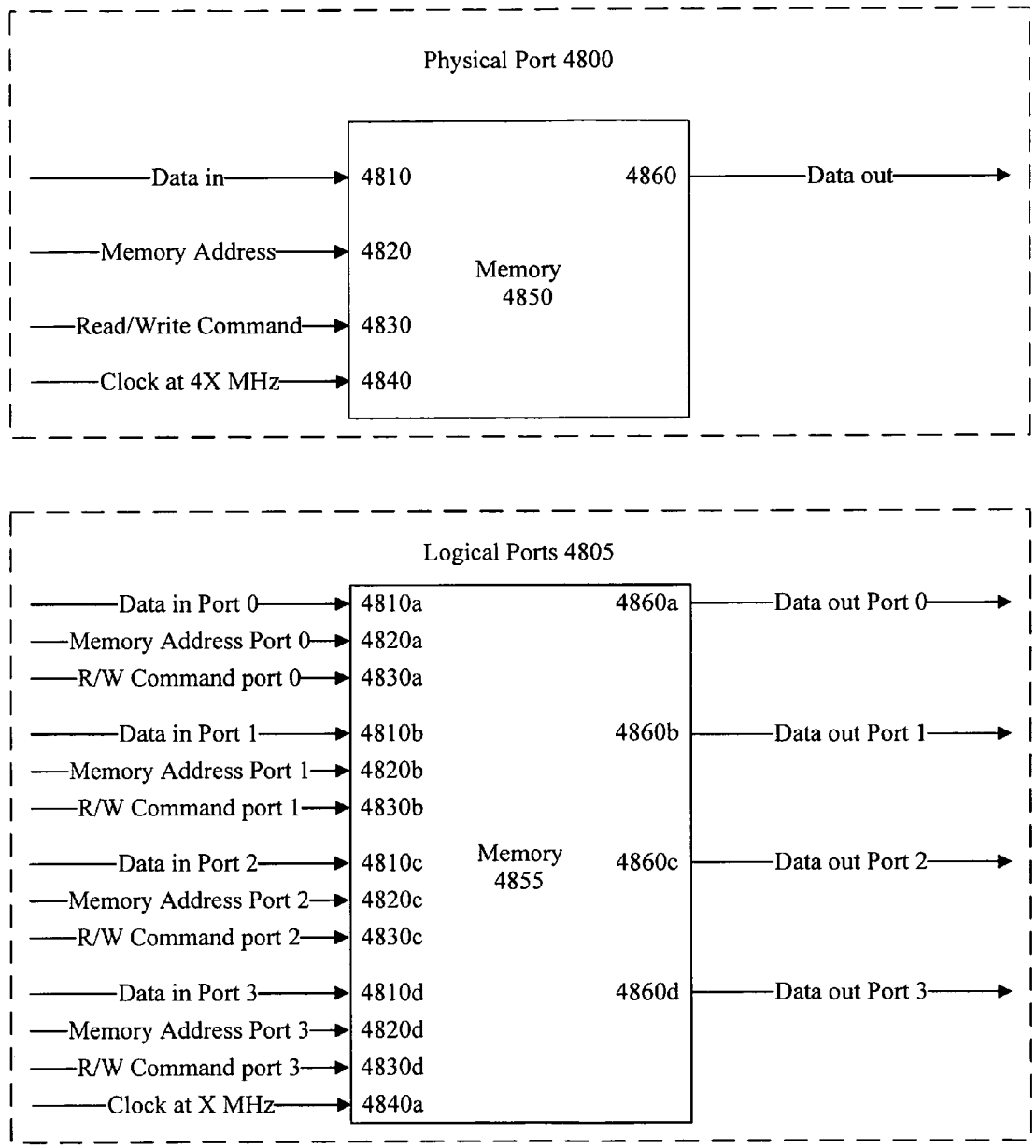
FIG. 48 illustrates a memory with more logical ports than physical ports.

FIG. 48 illustrates memory access from the physical point of view of the reconfigurable IC and the effective memory access as seen by the user's design. The user's design can operate as though there are four ports, all four accessible in one clock cycle. These four ports are referred to as logical ports as they do not correspond to four physical ports in the reconfigurable IC. The reconfigurable IC operates as though there is one port, accessible once per sub-cycle. Data-in lines 4810*a-d* correspond to data-in line 4810 during each of four clock sub-cycles, data-out lines 4860*a-d* correspond to data-out line 4810 during each of four clock cycles. Memory address inputs 4820*a-d* correspond to memory address 4820 during each of four clock sub-cycles. Read/write command inputs 4830*a-d* correspond to read/write command input 4830 during each of four clock sub-cycles. Clock input 4840 receives the clock signals at the frequency used by the reconfigurable IC; clock input 4840*a* receives the clock signals at the frequency used by the user's design. The clock signals used by the reconfigurable IC are four times the frequency of the clock signals used by the user design. The memory 4850 accessed by the physical ports and the memory 4855 accessed by the logical ports correspond to each other. In some embodiments they are physically the same. In some embodiments they may be construed as different from each other.

FIG. 48 illustrates that the memories receive clock signals that operate at user design cycle rate and at a sub-cycle rate. One of ordinary skill will realize that these presentation merely conceptually illustrate the effective operational speeds of the memories in the user design and in the reconfigurable IC. To get these memories to operate at these rates, they might receive one or more other clock signals that specify that they operate at the user design cycle rate or at the sub-cycle rate.

Figure 49:
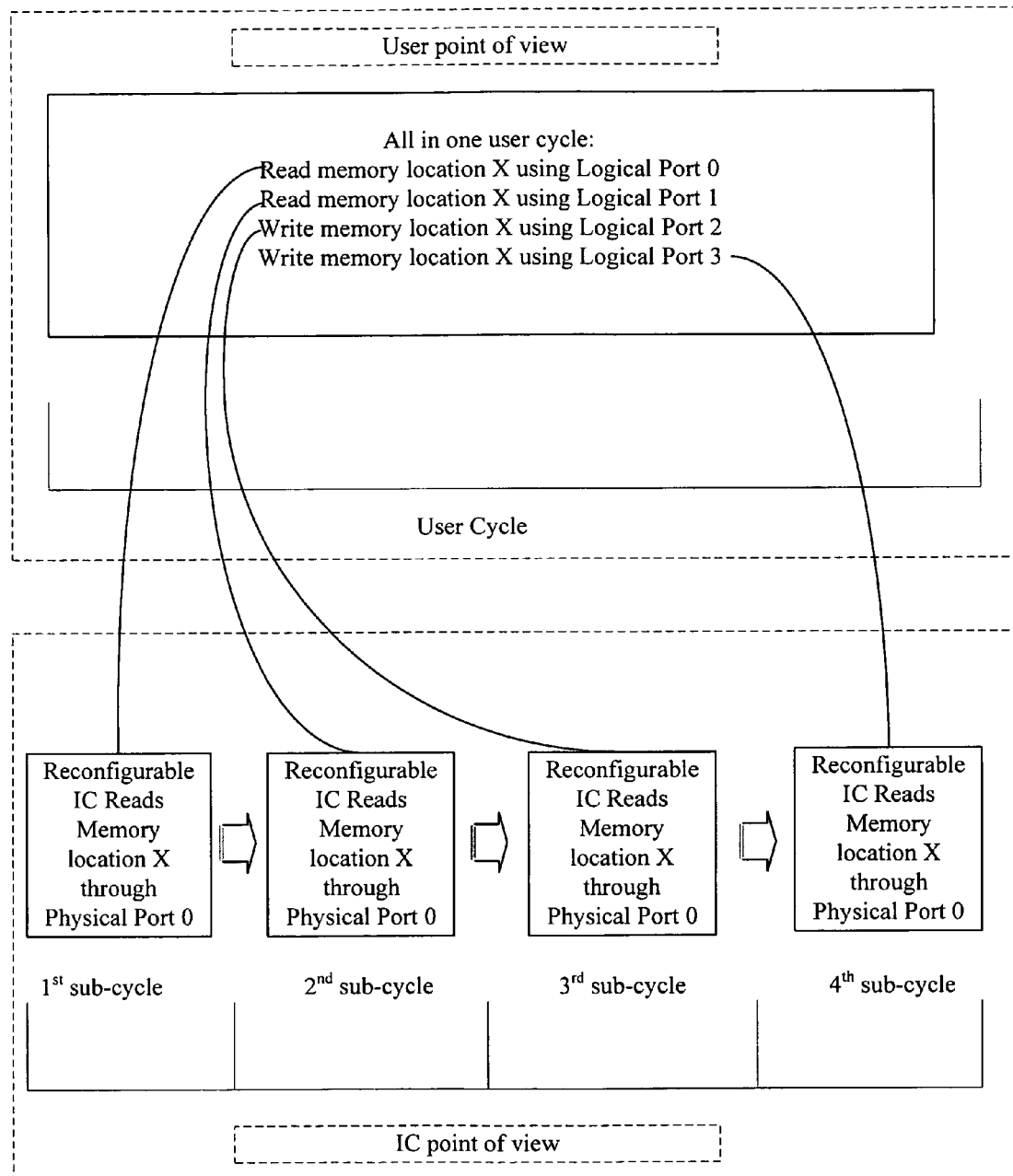
FIG. 49 illustrates multiple accesses of a memory location during one user cycle.

FIG. 49 illustrates the operation of multiple memory accesses, from the point of view of the IC and the point of view of the user, for a four sub-cycle per user cycle IC. FIG. 49 illustrates the mapping of two read operations through two logical ports of a memory in the user design to two read operations through one physical port of a memory in the reconfigurable IC during the first two sub-cycles. This figure also illustrates the mapping of two write operations through two logical ports of the memory in the user design to two write operations through the physical port of the memory in the reconfigurable IC during the last two sub-cycles. In the figure, two read operations and two write operations are performed, however, any combination of read and write operations can be performed.

2. Narrowing Memory

In some cases, the user's requirements for the way the IC memory is arranged may be different from the physical memory arrangement on the IC. Some embodiments use a barrel shifter to present the memory on the configurable IC to the user as being narrower and deeper than it actually is. In the example illustrated in FIG. 50 the actual memory 5010 uses 16-bit words and is 32 memory addresses deep (using 5 bits to provide $2^5$=32 memory addresses). Note that the use of the letter Z for memory location "31" does not indicate that there are only 26 words in the memory. These embodiments can present the memory to the user as being a memory arrangement 5020 2-bits wide and 256 memory addresses deep (using 8 bits to provide $2^8$=256 memory addresses).

In this example, the configurable IC receives from the user a read command for a 2-bit word with 8-address bits. This includes 5-bits that tell the configurable IC what the actual memory location is, and 3-bits that tell the configurable IC which part of the 16-bit word at that memory location is required. Memory 5010 includes a 16-bit word 5030 at binary memory location "00000". If the user's design wants to read a 2-bit word such as the one at memory location 5040 it would provide the binary address "00000 100" (note, that the space is for clarity, not a required part of these embodiments) to the configurable IC.

Figure 51:
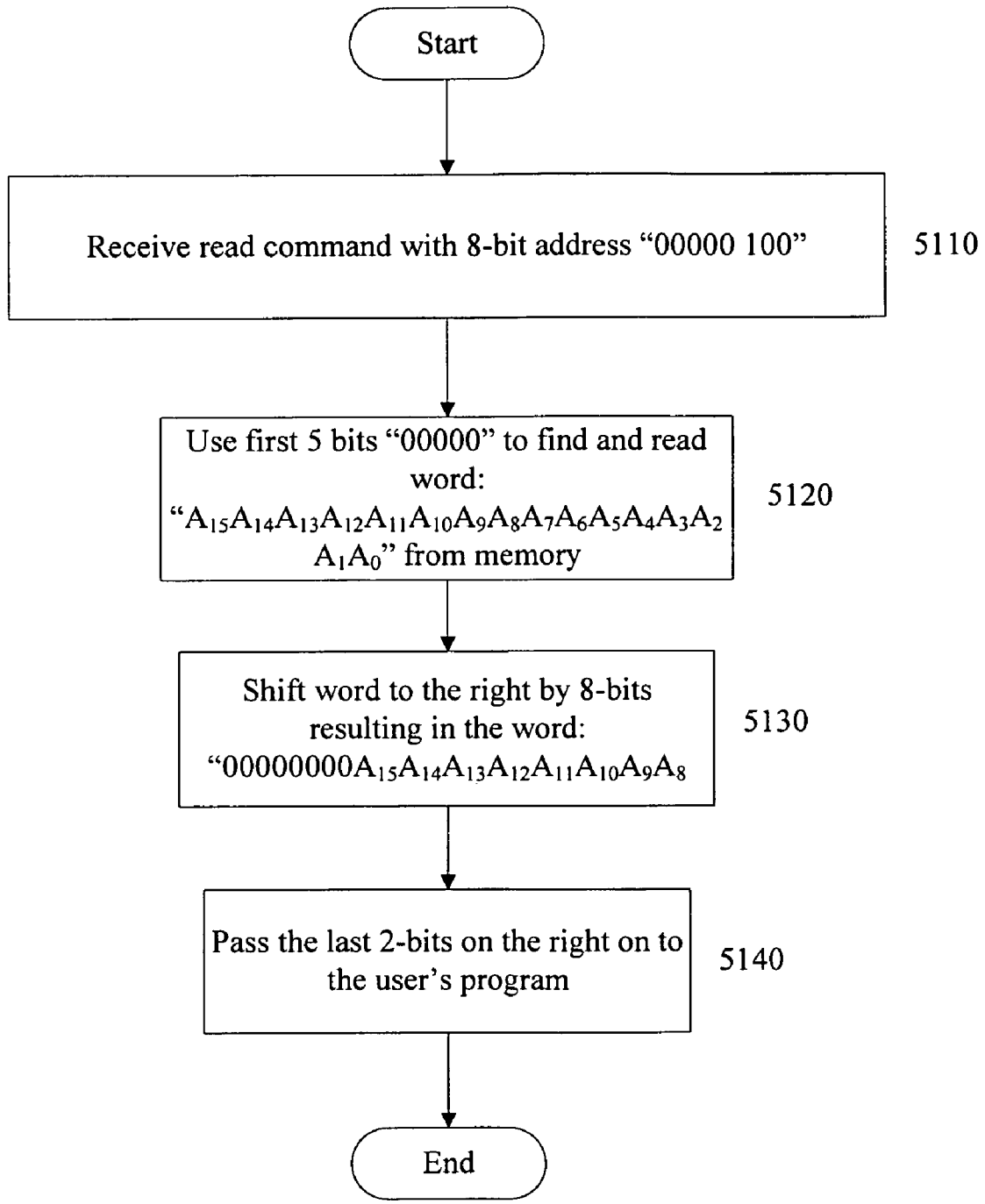
FIG. 51 illustrates a flowchart of an example of virtual memory presented as being narrower and deeper than the physical memory.

FIG. 51 illustrates an example of the process of extracting the specified 2-bit word from the actual memory. In 5110, the configurable IC receives the address from the user's design. In 5120, the configurable IC uses the first 5-bits, "00000", to find and read word 5030 out of the configurable IC memory. In 5130, the word is shifted to the right using a barrel shifter. The length of the shift is determined by the width of the word (2 bits) the user's memory arrangement uses and the last 3-bits of the provided 8-bit binary address.

Figure 50:
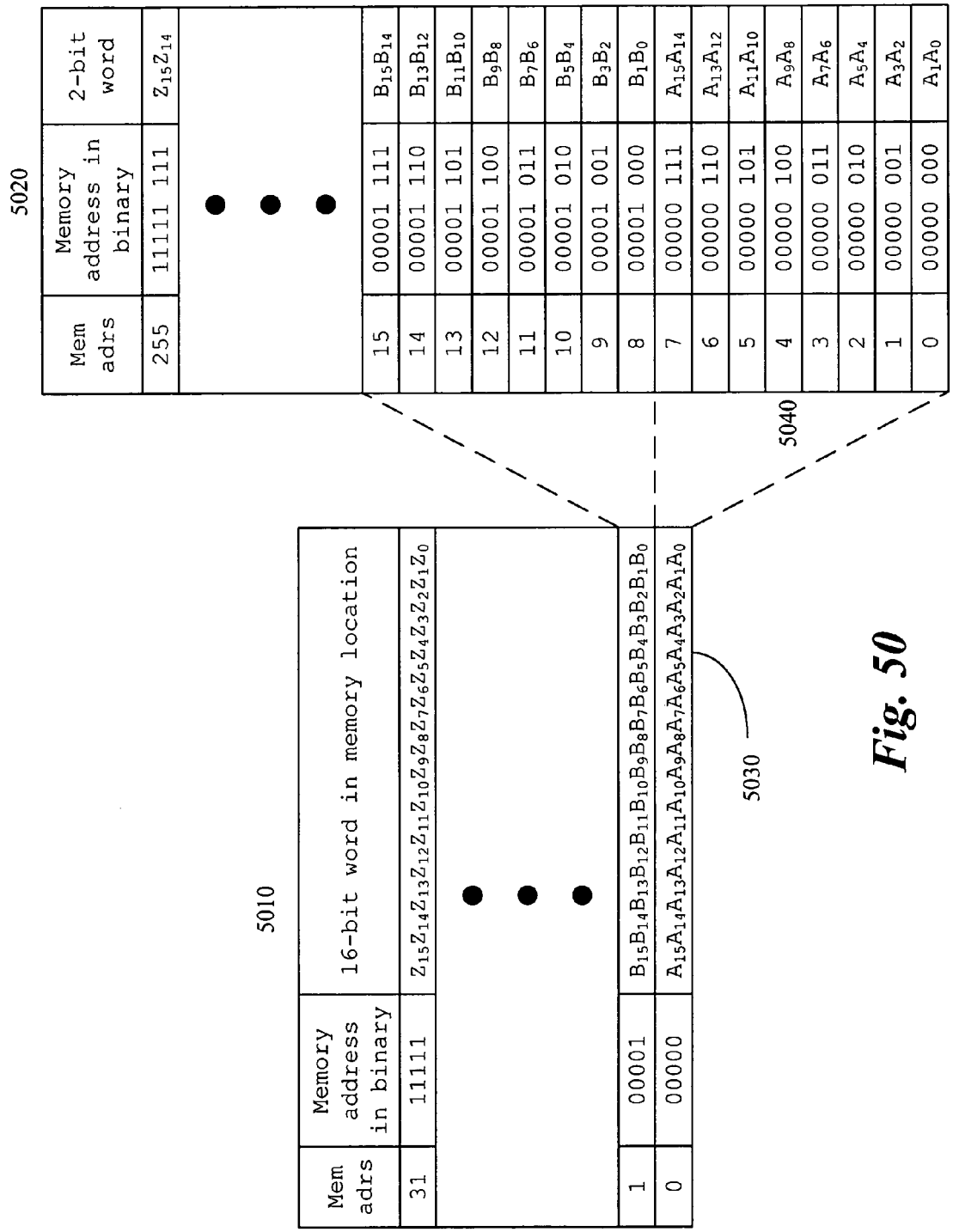
FIG. 50 illustrates a virtual memory presented as narrower and deeper than the physical memory.

The number of bits that the word is shifted by is equal to the product of the width of the word the user's design seeks, times the value of the last 3-bits of the user provided address. In binary, "100" means "4", and the width of the word the user seeks is 2-bits, so the word 5030 is shifted 8-bits to the right. In 5140 the configurable IC passes only the final two bits $A_9A_8$ on to the user's design. As seen in FIG. 50, this is the word found in memory address 5040, which is what the design was trying to read.

Figure 52:
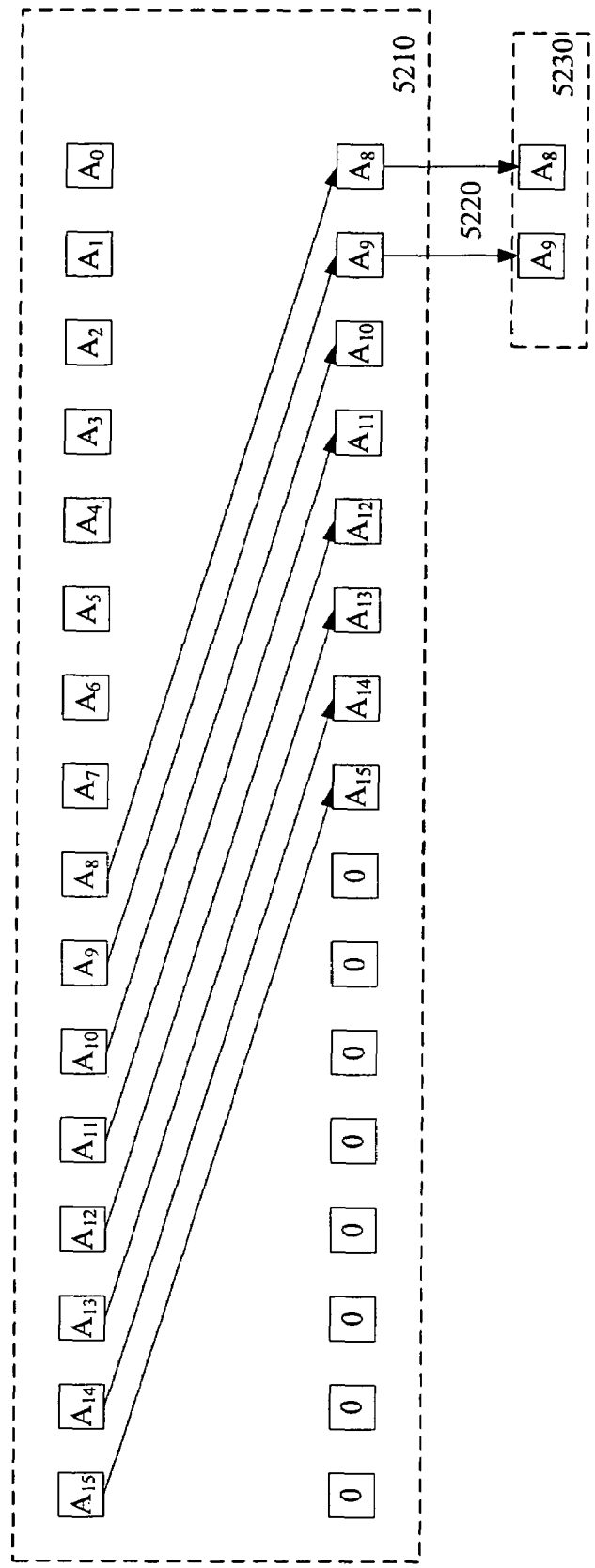
FIG. 52 illustrates a barrel shifter and outputs presenting a narrowed memory.

FIG. 52 illustrates use of a barrel shifter to narrow the memory of some embodiments. A simplified barrel shifter 5210 is shown in the figure. In some embodiments this barrel shifter may be the type illustrated earlier in this specification, in other embodiments it may be a variation of that type of barrel shifter or some other type of barrel shifter entirely.

The barrel shifter takes as its input the word selected by the first five bits of the 8-bit memory address. In this example, the 8-bit address was "00000100" (as indicated in FIG. 51), The first five bits are "00000", which is an address in the physical memory that holds the word "$A_{15}A_{14}A_{13}A_{12}A_{11}A_{10}A_9A_8A_7A_6A_5A_4A_3A_2A_1A_0$".

The barrel shifter 5210 shifts the word by the required number of bits. The size of the required shift depends on the width of the narrowed memory and the number indicated by the last part of the address. The number of bits in the last part of the address is dependent on the ratio of the width of the words in the physical memory to the width of the words in the narrowed memory. In this example, the width of the physical memory is sixteen bits and the width of the narrowed memory is two bits, so the ratio is eight-to-one. Each 16-bit word in the physical memory contains eight 2-bit words. Therefore to specify any particular 2 bit word within a particular 16-bit word requires a number between zero and seven. When shifting to get to the specified 2-bit word, the shifts must be in multiples of two. A shift of zero provides the first narrow word, a shift of two (2=2*1) provides the second narrow word, a shift of four (4=2*2) provides the third narrow word, and so on.

Expressing numbers from zero to seven in binary requires three bits. In this example, the 3-bit binary number is "100". In binary, "100" means four. Thus the shift here must be eight (8=2*4). In this illustration, the shift is eight bits to the right. The barrel shifter then passes the two least significant bits out of outputs 5220 to another set of tiles 5230. The amount of the shift, here, by 8 bits determines what bits show up at the set of tiles 5230.

In some embodiments, as mentioned previously the top tiles shown in the barrel shifter may be replaced with the physical memory itself, with the outputs of the memory taking the place of the outputs of the tiles. This would reduce the number of connections necessary to perform such memory shifts. In some embodiments (with or without such reduced connection sets) memory narrowing may be performed in a single user cycle.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is:

1. For a configurable integrated circuit (IC) that implements a user design having an associated user design clock cycle, said IC operating on a sub-cycle clock that has multiple sub-cycle periods within a user period of said user design clock cycle, a method of mapping the user design to the configurable IC, the method comprising:
    a) identifying accesses to multiple ports of a multi-port memory defined in the user design, said accesses being in a single user design clock cycle; and
    b) mapping said accesses to the multiple ports of the multi-port memory to multiple accesses of a particular port of a physical memory in the configurable IC during multiple sub-cycles associated with the single user design clock cycle, wherein the particular port of the physical memory is for accessing the physical memory at least once per sub-cycle period, and the particular port comprises a clock input for receiving clock signals at a first frequency that is a frequency of the sub-cycle clock.

2. The method of claim 1, wherein the user design includes a first logical port corresponding to both said particular port of the physical memory and a first sub-cycle period within the user period.

3. The method of claim 2, wherein the user design includes a second logical port corresponding to both the particular port of the physical memory and a second sub-cycle period within the user period.

4. The method of claim 3, wherein the first logical port is identified by a first logical port number and the second logical port is identified by a second logical port number.

5. The method of claim 4, wherein a higher logical port number corresponds to a later sub-cycle period.

6. The method of claim 1, wherein a second frequency is a frequency associated with said user design clock cycle.

7. The method of claim 6, wherein a number of logical ports corresponding to the particular port of the physical memory is determined by the first frequency divided by the second frequency.

8. The method of claim 1, wherein said physical memory is accessible by the particular port of the physical memory and by a second port of the physical memory.

9. The method of claim 8, wherein the user design includes a first logical memory port corresponding to both said particular port of the physical memory and a first sub-cycle period within the user period and a second logical port corresponding to both said second port of the physical memory and said first sub-cycle period within the user period.

10. The method of claim 9, wherein the user design includes multiple logical memory ports corresponding to the second port of the physical memory and to the multiple sub-cycle periods within the user period.

11. A computer readable medium storing a computer program for mapping a user design having an associated user design clock cycle to a configurable integrated circuit (IC) that implements said user design, said configurable IC operating on a sub-cycle clock that has multiple sub-cycle periods within a user period of said user design clock cycle, said computer program comprising sets of instructions for:
    a) identifying multiple simultaneous accesses to a first multi-port memory defined in the user design through a particular number of ports of said first multi-port memory, said multiple simultaneous accesses being in a single user design clock cycle; and
    b) mapping said multiple simultaneous accesses to said first multi-port memory to multiple sequential accesses of a second physical-port memory in the configurable IC, through a smaller number of ports than the particular number of ports, during multiple sub-cycles associated with the single user design clock cycle, wherein a first physical port of said second physical-port memory is for accessing the second physical-port memory at least once per sub-cycle period, and the first physical port comprises a clock input for receiving clock signals at a first frequency that is a frequency of the sub-cycle clock.

12. The computer readable medium of claim 11, wherein the user design includes a first logical port corresponding to both said first physical port and a first sub-cycle period within the user period.

13. The computer readable medium of claim 12, wherein the user design has a second logical port corresponding to both the first physical port and a second sub-cycle period within the user period.

14. The computer readable medium of claim 13, wherein the first logical port is identified by a first logical port number and the second logical port is identified by a second logical port number.

15. The computer readable medium of claim 14, wherein a higher logical port number corresponds to a later sub-cycle period.

16. A reconfigurable integrated circuit (IC) that implements a user design that is specified based on a user design clock cycle, said reconfigurable IC comprising:
 a) a physical memory with a physical memory port that operates at a frequency of a sub-cycle clock that is higher than a frequency of the user design clock cycle, wherein the physical memory port of said physical memory is for accessing the physical memory at least once per sub-cycle period, and the physical memory port comprises a clock input for receiving clock signals at the frequency of the sub-cycle clock;
 b) wherein said physical memory is accessible through said physical memory port multiple times per the user design clock cycle; and
 c) wherein said multiple times during said user design clock cycle correspond to accesses during a single period of the user design clock cycle of multiple memory ports of a multi-port memory in said user design.

17. The reconfigurable IC of claim 16, further comprising circuits for writing data to said physical memory port once per sub-cycle of said user design clock cycle.

* * * * *